US 11,799,450 B2

(12) United States Patent
Mori

(10) Patent No.: US 11,799,450 B2
(45) Date of Patent: Oct. 24, 2023

(54) RADIO FREQUENCY MODULE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 397 days.

(21) Appl. No.: 17/231,636

(22) Filed: Apr. 15, 2021

(65) Prior Publication Data

US 2021/0234533 A1 Jul. 29, 2021

Related U.S. Application Data

(63) Continuation of application No. PCT/JP2019/036428, filed on Sep. 17, 2019.

(30) Foreign Application Priority Data

Oct. 16, 2018 (JP) ................. 2018-195206

(51) Int. Cl.
*H04B 1/18* (2006.01)
*H03H 9/54* (2006.01)
(Continued)

(52) U.S. Cl.
CPC ............ *H03H 9/54* (2013.01); *H03F 3/19* (2013.01); *H03H 9/70* (2013.01); *H04B 1/0475* (2013.01);
(Continued)

(58) Field of Classification Search
CPC .... H04B 1/001; H04B 1/0035; H04B 1/0058; H03H 9/54; H03H 2003/0414;
(Continued)

(56) References Cited

U.S. PATENT DOCUMENTS 8,659,368 B2 * 2/2014 Komura ................. H03H 9/725
333/195
2004/0085164 A1 * 5/2004 Hirabayashi ............ H01P 1/203
333/204
(Continued)

FOREIGN PATENT DOCUMENTS

JP 2012-175438 A 9/2012
JP 2013-247466 A 12/2013
(Continued)

OTHER PUBLICATIONS

International Search Report for International Patent Application No. PCT/JP2019/036428 dated Nov. 5, 2019.
(Continued)

*Primary Examiner* — Tuan Pham
(74) *Attorney, Agent, or Firm* — Pearne & Gordon LLP

(57) ABSTRACT

A radio frequency module includes a radio frequency filter (10), and the radio frequency filter (10) includes a terminal (11), a terminal (12), an impedance element (Z) disposed in series on a path (13) connecting the terminal (11) and the terminal (12), and a parallel arm resonator (P) connected between a node (N) on the path (13) and a ground. The impedance element (Z) is a capacitor or an inductor, and a wiring length $A_1$ between the node (N) and the parallel arm resonator (P) is shorter than a wiring length $B_1$ between the impedance element (Z) and a terminal (terminal (11), for example) out of the terminal (11) and the terminal (12) having a shorter wiring length to the impedance element (Z).

20 Claims, 25 Drawing Sheets

(51) Int. Cl.
*H03F 3/19* (2006.01)
*H03H 9/70* (2006.01)
*H04B 1/04* (2006.01)

(52) U.S. Cl.
CPC .. *H03F 2200/451* (2013.01); *H04B 2001/045* (2013.01)

(58) Field of Classification Search
CPC .. H03H 2003/0471; H03H 7/38; H03H 7/463; H03H 9/14502; H03H 9/72
See application file for complete search history.

(56) References Cited

U.S. PATENT DOCUMENTS

| | | | |
|---|---|---|---|
| 2009/0273409 A1* | 11/2009 | Okuda | H03H 9/0085 333/186 |
| 2012/0235767 A1 | 9/2012 | Takata et al. | |
| 2013/0314173 A1 | 11/2013 | Inoue | |

FOREIGN PATENT DOCUMENTS

| | | |
|---|---|---|
| WO | 2011/077773 A1 | 6/2011 |
| WO | 2012/114930 A1 | 8/2012 |

OTHER PUBLICATIONS

Written Opinion for International Patent Application No. PCT/JP2019/036428 dated Nov. 5, 2019.

\* cited by examiner

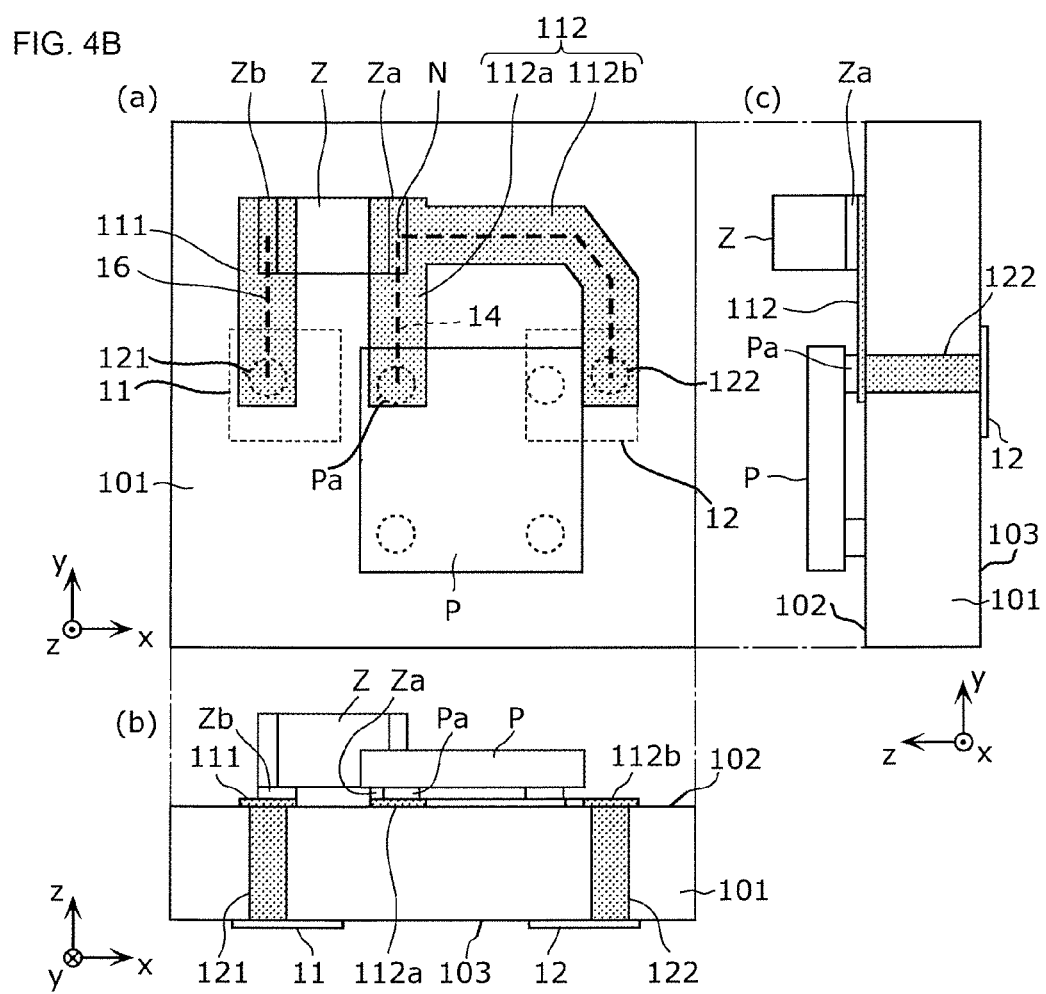

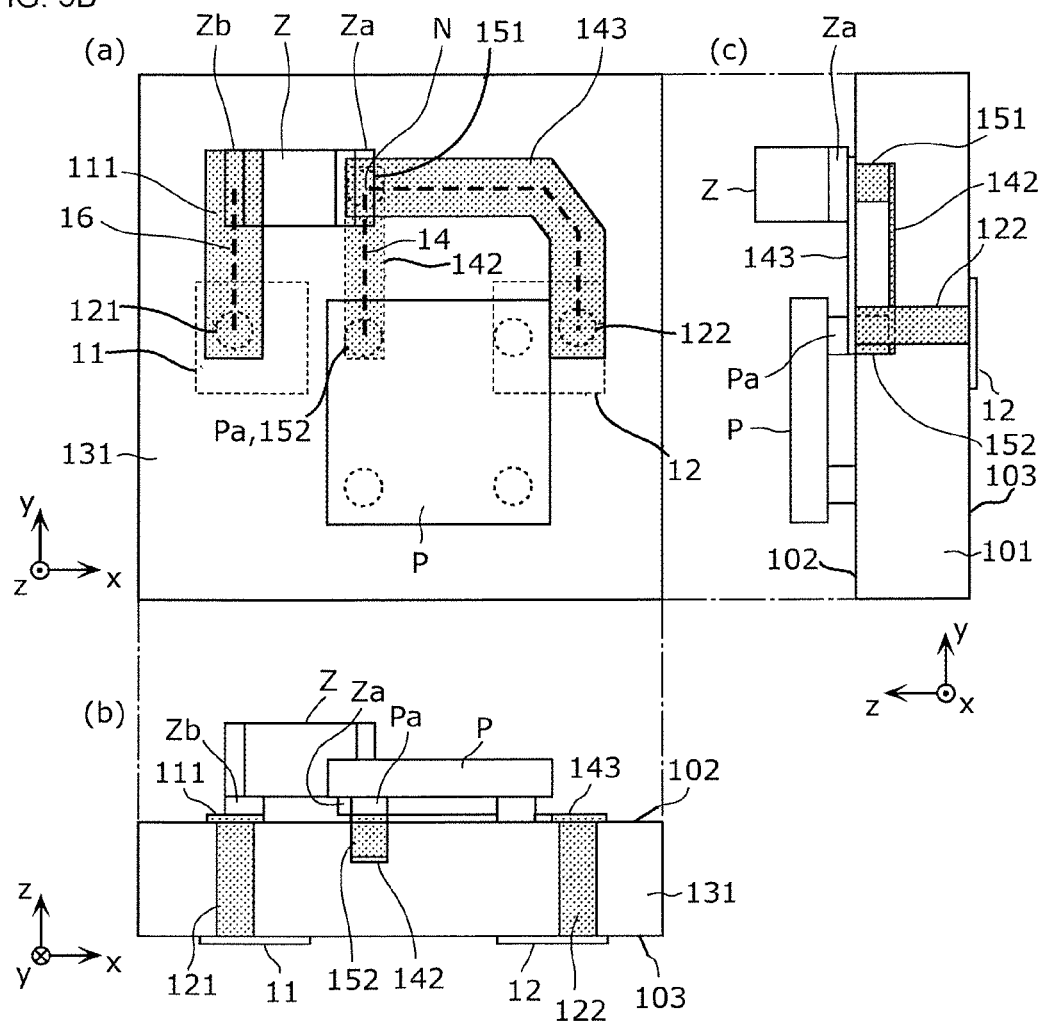

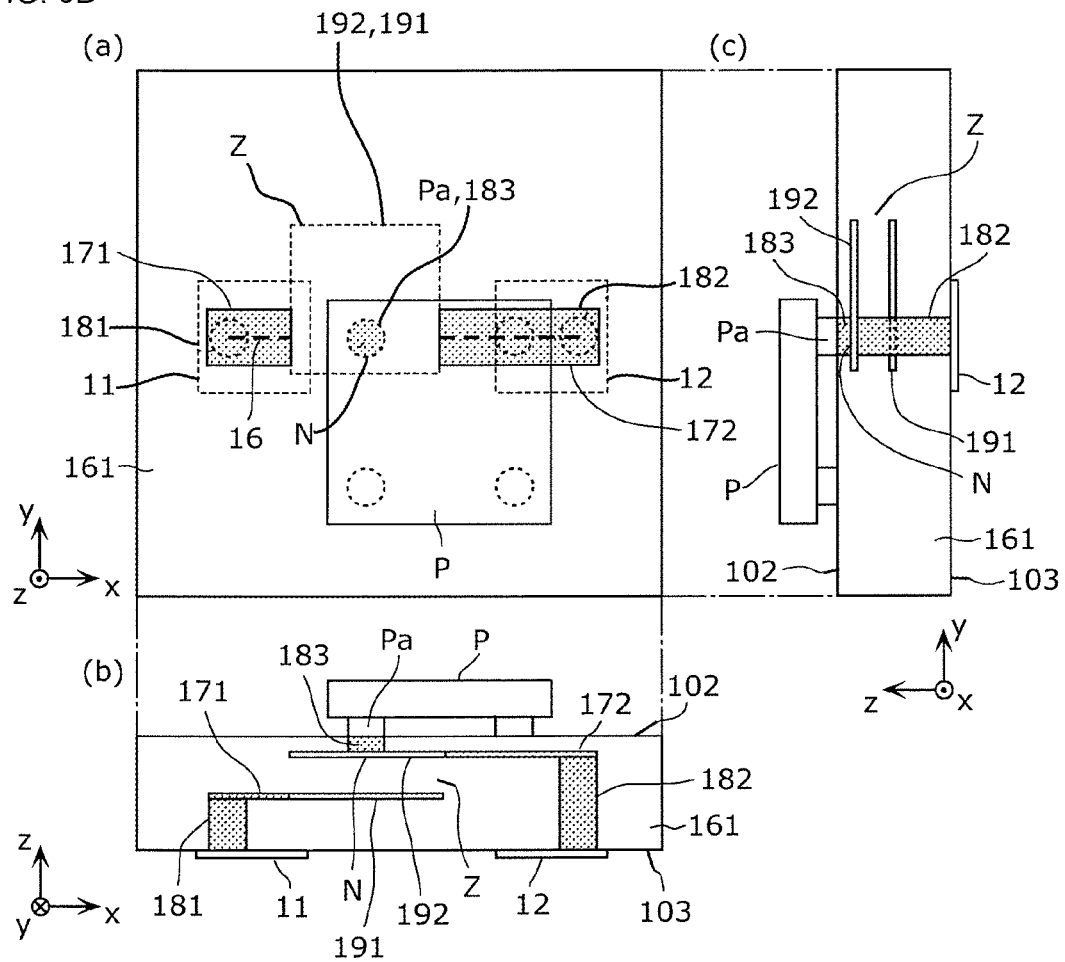
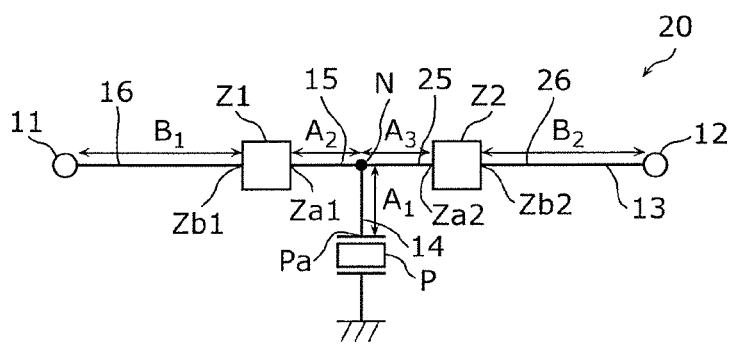

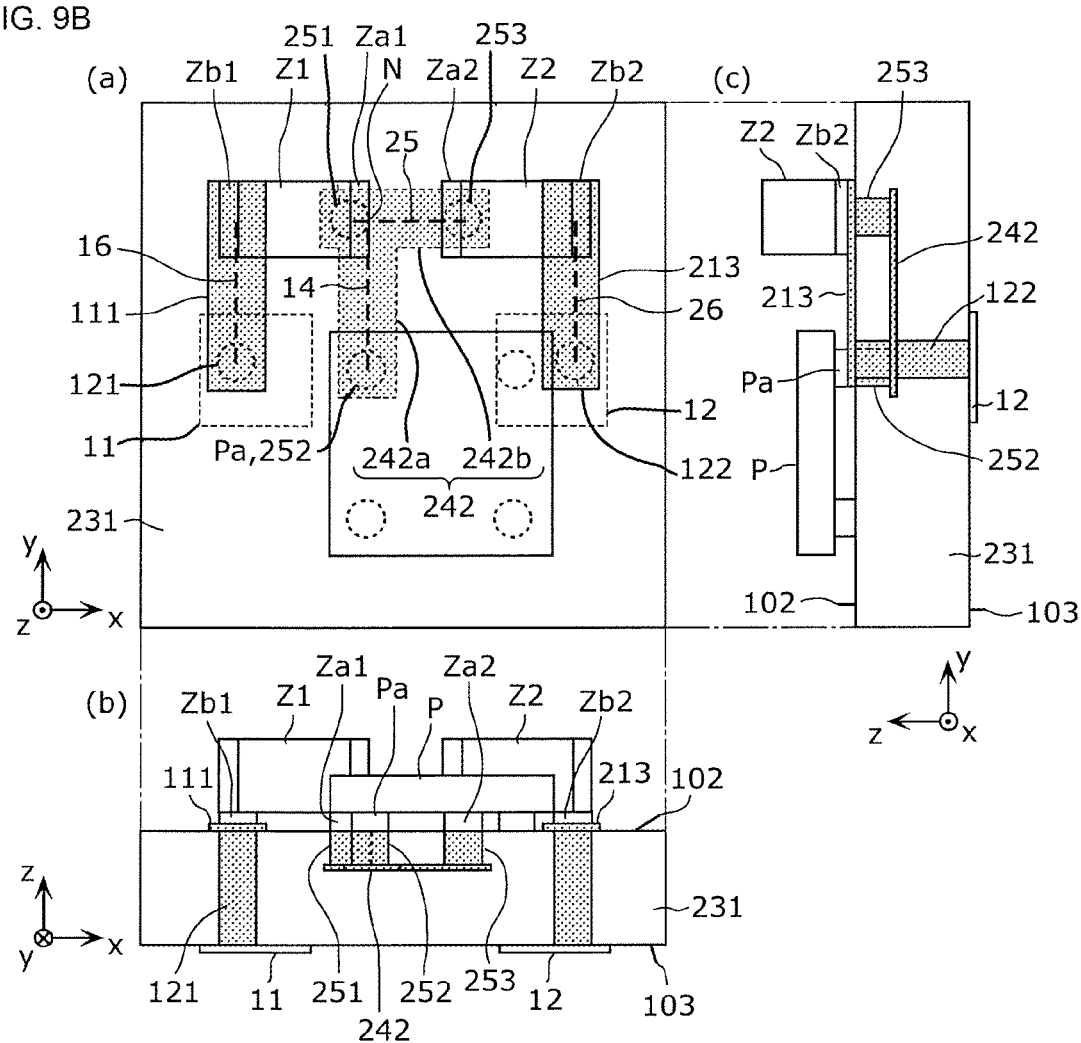

RADIO FREQUENCY MODULE

CROSS REFERENCE TO RELATED APPLICATIONS

This is a continuation of International Application No. PCT/JP2019/036428 filed on Sep. 17, 2019 which claims priority from Japanese Patent Application No. 2018-195206 filed on Oct. 16, 2018. The contents of these applications are incorporated herein by reference in their entireties.

BACKGROUND OF THE DISCLOSURE

Field of the Disclosure

The present disclosure relates to a radio frequency module.

Description of the Related Art

A ladder filter including an acoustic wave resonator has been known in the past (see Patent Document 1, for example). In the filter disclosed in Patent Document 1, an acoustic wave resonator is used in a parallel arm that generates series resonance at a frequency corresponding to an attenuation band.

Patent Document 1: Japanese Unexamined Patent Application Publication No. 2012-175438

BRIEF SUMMARY OF THE DISCLOSURE

In the above-mentioned filter in the past, an unnecessary inductive component or an unnecessary capacitive component is generated in a wiring line connected to an acoustic wave resonator. For example, when the unnecessary inductive component is generated, the steepness of the lower frequency end or the higher frequency end of the pass band of the filter deteriorates. Further, when an unnecessary capacitive component is generated, the loss in the pass band of the filter increases. As described above, a filter in the past has a problem that the filter characteristic deteriorates.

An object of the present disclosure is to provide a radio frequency module including a filter in which the deterioration of the filter characteristic is suppressed.

In order to achieve the object above, a radio frequency module according to an aspect of the present disclosure is a radio frequency module including a radio frequency filter as follows. The radio frequency filter includes an input terminal, an output terminal, a first impedance element disposed in series on a path connecting the input terminal and the output terminal, and an acoustic wave resonator connected between a node on the path and a ground. The first impedance element is a capacitor or an inductor. A wiring length between the node and the acoustic wave resonator is shorter than a wiring length between the first impedance element and a terminal out of the input terminal and the output terminal having a shorter wiring length to the first impedance element.

According to the present disclosure, it is possible to provide a radio frequency module including a filter in which the deterioration of the filter characteristic is suppressed.

BRIEF DESCRIPTION OF THE SEVERAL VIEWS OF THE DRAWINGS

FIG. 4B is a three-view drawing of the radio frequency module according to Example 1 of Embodiment 1.

FIG. 5B is a three-view drawing of the radio frequency module according to Example 2 of Embodiment 1.

FIG. 6B is a three-view drawing of the radio frequency module according to Example 3 of Embodiment 1.

FIG. 7 is a circuit configuration diagram of a radio frequency filter included in a radio frequency module according to Embodiment 2.

FIG. 9B is a three-view drawing of the radio frequency module according to Example 2 of Embodiment 2.

DETAILED DESCRIPTION OF THE DISCLOSURE

Figure 1:
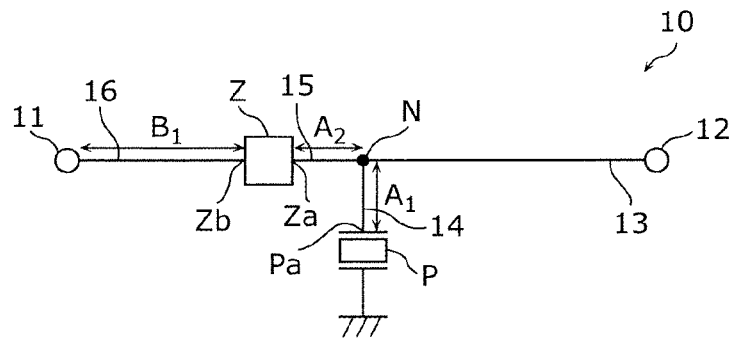
FIG. 1 is a circuit configuration diagram of a radio frequency filter included in a radio frequency module according to Embodiment 1.

Hereinafter, a radio frequency module according to an embodiment of the present disclosure will be described in detail with reference to the drawings. Note that each of the embodiments described below illustrates a specific example of the present disclosure. Numerical values, shapes, materials, constituent elements, arrangements and connection forms of the constituent elements, steps, the order of the steps, and the like illustrated in the following embodiments are merely examples, and are not intended to limit the present disclosure. Among the constituent elements in the following embodiments, constituent elements not recited in the independent claims will be described as optional constituent elements.

Each of the drawings is a schematic view and is not necessarily drawn accurately. Accordingly, scales and so on do not necessarily coincide with each other between the drawings, for example. In each of the drawings, substantially the same components to each other are denoted by the same reference numerals, and redundant description will be omitted or simplified.

Further, in the present description, a term indicating the relationship between elements such as parallel or vertical, a term indicating the shape of an element such as a rectangular parallelepiped or a cylinder, and a numerical range are not expressions having only a strict meaning, but expressions allowing a substantially equivalent range, for example, including a difference of about several percent.

Further, in the present description, the terms "upper" and "lower" do not mean upper direction (perpendicularly upper) and lower direction (perpendicularly lower) in absolute spatial recognition, but are used as terms defined by a relative positional relationship based on a lamination order in a laminated structure.

In the present description and the drawings, an x-axis, a y-axis, and a z-axis indicate three axes of a three dimensional orthogonal coordinate system. In each of the embodiments, the z-axis direction is a thickness direction of a wiring substrate. In the present description, the term "thickness direction" refers to the thickness direction of the wiring substrate, which means a direction vertical to a main surface of the wiring substrate. The term "plan view" refers to the view taken from the direction vertical to the main surface of the wiring substrate.

Embodiment 1

Hereinafter, the configuration of a radio frequency filter included in a radio frequency module according to Embodiment 1 and an effect obtained by the configuration will be described first. Next, a specific embodiment of the radio frequency module according to the present embodiment will be described.

FIG. 1 is a circuit configuration diagram of a radio frequency filter 10 included in the radio frequency module according to the present embodiment. The radio frequency filter 10 includes a terminal 11, a terminal 12, an impedance element Z, and a parallel arm resonator P as illustrated in FIG. 1. In the present embodiment, the radio frequency filter 10 is a high pass filter, but may be a low pass filter.

The terminals 11 and 12 are the input terminal and the output terminal of the radio frequency filter 10, respectively. The input terminal is a terminal for connecting the radio frequency module to an external circuit, and is a terminal to which a signal outputted from the external circuit is inputted. The output terminal is a terminal for connecting the radio frequency module to an external circuit, and is a terminal for outputting a signal processed by the radio frequency module to the external circuit. In the present embodiment, a case in which the terminal 11 is an input terminal and the terminal 12 is an output terminal will be described. Note that the terminal 11 may be an output terminal, and the terminal 12 may be an input terminal. That is, the impedance element Z may be provided in the input terminal side, or may be provided in the output terminal side.

A node N is provided on a path 13 connecting the terminal 11 and the terminal 12 as illustrated in FIG. 1. The node N is a branch point on the path 13.

The impedance element Z is an example of a first impedance element disposed in series on the path 13 connecting the terminal 11 and the terminal 12. Specifically, the impedance element Z is provided between the terminal 11 and the node N.

The impedance element Z is a capacitor or an inductor. The impedance element Z has a capacitance value or an inductance value determined in accordance with the filter characteristic required for the radio frequency filter 10.

Note that the capacitor is an element indicating capacitive property in the entire band as an ideal element, and does not include an acoustic wave resonator. This is because the acoustic wave resonator is not an element indicating the capacitive property in the entire band, although the acoustic wave resonator has an inductive property in a band between the resonant frequency and the anti-resonant frequency, and has a capacitive property in other bands.

The parallel arm resonator P is an example of the acoustic wave resonator connected between the node N and a ground. The acoustic wave resonator is a resonator using an acoustic wave, and examples thereof include a resonator using a surface acoustic wave (SAW), a resonator using a bulk acoustic wave (BAW), or a film bulk acoustic resonator (FBAR). Note that the SAW includes not only a surface wave but also a boundary wave.

In the present embodiment, a SAW resonator is used as the acoustic wave resonator. Accordingly, the parallel arm resonator P included in the radio frequency filter 10 can be constituted of an interdigital transducer (IDT) electrode formed on a substrate having piezoelectricity, and therefore, a small-sized and low-profile radio frequency module having the attenuation characteristic of a high degree of steepness may be realized.

The substrate having piezoelectricity is a substrate having piezoelectricity at least on the surface thereof (hereinafter, referred to as piezoelectric substrate). The piezoelectric substrate may be provided with a piezoelectric thin film formed on the surface thereof, and may be constituted of a multilayer body of a film having a different acoustic velocity from that of the piezoelectric thin film, a support substrate, and the like, for example. Further, the piezoelectric substrate may be a multilayer body including a high-acoustic-velocity support substrate and a piezoelectric thin film formed on the high-acoustic-velocity support substrate, for example. The piezoelectric substrate may be a multilayer body including a high-acoustic-velocity support substrate, a low acoustic velocity film formed on the high-acoustic-velocity support substrate, and a piezoelectric thin film formed on the low-acoustic-velocity film. Alternatively, the piezoelectric substrate may be a multilayer body including a support substrate, a high-acoustic-velocity film formed on the support substrate, a low-acoustic-velocity film formed on the high-acoustic-velocity film, and a piezoelectric thin film formed on the low-acoustic-velocity film. Further, the piezoelectric substrate may have piezoelectricity in the entire substrate. The same applies to an acoustic wave resonator in other embodiments.

Wiring lengths that are lengths of wiring lines for electrically connecting each of the terminals, each of the elements, and the node of the radio frequency filter 10 are illustrated in FIG. 1. The specific configuration of the wiring lines will be described later in detail with reference to examples which will be described later.

A wiring length $A_1$ is the wiring length between the node N and the parallel arm resonator P. Specifically, the wiring length $A_1$ is a length of a wiring line 14 connecting the node N and a node N side terminal Pa of the parallel arm resonator P.

A wiring length $A_2$ is a wiring length between the node N and the impedance element Z. Specifically, the wiring length $A_2$ is the length of a wiring line 15 connecting the node N and a node N side terminal Za of the impedance element Z.

A wiring length $B_1$ is a wiring length between the terminal 11 and the impedance element Z. Specifically, the wiring length $B_1$ is the length of a wiring line 16 connecting the terminal 11 and a terminal 11 side terminal Zb of the impedance element Z.

In the present embodiment, the wiring length between the node N and the parallel arm resonator P is shorter than the wiring length between the impedance element Z and a terminal out of the terminals 11 and 12 having a shorter wiring length to the impedance element Z. Specifically, the sum of the wiring length between the node N and the parallel arm resonator P and the wiring length between the node N and the impedance element Z is shorter than the wiring length between the impedance element Z and the terminal out of the terminals 11 and 12 having a shorter wiring length to the impedance element Z. The terminal having a shorter wiring length to the impedance element Z is the terminal 11, for example. That is, the wiring length $A_1$ is shorter than the wiring length $B_1$ in the present embodiment. Specifically, the sum of the wiring length $A_1$ and the wiring length $A_2$ is shorter than the wiring length $B_1$.

Here, there will be described a case where the terminal having a shorter wiring length to the impedance element Z is the terminal 11 which serves as the input terminal. However, the terminal may be the terminal 12 which serves as the output terminal. That is, the wiring length between the terminal Za of the impedance element Z and the terminal 12 may be shorter than the wiring length $B_1$ between the terminal Zb of the impedance element Z and the terminal 11. The wiring length between the terminal Za of the impedance element Z and the terminal 12 may be shorter than the wiring length $A_1$ between the node N and the parallel arm resonator P.

In a case where the wiring length of the wiring line included in the radio frequency filter 10 is long, an unnecessary inductive component, an unnecessary capacitive component, or both of these components are generated in the wiring line. Making the wiring length $A_1$ shorter than the wiring length $B_1$ suppresses the unnecessary inductive component and the unnecessary capacitive component that are generated in the wiring line 14 in the radio frequency filter 10 according to the present embodiment. Accordingly, the deterioration of the filter characteristic of the radio frequency filter 10 is suppressed. Hereinafter, first, the effect of suppressing the unnecessary inductive component will be described with reference to FIGS. 2A, 2B and 2C.

Figure 2A:
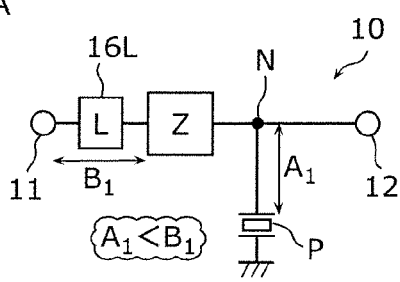
FIGS. 2A, 2B and 2C are diagrams for describing an effect of suppressing an unnecessary inductive component of the radio frequency module according to Embodiment 1.
Figure 2B:
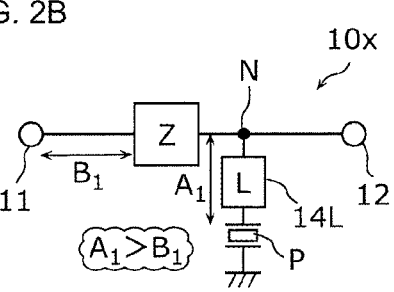
Figure 2C:
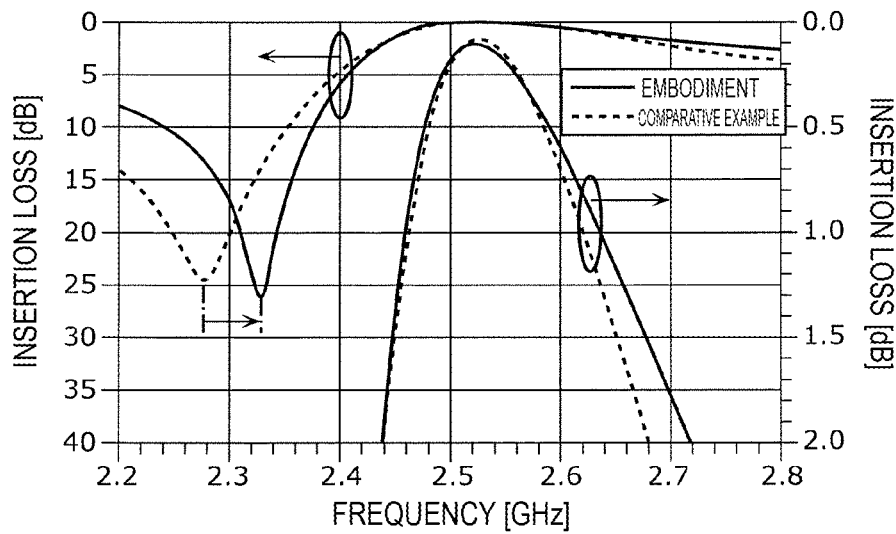

FIGS. 2A, 2B and 2C are diagrams for describing the effect of suppressing the unnecessary inductive component in the radio frequency module according to the present embodiment. FIG. 2A is a circuit diagram illustrating an equivalent circuit of the radio frequency filter 10 included in the radio frequency module according to the present embodiment. FIG. 2B is a circuit diagram illustrating an equivalent circuit of a radio frequency filter 10x according to a comparative example.

The radio frequency filter 10x according to the comparative example is different compared to the radio frequency filter 10 according to the present embodiment in that the wiring length $A_1$ between the node N and the parallel arm resonator P is longer than the wiring length $B_1$ between the terminal 11 and the impedance element Z. Other points, such as the characteristics of the impedance element Z and the parallel arm resonator P, are the same as those of the radio frequency filter 10.

In the radio frequency filter 10 according to the present embodiment, since the wiring length $B_1$ of the wiring line 16 is long, an unnecessary inductive component 16L is generated in the wiring line 16 as illustrated in FIG. 2A. That is, the radio frequency filter 10 according to the present embodiment is in a state equivalent to the state in which an inductor element is connected in series to the impedance element Z. On the other hand, in the radio frequency filter 10x according to the comparative example, since the wiring length $A_1$ of the wiring line 14 is long, an unnecessary inductive component 14L is generated in the wiring line 14 as illustrated in FIG. 2B. That is, the radio frequency filter 10x according to the comparative example is in a state equivalent to the state in which an inductor element is connected in series to the parallel arm resonator P.

FIG. 2C is a graph illustrating bandpass characteristics of the radio frequency filters 10 and 10x. In FIG. 2C, the horizontal axis represents frequency [unit: GHz], and the vertical axes in the left side and the right side represent insertion loss [unit: dB] in different scales. A solid line graph represents the insertion loss of the radio frequency filter 10 according to the present embodiment, and a dashed line graph represents the insertion loss of the radio frequency filter 10x according to the comparative example.

The radio frequency filter 10 includes the parallel arm resonator P, which is an example of an acoustic wave resonator, and therefore, the radio frequency filter 10 has a steep attenuation characteristic due to the steep attenuation pole of the acoustic wave resonator as illustrated in FIG. 2C. Specifically, the insertion loss is the maximum when the frequency is approximately 2.33 GHz.

On the other hand, although an attenuation characteristic is also obtained in the radio frequency filter 10x according to the comparative example, the generation of the inductive component 14L connected in series to the parallel arm resonator P causes the frequency at which the insertion loss is the maximum to be shifted to about 2.28 GHz in low frequency side. This impairs the steepness of the attenuation characteristic.

In other words, since the inductive component connected in series to the parallel arm resonator P is suppressed in the radio frequency filter 10 according to the present embodiment, the steepness of the attenuation characteristic may be maintained, and the deterioration of the filter characteristic may be suppressed. Note that, although the inductive component 16L connected in series to the impedance element Z is generated in the radio frequency filter 10, there is obtained the filter characteristic substantially equal to or more preferable than that of the radio frequency filter 10x according to the comparative example as illustrated in FIG. 2C. That is, the inductive component 16L has little influence on the filter characteristic. As described above, making the wiring length $A_1$ shorter than the wiring length $B_1$ may suppress the deterioration of the filter characteristic.

Next, an effect of suppressing an unnecessary capacitive component will be described with reference to FIGS. 3A, 3B and 3C.

Figure 3A:
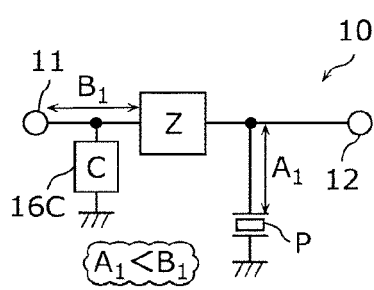
FIGS. 3A, 3B and 3C are diagrams for describing an effect of suppressing an unnecessary capacitive component of the radio frequency module according to Embodiment 1.
Figure 3B:
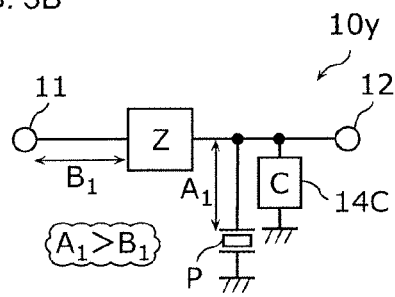
Figure 3C:
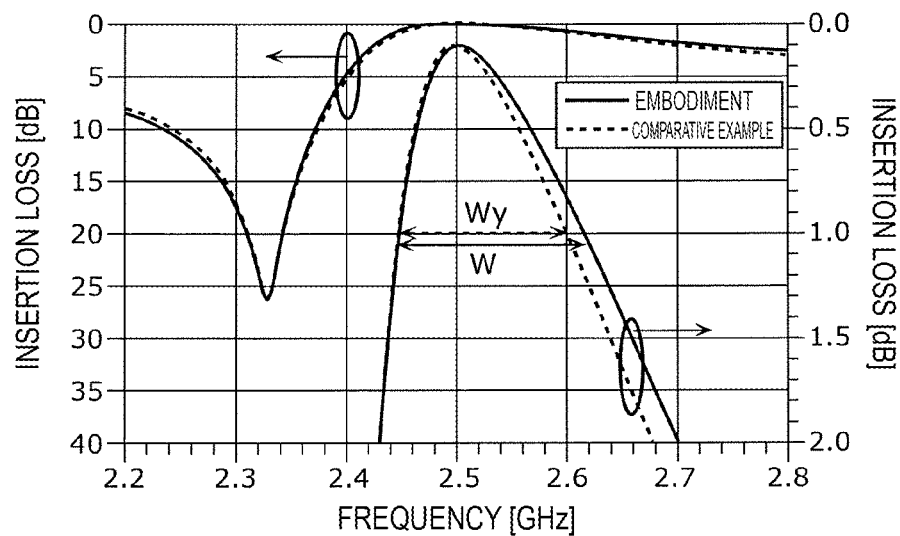

FIGS. 3A, 3B and 3C are diagrams for describing an effect of suppressing an unnecessary capacitive component of the radio frequency module according to the present embodiment. Specifically, FIG. 3A is a circuit diagram illustrating the equivalent circuit of the radio frequency filter 10 included in the radio frequency module according to the present embodiment. FIG. 3B is a circuit diagram illustrating an equivalent circuit of a radio frequency filter 10y according to a comparative example.

The radio frequency filter 10y according to the comparative example is different compared to the radio frequency filter 10 according to the present embodiment in that the wiring length $A_1$ between the node N and the parallel arm resonator P is longer than the wiring length $B_1$ between the terminal 11 and the impedance element Z. Other points, such as the characteristics of the impedance element Z and the parallel arm resonator P, are the same as those of the radio frequency filter 10.

In the radio frequency filter 10 according to the present embodiment, since the wiring length $B_1$ of the wiring line 16 is long, an unnecessary capacitive component 16C is generated in the wiring line 16 as illustrated in FIG. 3A. On the other hand, in the radio frequency filter 10y according to the comparative example, since the wiring length $A_1$ of the wiring line 14 is long, an unnecessary capacitive component 14C is generated in the wiring line 14 as illustrated in FIG. 3B. That is, the radio frequency filter 10y according to the comparative example is in a state equivalent to the state in which the capacitor element connected in parallel to the parallel arm resonator P is inserted.

FIG. 3C is a graph illustrating a bandpass characteristic of each of the radio frequency filters 10 and 10y. In FIG. 3C, the horizontal axis represents frequency [unit: GHz], and the vertical axes in the left side and the right side represent insertion loss [unit: dB] in different scales. A solid line graph represents the insertion loss of the radio frequency filter 10 according to the present embodiment, and a dashed line graph represents the insertion loss of the radio frequency filter 10y according to the comparative example.

Both of the radio frequency filters 10 and 10y have the steep attenuation characteristics in the same degree as illustrated in FIG. 3C. On the other hand, in the radio frequency filter 10y according to the comparative example, the generation of the capacitive component 14C connected in parallel to the parallel arm resonator P causes the inclination of the increase in insertion loss to be larger in high frequency band. That is, a low-loss band width Wy in the radio frequency filter 10y according to the comparative example is smaller than a low-loss band width W in the radio frequency filter 10 according to the present embodiment. As described above, the radio frequency filter 10y according to the comparative example has a large loss in the pass band.

In other words, since the capacitive component connected in parallel to the parallel arm resonator P is suppressed in the radio frequency filter 10 according to the present embodiment, the generation of loss in the pass band may be suppressed. Note that, although the capacitive component 16C is generated between the impedance element Z and the terminal 11 in the radio frequency filter 10, there is obtained the filter characteristic substantially equal to or more preferable than that of the radio frequency filter 10y according to the comparative example as illustrated in FIG. 3C. That is, the capacitive component 16C has little influence on the filter characteristic. As described above, making the wiring length $A_1$ shorter than the wiring length $B_1$ may suppress the deterioration of the filter characteristic.

The filter characteristic similarly deteriorates when both the unnecessary inductive component 14L illustrated in FIG. 2B and the unnecessary capacitive component 14C illustrated in FIG. 3B are generated. Since it is possible to suppress the generation of both the unnecessary inductive component 14L and the capacitive component 14C in the radio frequency filter 10 according to the present embodiment, the deterioration of the filter characteristic may be suppressed.

Note that as the wiring length of the wiring line included in the radio frequency filter 10 is shorter, the generation of the unnecessary inductive component and the unnecessary capacitive component is suppressed more, and a preferable filter characteristic may be achieved. That is, as the total length of the wiring line included in the radio frequency filter 10 is shorter, the filter characteristic becomes more preferable.

However, in a radio frequency module, there may be a case where the wiring line cannot be sufficiently shortened because of the limitation of the physical arrangement of each of the terminals and each of the elements. For example, there may be a case where the positions of the terminal 11 and the terminal 12 are fixed, and the total length of the wiring line cannot be shortened because of the routing of the wiring line. Also, in this case, adjusting the positions of the impedance element Z, the parallel arm resonator P, and the node N such that the wiring length $A_1$ becomes shorter than the wiring length $B_1$ may suppress the deterioration of the filter characteristic.

Hereinafter, a specific example of a radio frequency module including the radio frequency filter 10 according to the present embodiment will be described. Note that the arrangements and shapes of elements, wiring substrates, wiring layers, and vias in the respective examples are merely examples, and are not limited to the described examples.

Example 1

First, a radio frequency module according to Example 1 will be described with reference to FIG. 4A and FIG. 4B.

Figure 4A:
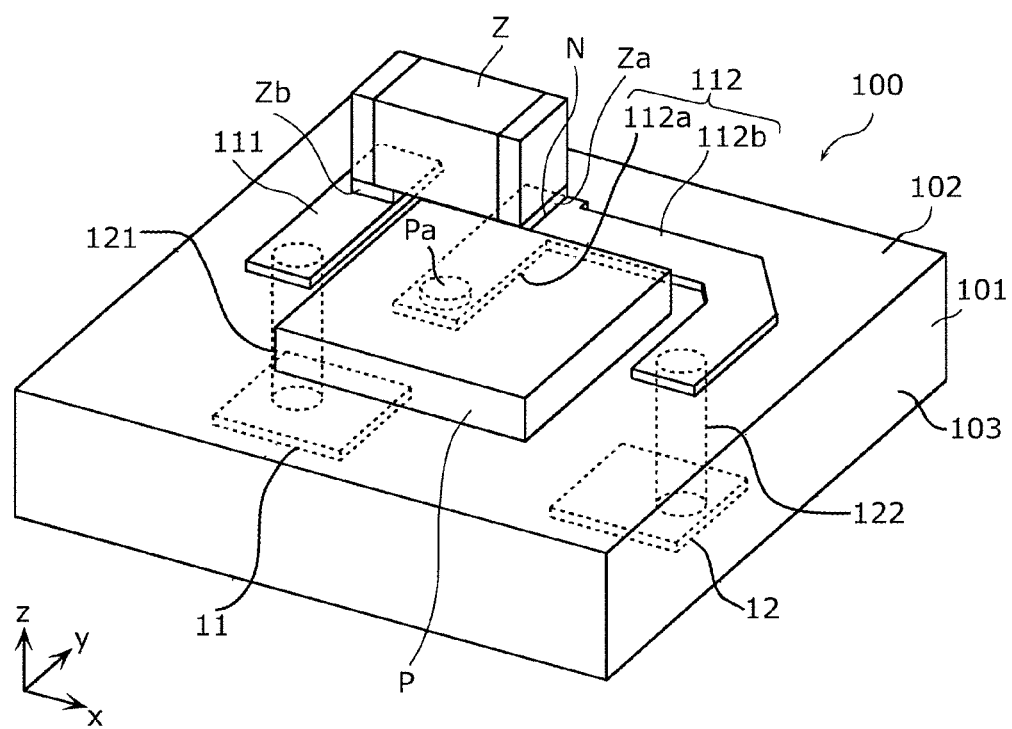
FIG. 4A is a perspective view of a radio frequency module according to Example 1 of Embodiment 1.

FIG. 4A is a perspective view of a radio frequency module 100 according to the present example. In FIG. 4A, the dashed lines illustrate the terminals 11 and 12, and portions of a wiring structure included in the radio frequency module 100 that cannot be seen in the perspective view. Further, in the perspective view, only a node N side terminal Pa among a plurality of terminals of the parallel arm resonator P is illustrated in order to avoid complication. The above illustration manner also applies to other perspective views described later (specifically, FIG. 5A, FIG. 6A, FIG. 8A, FIG. 9A, FIG. 10A, FIG. 12A, FIG. 13A, and FIG. 18A).

FIG. 4B is a three-view drawing of the radio frequency module 100 according to the present example. The portions (a), (b), and (c) of FIG. 4B are a top plan, an elevation, and a right side elevation of the radio frequency module 100, respectively. Note that, in the present description, a top view is the case when the radio frequency module 100 is viewed from the positive side of the z-axis, a front elevation view is the case when the radio frequency module 100 is viewed from the negative side of the y-axis, and a right side elevation view is the case when the radio frequency module 100 is viewed from the positive side of the x-axis. That is, a top view is synonymous with a plan view of a front surface 102 of a wiring substrate 101. The same applies to other examples and other embodiments.

In (a) of FIG. 4B, the terminal 11, the terminal 12, the terminal Pa of the parallel arm resonator P, and part of the wiring structure such as a via 121 in the radio frequency filter 10 are indicated by the dashed lines. In (b) and (c) of FIG. 4B, wiring structures (specifically, vias 121 and 122) provided in the wiring substrate 101 are illustrated by the seeing through of the wiring substrate 101. In the seeing through, a wiring structure visible from the seeing through point (that is, near side wiring structure) is represented by a solid line, and a wiring structure overlapping with the near side wiring structure and at the same time being positioned behind the near side wiring structure is represented by a dashed line (see such as FIG. 5B, for example). Further, the wiring structures (specifically, wiring layers and vias) in each of the drawings are shaded with dots. The above illustration manner also applies to other three-view drawings described later (specifically, FIG. 5B, FIG. 6B, FIG. 8B, FIG. 9B, FIG. 10B, FIG. 12B, FIG. 13B, and FIG. 18B).

The radio frequency module 100 includes the wiring substrate 101 as illustrated in FIG. 4A and FIG. 4B.

The wiring substrate 101 has the front surface 102 and a back surface 103 that are facing away from each other as illustrated in FIG. 4A. The front surface 102 is an example of a first surface being a main surface of the wiring substrate 101. The back surface 103 is an example of a second surface being a main surface of the wiring substrate 101.

In the present example, the parallel arm resonator P and the impedance element Z are provided on the front surface 102 of the wiring substrate 101 as illustrated in FIG. 4A and FIG. 4B. The terminals 11 and 12 are provided on the back surface 103 of the wiring substrate 101. Note that the positions where the terminal 11, the terminal 12, the parallel arm resonator P, and the impedance element Z are provided are not limited to those described above. For example, at least one of the terminals 11 and 12 may be provided on the front surface 102 or a side surface of the wiring substrate 101.

The terminals 11 and 12 are conductive thin films patterned in a predetermined shape, for example. The terminals 11 and 12 are formed using a metal material such as silver (Ag) or copper (Cu), for example. The shapes of the terminals 11 and 12 in top view are square, but may be circular or rectangular. The shape and size of each of the terminals 11 and 12 are not particularly limited.

As the wiring substrate 101, a multilayer substrate made of resin, a low temperature co-fired ceramics (LTCC) multilayer substrate having a multilayer structure of a plurality of dielectric layers, or the like is used, for example. The shape of the wiring substrate 101 is a flat rectangular parallelepiped, for example, but is not limited thereto. The shape of the wiring substrate 101 may be a cylinder, or may be a polyhedron other than a rectangular parallelepiped.

The wiring substrate 101 includes one or more wiring layers extending in a direction parallel to the front surface 102, and one or more vias extending in a direction orthogonal to the front surface 102. The terminal 11, the terminal 12, the impedance element Z, and the parallel arm resonator P are respectively connected to at least one of the one or more wiring layers and the one or more vias. For example, the parallel arm resonator P and the impedance element Z are mounted on the front surface 102 of the wiring substrate 101 by being connected to a wiring layer or a via by using solder or the like. The terminal Pa of the parallel arm resonator P and the terminals Za and Zb of the impedance element Z are formed of solidified solder or the like, for example. Note that the method of mounting the parallel arm resonator P and the impedance element Z is not particularly limited. The terminal Pa of the parallel arm resonator P may be a bump electrode, for example. In other examples and other embodiments, the method of mounting the impedance element and the parallel arm resonator is the same as that of the present example.

The wiring substrate 101 includes a wiring layer 111, a wiring layer 112, the via 121, and the via 122 in the present example as illustrated in FIG. 4A and FIG. 4B.

The wiring layers 111 and 112 are conductive pattern wiring lines provided on the front surface 102 of the wiring substrate 101. The wiring layers 111 and 112 are formed such that a metal thin film of silver (Ag) or copper (Cu) or the like is formed on the front surface 102, and then, the metal thin film is patterned in a predetermined shape, for example. Both of the wiring layers 111 and 112 extend in a direction parallel to the front surface 102, that is, in a direction orthogonal to the thickness direction (z-axis direction) of the wiring substrate 101. The widths and the film thicknesses of the wiring layers 111 and 112 are the same, for example, but may be different from each other.

The via 121 and the impedance element Z are connected to the wiring layer 111. The wiring layer 111 linearly extends along the y-axis direction from the upper end portion of the via 121 to the terminal Zb of the impedance element Z as illustrated in FIG. 4A and (a) of FIG. 4B. The shape of the wiring layer 111 in top view is rectangular, for example, but is not limited thereto.

The impedance element Z, the parallel arm resonator P, and the via 122 are connected to the wiring layer 112. The wiring layer 112 includes a first wiring portion 112a and a second wiring portion 112b as illustrated in FIG. 4A and (a) of FIG. 4B. The connection portion of the first wiring portion 112a and the second wiring portion 112b is the branch point of the wiring layer 112, and corresponds to the node N.

The impedance element Z and the parallel arm resonator P are connected to the first wiring portion 112a. The first wiring portion 112a linearly extends along the y-axis direction from the terminal Za of the impedance element Z to the terminal Pa of the parallel arm resonator P.

The impedance element Z and the via 122 are connected to the second wiring portion 112b. The second wiring portion 112b bends and extends from the terminal Za of the impedance element Z to the upper end portion of the via 122.

The shape of the wiring layer 112 in top view is a U-shape, for example, but is not limited thereto. The second wiring portion 112b may linearly extend, and the shape of the wiring layer 112 in top view may be a V-shape or an L-shape, for example.

The vias 121 and 122 are conductive members extending along the thickness direction of the wiring substrate 101. In the present example, the vias 121 and 122 penetrate through the wiring substrate 101 from the front surface 102 to the back surface 103 thereof. The vias 121 and 122 are formed such that a through hole is formed by a laser or the like in the wiring substrate 101, and then, a conductive material (conductive paste, for example) such as silver (Ag) or copper (Cu) is filled thereto, for example. The method of forming the vias 121 and 122 is not particularly limited. In the present example, the shape of each of the vias 121 and 122 is columnar, but may be prismatic. The shape of each of the vias 121 and 122 is not particularly limited. The cross-sectional areas of the vias 121 and 122 are the same, for example, but may be different from each other.

The terminal 11 and the wiring layer 111 are connected to the via 121. The via 121 is provided overlapping with both the wiring layer 111 and the terminal 11 in top view.

The terminal 12 and the wiring layer 112 are connected to the via 122. The via 122 is provided overlapping with both the wiring layer 112 and the terminal 12 in top view.

Here, the correspondence between the wiring structure included in the radio frequency module 100 according to the present example and the wiring line included in the radio frequency filter 10 illustrated in FIG. 1 will be described. Note that the ground connected to the parallel arm resonator P is not illustrated in FIG. 4A and FIG. 4B. The ground is provided on the back surface 103 of the wiring substrate 101 being electrically insulated from the terminals 11 and 12, for example. The ground and the parallel arm resonator P are connected to each other using a via (not illustrated). The ground may be provided in the wiring substrate 101, or may be provided on the front surface 102. The same applies to other examples and other embodiments.

In the present example, the path 13 connecting the terminal 11 and the terminal 12 is constituted of the via 121, the wiring layer 111, the second wiring portion 112b of the wiring layer 112, and the via 122. The path 13 includes the wiring lines 16 and 15 and the node N as illustrated in FIG. 1. The node N is the branch point of the wiring layer 112, and corresponds to the connection portion of the first wiring portion 112a and the second wiring portion 112b. Further, the wiring line 14 branched from the path 13 at the node N is constituted of the first wiring portion 112a of the wiring layer 112. The wiring length $A_1$ of the wiring line 14 therefore corresponds to the length of the first wiring portion 112a.

The length of the first wiring portion 112a can be defined as the length of the first wiring portion 112a indicated by the thick dashed line as illustrated in (a) of FIG. 4B, for example. The thick dashed line passes through the center of the first wiring portion 112a in the width direction and extends along the direction in which the first wiring portion 112a extends. Here, the center of the terminal Za of the impedance element Z and the terminal Pa of the parallel arm resonator P are regarded as the start point and the end point of the thick dashed line, but are not limited thereto. Both ends of the first wiring portion 112a of the thick dashed line in the extension direction may be regarded as the start point and the end point of the thick dashed line. Note that the definition in common for all of the wiring portions and the wiring layers is used for the definition of the length of each of the wiring portion and the wiring layer. The same applies to other examples and other embodiments for the definition of the length of the wiring layer.

The wiring line 16 included in the path 13 is constituted of the via 121 and the wiring layer 111. The wiring length $B_1$ of the wiring line 16 therefore corresponds to the total length of the length of the via 121 and the length of the wiring layer 111.

Further, the wiring line 15 is virtually not provided. Specifically, the node N and the node N side terminal Za of the impedance element Z are directly connected to each other. The wiring length $A_2$ of the wiring line 15 therefore is zero. Since the wiring length $A_2$ of the wiring line 15 is zero, the sum of the wiring length $A_1$ and the wiring length $A_2$ becomes substantially equal to the wiring length $A_1$, and becomes shorter than the wiring length $B_1$.

The wiring line connecting the node N and the terminal 12 is constituted of the second wiring portion 112b of the wiring layer 112 and the via 122.

Since the wiring length $A_1$ is shorter than the wiring length $B_1$, the length of the first wiring portion 112a is shorter than the total length of the length of the via 121 and the length of the wiring layer 111 in the present embodiment. Since the via 121 penetrates through the wiring substrate 101, the length of the via 121 is equal to the plate thickness of the wiring substrate 101 as illustrated in (b) and (c) of FIG. 4B, for example. Further, the length of the wiring layer 111 is equal to the length of the first wiring portion 112a as illustrated in (a) of FIG. 4B. With this, the wiring length $A_1$ is shorter than the wiring length $B_1$ by the length of the via 121, that is, by the plate thickness of the wiring substrate 101.

With the above configuration, the wiring length $A_1$ between the node N and the parallel arm resonator P becomes shorter than the wiring length $B_1$ between the terminal 11 and the impedance element Z, and therefore, the deterioration of the filter characteristic is suppressed in the radio frequency module 100 according to the present example as described with reference to FIGS. 2A, 2B and 2C, and FIGS. 3A, 3B and 3C.

Example 2

Next, a radio frequency module according to Example 2 will be described with reference to FIG. 5A and FIG. 5B. The radio frequency module according to the present example is different compared to the radio frequency module according to Example 1 in that the wiring line 14 connecting the node N and the parallel arm resonator P is provided in the wiring substrate. In the following description, the points different from Example 1 will mainly be described, and the description of points in common will be omitted or simplified.

Figure 5A:
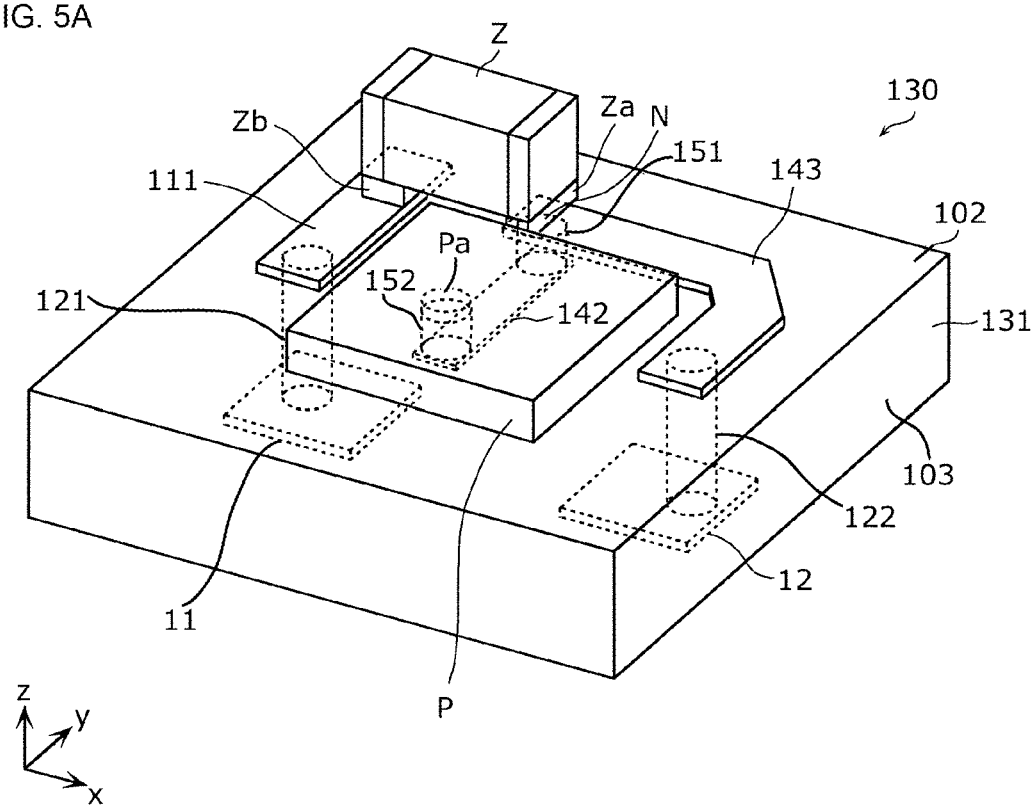
FIG. 5A is a perspective view of a radio frequency module according to Example 2 of Embodiment 1.

FIG. 5A is a perspective view of a radio frequency module 130 according to the present example. FIG. 5B is a three-view drawing of the radio frequency module 130 according to the present example. The portions (a), (b), and (c) of FIG. 5B are a top plan, an elevation, and a right side elevation of the radio frequency module 130, respectively.

The radio frequency module 130 includes the wiring substrate 131 as illustrated in FIG. 5A and FIG. 5B.

The wiring substrate 131 is the same as the wiring substrate 101 except that the number and the shapes of the wiring layers and the vias included in the wiring substrate 131 are different from those of the wiring substrate 101. The wiring substrate 131 includes the wiring layer 111, a wiring layer 142, a wiring layer 143, the via 121, the via 122, a via 151, and a via 152 in the present example as illustrated in FIG. 5A and FIG. 5B. The wiring layer 111 and the vias 121 and 122 are the same as those in Example 1. Further, the wiring layer 143 is the same as the second wiring portion 112b of the wiring layer 112 according to Example 1.

The wiring layer 142 is a conductive pattern wiring line provided in the wiring substrate 131. The wiring layer 142 is formed such that a metal thin film of silver (Ag) or copper (Cu) or the like is formed while constructing the lamination structure of the wiring substrate 131, and then, the metal thin film is patterned in a predetermined shape, for example. The wiring layer 142 extends in a direction parallel to the front surface 102, that is, in a direction orthogonal to the thickness direction (z-axis direction) of the wiring substrate 131.

The via 151 and the via 152 are connected to the wiring layer 142. The wiring layer 142 linearly extends along the y-axis direction from the lower end portion of the via 151 to the lower end portion of the via 152 as illustrated in FIG. 5B. The shape of the wiring layer 142 in top view is rectangular, for example, but is not limited thereto. The wiring layer 142 is provided at a position closer to the front surface 102 than the back surface 103 in the thickness direction of the wiring substrate 131 as illustrated in (b) and (c) of FIG. 5B. Alternatively, the wiring layer 142 may be provided at a position closer to the back surface 103 than the front surface 102.

The vias 151 and 152 are conductive members extending along the thickness direction of the wiring substrate 131. The vias 151 and 152 are embedded in recesses that are recessed from the front surface 102 toward the back surface 103 of the wiring substrate 131 in the present example. That is, the vias 151 and 152 do not penetrate through the wiring substrate 131. The vias 151 and 152 are formed such that a recess not penetrating through is formed by a laser or the like in the wiring substrate 131, and then, a conductive material (conductive paste, for example) such as silver (Ag) or copper (Cu) is filled thereto, for example. The method of forming the vias 151 and 152 is not particularly limited. In the present example, the shape of each of the vias 151 and 152 is columnar, but may be prismatic. The shape of each of the vias 151 and 152 is not particularly limited. The cross-sectional areas of the vias 151 and 152 are the same, for example, but may be different from each other.

The wiring layer 143 and the wiring layer 142 are connected to the via 151. The via 151 is provided overlapping with the wiring layers 143 and 142 and the terminal Za of the impedance element Z in top view.

The wiring layer 142 and the parallel arm resonator P are connected to the via 152. The via 152 is provided overlapping with the wiring layer 142 and the terminal Pa of the parallel arm resonator P in top view.

Here, the correspondence between the wiring structure included in the radio frequency module 130 according to the present example and the wiring line included in the radio frequency filter 10 illustrated in FIG. 1 will be described.

In the present example, the path 13 connecting the terminal 11 and the terminal 12 is constituted of the via 121, the wiring layer 111, the wiring layer 143, and the via 122. The node N included in the path 13 is a connection point between the wiring layer 143 and the via 151. Further, the wiring line 14 branched from the path 13 is constituted of the via 151, the wiring layer 142, and the via 152. The wiring length $A_1$ of the wiring line 14 therefore corresponds to the total length of the length of the via 151, the length of the wiring layer 142, and the length of the via 152. The wiring lines 15 and 16 are the same as those in Example 1.

In the present embodiment, since the wiring length $A_1$ is shorter than the wiring length $B_1$, the total length of the length of the via 151, the length of the wiring layer 142, and the length of the via 152 is shorter than the total length of the length of the via 121 and the length of the wiring layer 111. The length of the via 151 and the length of the via 152 are equal to each other as illustrated in (b) and (c) of FIG. 5B, for example. Since the wiring layer 142 is close to the front surface 102, the length of the via 151 and the length of the via 152 are shorter than half of the plate thickness of the wiring substrate 131 (that is, length of via 121) in the present example. In other words, the total length of the vias 151 and 152 is shorter than the length of the via 121. The length of the wiring layer 142 is equal to the length of the wiring layer 111 as illustrated in (a) of FIG. 5B. With this, the wiring length $A_1$ is shorter than the wiring length $B_1$ by the difference between the length of the via 121 and the total length of the vias 151 and 152.

With the above configuration, the wiring length $A_1$ between the node N and the parallel arm resonator P becomes shorter than the wiring length $B_1$ between the terminal 11 and the impedance element Z, and therefore, the deterioration of the filter characteristic is suppressed in the radio frequency module 130 according to the present example as described with reference to FIGS. 2A, 2B and 2C, and FIGS. 3A, 3B and 3C.

Example 3

Next, a radio frequency module according to Example 3 will be described with reference to FIG. 6A and FIG. 6B. The radio frequency module according to the present example is different compared to the radio frequency module according to Example 1 in that the impedance element Z and the wiring structure are provided in the wiring substrate. In the following description, the points different from Example 1 or 2 will mainly be described, and the description of points in common will be omitted or simplified.

Figure 6A:
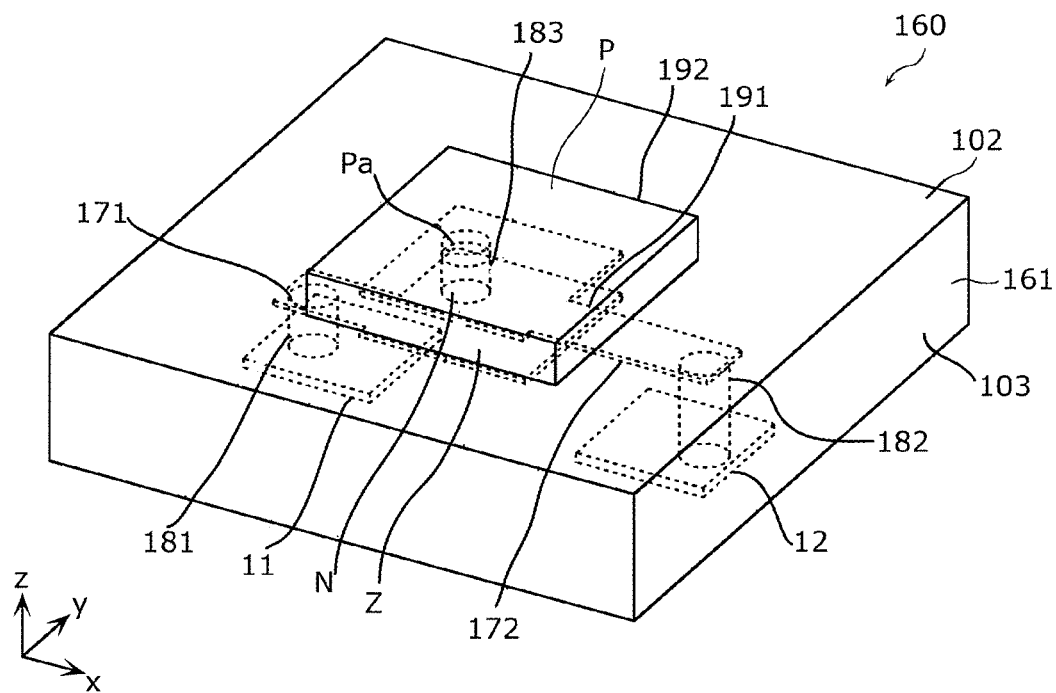
FIG. 6A is a perspective view of a radio frequency module according to Example 3 of Embodiment 1.

FIG. 6A is a perspective view of a radio frequency module 160 according to the present example. FIG. 6B is a three-view drawing of the radio frequency module 160 according to the present example. The portions (a), (b), and (c) of FIG. 6B are a top plan, an elevation, and a right side elevation of the radio frequency module 160, respectively.

The radio frequency module 160 includes a wiring substrate 161 as illustrated in FIG. 6A and FIG. 6B.

The wiring substrate 161 is the same as the wiring substrate 101 excluding the following: the number and the shapes of the wiring layers and the vias included in the wiring substrate 161 are different from those of the wiring substrate 101; the impedance element Z is provided in the wiring substrate 161. The wiring substrate 161 includes a wiring layer 171, a wiring layer 172, a via 181, a via 182, and a via 183 in the present example as illustrated in FIG. 6A and FIG. 6B.

The impedance element Z is a capacitor, and includes an electrode plate 191 and an electrode plate 192 in the present example. The electrode plates 191 and 192 are positioned in the wiring substrate 161. The electrode plates 191 and 192 are disposed to face each other with a predetermined distance, and constitute a so-called parallel plate electrode. When the front surface 102 of the wiring substrate 161 is viewed in plan view, the electrode plate 191 and the electrode plate 192 overlap with each other. The electrode plates 191 and 192 correspond to the terminals Zb and Za of the impedance element Z respectively, and also function as part of the wiring line.

The electrode plates 191 and 192 each are conductive pattern electrodes provided in the wiring substrate 161. The electrode plates 191 and 192 are formed such that a metal thin film of silver (Ag) or copper (Cu) or the like is formed while constructing the lamination structure of the wiring substrate 161, and then, the metal thin film is patterned in a predetermined shape, for example.

The wiring layers 171 and 172 are conductive pattern wiring lines provided in the wiring substrate 161. In the present example, the wiring layers 171 and 172 are positioned in the same layer as the electrode plates 191 and 192 of the impedance element Z, respectively. The wiring layer 171 is formed in the same process as that of the electrode plate 191, and the wiring layer 172 is formed in the same process as that of the electrode plate 192, for example. Both of the wiring layers 171 and 172 extend in a direction parallel to the front surface 102, that is, in a direction orthogonal to the thickness direction (z-axis direction) of the wiring substrate 161.

The via 181 and the impedance element Z are connected to the wiring layer 171. The wiring layer 171 linearly extends along the x-axis direction from the upper end portion of the via 181 to the electrode plate 191 as illustrated in FIG. 6B. The shape of the wiring layer 171 in top view is rectangular, for example, but is not limited thereto. The wiring layer 171 and the electrode plate 191 are integrally formed.

The via 182 and the impedance element Z are connected to the wiring layer 172. The wiring layer 172 linearly extends along the x-axis direction from the upper end portion of the via 182 to the electrode plate 192 as illustrated in FIG. 6B. The shape of the wiring layer 172 in top view is rectangular, for example, but is not limited thereto. The wiring layer 172 and the electrode plate 192 are integrally formed.

The wiring layer 172 and the electrode plate 192 are provided at positions closer to the front surface 102 than the back surface 103 in the thickness direction of the wiring substrate 161 as illustrated in (b) and (c) of FIG. 6B. For example, the distance between the front surface 102 and each of the wiring layer 172 and the electrode plate 192, that is, the length of the via 183 is equal to or shorter than the distance between the back surface 103 and each of the wiring layer 171 and the electrode plate 192, that is, the length of the via 181. Alternatively, the wiring layer 172 and the electrode plate 192 may be provided at positions closer to the back surface 103 than the front surface 102.

The vias 181, 182, and 183 are conductive members extending along the thickness direction of the wiring substrate 161. The vias 181 and 182 are embedded in recesses that are recessed from the back surface 103 toward the front surface 102 of the wiring substrate 161 in the present example. The via 183 is embedded in a recess that is recessed from the front surface 102 toward the back surface 103 of the wiring substrate 161. That is, the vias 181, 182, and 183 do not penetrate through the wiring substrate 161. Each of the vias 181, 182, and 183 is formed such that a recess not penetrating through is formed in the wiring substrate 161 by a laser or the like, and then, a conductive material (conductive paste, for example) such as silver (Ag) or copper (Cu) is filled thereto, for example. The method for forming the vias 181, 182, and 183 is not particularly limited. In the present example, the shape of each of the vias 181, 182, and 183 is columnar, but may be prismatic. The shape of each of the vias 181, 182, and 183 is not particularly limited. The vias 181, 182, and 183 have the same cross-sectional area, for example, but may have different cross-sectional areas.

The terminal 11 and the wiring layer 171 are connected to the via 181. The via 181 is provided overlapping with the wiring layer 171 and the terminal 11 in top view.

The terminal 12 and the wiring layer 172 are connected to the via 182. The via 182 is provided overlapping with the wiring layer 172 and the terminal 12 in top view.

The impedance element Z and the parallel arm resonator P are connected to the via 183. The via 183 is provided overlapping with the electrode plate 192 of the impedance element Z and the terminal Pa of the parallel arm resonator P in top view. Note that the via 183 may be connected to the wiring layer 172 instead of the impedance element Z.

Here, the correspondence between the wiring structure included in the radio frequency module 160 according to the present example and the wiring line included in the radio frequency filter 10 illustrated in FIG. 1 will be described.

In the present example, the path 13 connecting the terminal 11 and the terminal 12 is constituted of the via 181, the wiring layer 171, the electrode plate 191, the electrode plate 192, the wiring layer 172, and the via 182. The node N is a connection point of the electrode plate 192 and the via 183. The wiring line 14 branched from the path 13 is constituted of the via 183. The wiring length $A_1$ of the wiring line 14 therefore corresponds to the length of the via 183.

The wiring line 16 included in the path 13 is constituted of the via 181 and the wiring layer 171. The wiring length $B_1$ of the wiring line 16 therefore corresponds to the total length of the length of the via 181 and the length of the wiring layer 171.

Further, the wiring line 15 is virtually not provided. That is, the node N and the node N side terminal Za of the impedance element Z are directly connected to each other. The wiring length $A_2$ of the wiring line 15 therefore is zero. Further, since the wiring length $A_2$ of the wiring line 15 is zero, the sum of the wiring length $A_1$ and the wiring length $A_2$ becomes substantially equal to the wiring length $A_1$, and becomes shorter than the wiring length $B_1$.

The wiring line connecting the node N and the terminal 12 is constituted of the wiring layer 172 and the via 182.

Since the wiring length $A_1$ is shorter than the wiring length $B_1$, the length of the via 183 is shorter than the total length of the length of the via 181 and the length of the wiring layer 171 in the present embodiment. The length of the via 183 is shorter than the length of the via 181, for example. The wiring length $A_1$ therefore is shorter than the wiring length $B_1$ at least by the length of the wiring layer 171.

With the above configuration, the wiring length $A_1$ between the node N and the parallel arm resonator P becomes shorter than the wiring length $B_1$ between the terminal 11 and the impedance element Z, and therefore, the deterioration of the filter characteristic is suppressed in the radio frequency module 160 according to the present example as described with reference to FIGS. 2A, 2B and 2C, and FIGS. 3A, 3B and 3C.

Note that the length of the via 183 may be longer than the length of the via 181 as long as the wiring length $A_1$ is shorter than the wiring length $B_1$. That is, the impedance element Z may be provided at a position closer to the back surface 103 than the front surface 102 of the wiring substrate 161.

Conclusion

As described above, the radio frequency module according to the present embodiment is a radio frequency module including a radio frequency filter, and the radio frequency filter includes an input terminal, an output terminal, a first impedance element disposed in series on a path connecting the input terminal and the output terminal, and an acoustic wave resonator connected between a node on the path and a ground. The first impedance element is a capacitor or an inductor. The wiring length between the node and the acoustic wave resonator is shorter than the wiring length between the first impedance element and the terminal out of the input terminal and the output terminal having a shorter wiring length to the first impedance element.

Accordingly, an unnecessary inductive component connected in series to the parallel arm resonator P and an unnecessary capacitive component connected in parallel to the parallel arm resonator P is suppressed, and therefore, the deterioration of the filter characteristic of the radio frequency filter 10 may be suppressed as described with reference to FIGS. 2A, 2B and 2C, and FIGS. 3A, 3B and 3C. Thus, a radio frequency module including the radio frequency filter 10 in which the deterioration of the filter characteristic is suppressed may be realized.

Further, the radio frequency module further includes a wiring substrate having a first surface and a second surface that are facing away from each other, for example. The acoustic wave resonator is provided on the first surface, and the input terminal and the output terminal are provided on the second surface.

Accordingly, since the input terminal and the output terminal can be provided on the same surface of the wiring substrate, the radio frequency module may easily be mounted on another circuit substrate or the like. For example, one time mounting may achieve the connection of both the input terminal and the output terminal.

Further, the first impedance element is provided in the wiring substrate, and at the same time, in a position overlapping with the acoustic wave resonator when the first surface is viewed in plan view, for example.

Accordingly, since the number of elements mounted on the surface of the wiring substrate may be reduced, the flexibility in layout may be improved.

Further, the wiring substrate includes one or more wiring layers extending in a direction parallel to the first surface, and one or more vias extending in a direction orthogonal to the first surface, for example. Each of the input terminal, the output terminal, the first impedance element, and the acoustic wave resonator is connected to at least one of the one or more wiring layers and the one or more vias. The node is a branch point in one wiring layer out of the one or more wiring layers, or a connection point of one wiring layer out of the one or more wiring layers and one via out of the one or more vias.

Accordingly, adjusting the length of the wiring layer or the via enables to easily obtain the desired wiring length. That is, appropriate design of the layout of each element and each wiring line makes it possible to easily shorten the wiring length between the node N and the parallel arm resonator P, and makes it possible to suppress the deterioration of the filter characteristic.

Further, for example, the sum of the wiring length between the node and the acoustic wave resonator and the wiring length between the node and the first impedance element is shorter than the wiring length between the first impedance element and the terminal out of the input terminal and the output terminal having a shorter wiring length to the first impedance element.

This makes it possible to further suppress the unnecessary inductive component and the unnecessary capacitive component, and therefore, the deterioration of the filter characteristic may further be suppressed.

Note that the inductive component or the capacitive component generated in the wiring line also varies depending on the wiring width. With this, when a wiring line having a different wiring width is included, a wiring length may be regarded as a value normalized by the wiring width.

Embodiment 2

Subsequently, a radio frequency module according to Embodiment 2 will be described.

The radio frequency module according to the present embodiment is different compared to the radio frequency module according to Embodiment 1 in the circuit configuration of the radio frequency filter included in the radio frequency module. Hereinafter, the points different from Embodiment 1 will mainly be described, and the description of points in common will be omitted or simplified.

FIG. 7 is a circuit configuration diagram of a radio frequency filter 20 included in the radio frequency module according to the present embodiment. The radio frequency filter 20 newly includes an impedance element Z2 as compared with the radio frequency filter 10 according to Embodiment 1 as illustrated in FIG. 7. The radio frequency filter 20 is a high pass filter, for example, but may be a low pass filter, or may be a band pass filter or a notch filter.

Note that, an impedance element Z1 is illustrated instead of the impedance element Z for convenience of description in FIG. 7, but the impedance element Z1 and terminals Za1 and Zb1 are the same as the impedance element Z and the terminals Za and Zb according to Embodiment 1.

The impedance element Z2 is an example of a second impedance element disposed in series on the path 13. In the present embodiment, the node N is positioned between the impedance element Z1 and the impedance element Z2.

The impedance element Z2 is a capacitor or an inductor. The impedance element Z2 is an impedance element of the same type as the impedance element Z1. That is, both of the impedance elements Z1 and Z2 are capacitors. Alternatively, both of the impedance elements Z1 and Z2 may be inductors.

Wiring lengths that are lengths of wiring lines for electrically connecting each of the terminals, each of the elements, and the node of the radio frequency filter 20 are illustrated in FIG. 7. The specific configuration of the wiring lines will be described later in detail with reference to examples which will be described later. Since the wiring length $A_1$, the wiring length $A_2$, and the wiring length $B_1$ each illustrated in FIG. 7 are the same as those in Embodiment 1, the description thereof will be omitted.

The wiring length $A_3$ is the wiring length between the node N and the impedance element Z2. Specifically, the wiring length $A_3$ is the length of a wiring line 25 connecting the node N and a node N side terminal Za2 of the impedance element Z2.

The wiring length $B_2$ is the wiring length between the terminal 12 and the impedance element Z2. Specifically, the wiring length $B_2$ is the length of a wiring line 26 connecting the terminal 12 and a terminal 12 side terminal Zb2 of the impedance element Z2.

In the present embodiment, the wiring length $A_1$ is shorter than the wiring length $B_1$ as with Embodiment 1. Further, the sum of the wiring length $A_1$ and the wiring length $A_2$ is shorter than the wiring length $B_1$. With this, the deterioration of the filter characteristic may be suppressed as with Embodiment 1.

Further, in the present embodiment, the wiring length between the node N and the parallel arm resonator P is shorter than the wiring length between the impedance element Z2 and the terminal out of the terminals 11 and 12 having a shorter wiring length to the impedance element Z2. Specifically, the sum of the wiring length between the node N and the parallel arm resonator P and the wiring length between the node N and the impedance element Z2 is shorter than the wiring length between the impedance element Z2 and the terminal out of the terminals 11 and 12 having a shorter wiring length to the impedance element Z2. The terminal having a shorter wiring length to the impedance element Z2 is the terminal 12, for example. That is, the wiring length $A_1$ is shorter than each of the wiring lengths $B_1$ and $B_2$ in the present embodiment. Further, the sum of the wiring length $A_1$ and the wiring length $A_3$ is shorter than the wiring length $B_2$. Further, the sum of the wiring length $A_1$, the wiring length $A_2$, and the wiring length $A_3$ may be shorter than the wiring length $B_1$ or $B_2$. Note that the terminal having a shorter wiring length to the impedance element Z2 may be the terminal 11.

With the above configuration, the generation of the unnecessary inductive component connected in series to the parallel arm resonator P and the unnecessary capacitive component connected in parallel to the parallel arm resonator P is suppressed. Thus, the degradation of the filter characteristic of the radio frequency filter 20 according to the present embodiment may be suppressed as described with reference to FIGS. 2A, 2B and 2C, and FIGS. 3A, 3B and 3C as with Embodiment 1.

Hereinafter, a specific example of a radio frequency module including the radio frequency filter 20 according to the present embodiment will be described. Note that the arrangements and shapes of elements, wiring substrates, wiring layers, and vias in the respective examples are merely examples, and are not limited to the described examples.

Example 1

First, a radio frequency module according to Example 1 will be described with reference to FIG. 8A and FIG. 8B. In the following description, the points different from Example 1 to Example 3 of Embodiment 1 will mainly be described, and the description of points in common will be omitted or simplified.

Figure 8A:
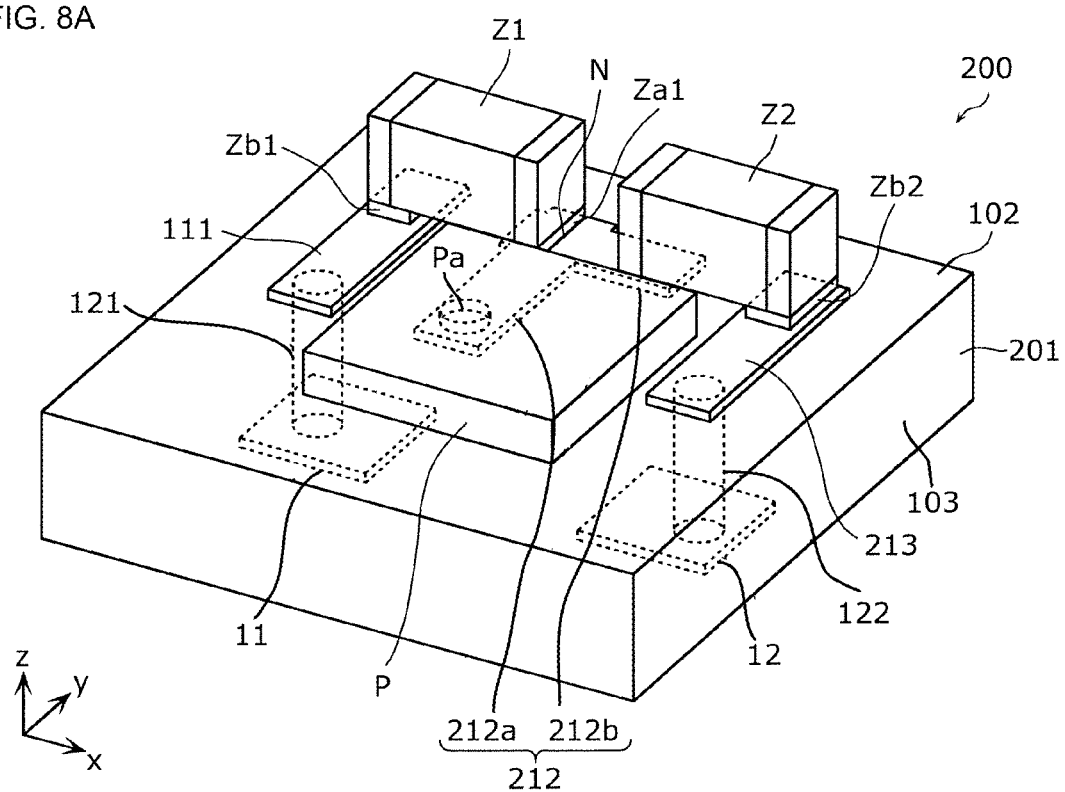
FIG. 8A is a perspective view of a radio frequency module according to Example 1 of Embodiment 2.

FIG. 8A is a perspective view of a radio frequency module 200 according to the present example. FIG. 8B is a three-view drawing of the radio frequency module 200 according to the present example. The portions (a), (b), and (c) of FIG. 8B are a top plan, an elevation, and a right side elevation of the radio frequency module 200, respectively.

Figure 8B:
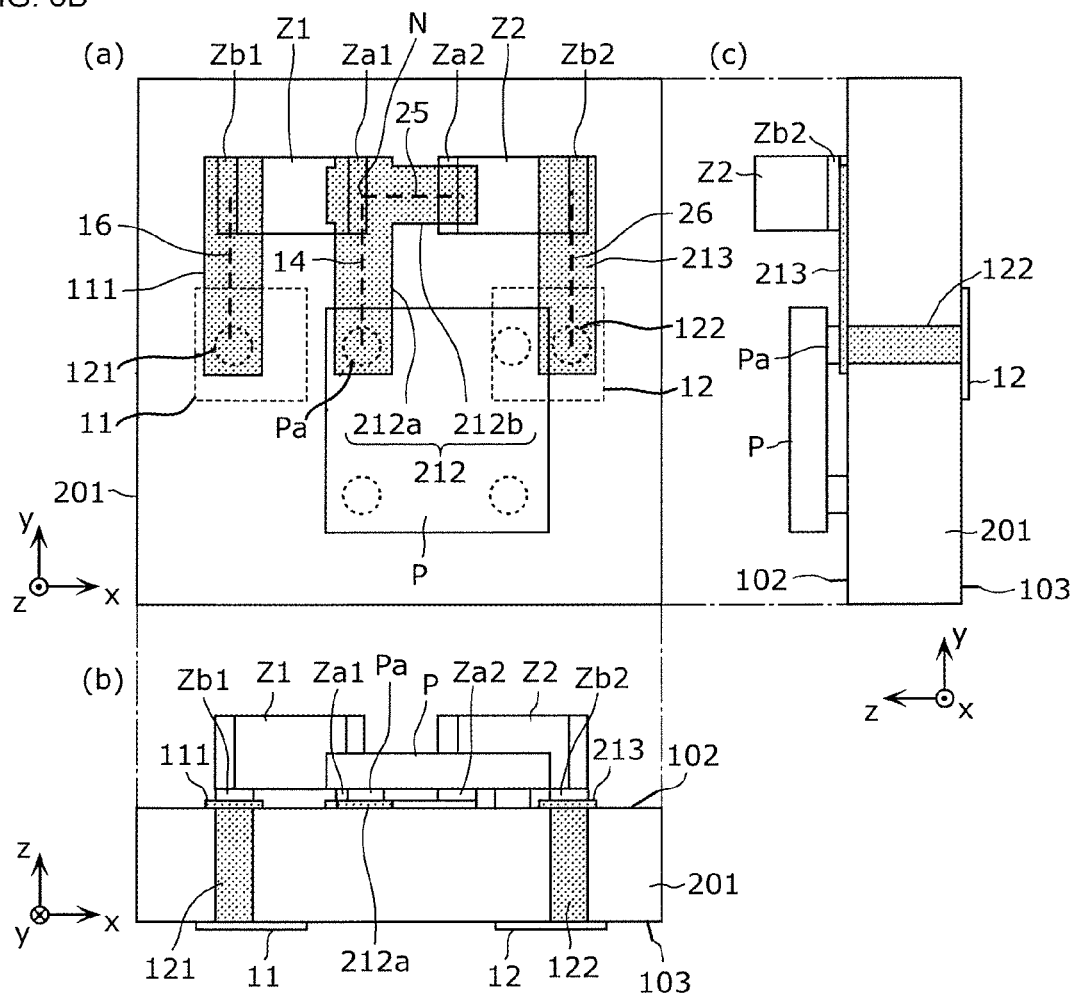
FIG. 8B is a three-view drawing of the radio frequency module according to Example 1 of Embodiment 2.

The radio frequency module 200 includes a wiring substrate 201 as illustrated in FIG. 8A and FIG. 8B.

The wiring substrate 201 is the same as the wiring substrate 101 according to Example 1 of Embodiment 1 except that the number and the shapes of wiring layers included in the wiring substrate 201 are different from those of the wiring substrate 101. On the front surface 102 of the wiring substrate 201, the parallel arm resonator P, the impedance elements Z1 and Z2 are provided.

The wiring substrate 201 includes the wiring layer 111, a wiring layer 212, a wiring layer 213, the via 121, and the via 122 in the present example as illustrated in FIG. 8A and FIG. 8B. The wiring layer 111, the vias 121 and 122 are the same as those in Example 1 of Embodiment 1.

The wiring layers 212 and 213 are conductive pattern wiring lines provided on the front surface 102 of the wiring substrate 201. The wiring layers 212 and 213 are formed such that a metal thin film of silver (Ag) or copper (Cu) or the like is formed on the front surface 102, and then, the metal thin film is patterned in a predetermined shape, for example. Both of the wiring layers 212 and 213 extend in a direction parallel to the front surface 102, that is, in a direction orthogonal to the thickness direction (z-axis direction) of the wiring substrate 201. The widths and the film thicknesses of the wiring layers 212 and 213 are the same, for example, but may be different from each other.

The impedance element Z1, the parallel arm resonator P, and the impedance element Z2 are connected to the wiring layer 212. The wiring layer 212 includes a first wiring portion 212a and a second wiring portion 212b as illustrated in FIG. 8A and (a) of FIG. 8B. The connection portion of the first wiring portion 212a and the second wiring portion 212b is a branch point of the wiring layer 212, and corresponds to the node N.

The impedance element Z1 and the parallel arm resonator P are connected to the first wiring portion 212a. The first wiring portion 212a linearly extends along the y-axis direction from the terminal Za1 of the impedance element Z1 to the terminal Pa of the parallel arm resonator P.

The impedance element Z1 and the impedance element Z2 are connected to the second wiring portion 212b. The second wiring portion 212b linearly extends along the x-axis direction from the terminal Za1 of the impedance element Z1 to the terminal Za2 of the impedance element Z2.

The shape of the wiring layer 212 in top view is an L-shape, for example, but is not limited thereto. The shape of the wiring layer 212 in top view may be a V-shape, for example.

The impedance element Z2 and the via 122 are connected to the wiring layer 213. The wiring layer 213 linearly extends along the y-axis direction from the terminal Zb2 of the impedance element Z2 to the upper end portion of the via 122 as illustrated in FIG. 8A and (a) of FIG. 8B. The shape of the wiring layer 213 in top view is rectangular, for example, but is not limited thereto.

Here, the correspondence between the wiring structure included in the radio frequency module 200 according to the present example and the wiring line included in the radio frequency filter 20 illustrated in FIG. 7 will be described.

In the present example, the path 13 connecting the terminal 11 and the terminal 12 is constituted of the via 121, the wiring layer 111, the second wiring portion 212b of the wiring layer 212, the wiring layer 213, and the via 122. The path 13 includes the wiring line 16, the wiring line 15, the node N, the wiring line 25, and the wiring line 26 as illustrated in FIG. 7. The node N is a branch point of the wiring layer 212, and corresponds to the connection portion of the first wiring portion 212a and the second wiring portion 212b. Further, the wiring line 14 branched from the path 13 at the node N is constituted of the first wiring portion 212a of the wiring layer 212. The wiring length $A_1$ of the wiring line 14 therefore corresponds to the length of the first wiring portion 212a. The wiring lines 16 and 15 are the same as those in Example 1 of Embodiment 1.

Further, the wiring line 25 is constituted of the second wiring portion 212b of the wiring layer 212. The wiring length $A_3$ of the wiring line 25 therefore corresponds to the length of the second wiring portion 212b.

Further, the wiring line 26 is constituted of the wiring layer 213 and the via 122. The wiring length $B_2$ of the wiring line 26 therefore corresponds to the total length of the length of the wiring layer 213 and the length of the via 122.

Since the wiring length $A_1$ is shorter than the wiring length $B_1$, the length of the first wiring portion 212a is shorter than the total length of the length of the via 121 and the length of the wiring layer 111 in the present embodiment. Further, since the wiring length $A_1$ is shorter than the wiring length $B_2$, the length of the first wiring portion 212a is shorter than the total length of the length of the wiring layer 213 and the length of the via 122.

Since the vias 121 and 122 each penetrate through the wiring substrate 201, the length of the via 121 and the length of the via 122 are equal to the plate thickness of the wiring substrate 201 as illustrated in (b) and (c) of FIG. 8B, for example. Further, the length of the wiring layer 111 and the length of the wiring layer 213 are equal to the length of the first wiring portion 212a as illustrated in (a) of FIG. 8B. The wiring lengths $B_1$ and $B_2$ are therefore equal to each other, and the wiring lengths each are longer than the wiring length $A_1$ by the length of the via 121, that is, the plate thickness of the wiring substrate 201 in the present example.

Further, since the sum of the wiring length $A_1$ and the wiring length $A_3$ is shorter than the wiring length $B_2$, the total length of the length of the first wiring portion 212a and the length of the second wiring portion 212b is shorter than the total length of the length of the wiring layer 213 and the length of the via 122. The length of the second wiring portion 212b is shorter than the plate thickness of the wiring substrate 201, for example.

With the above configuration, the wiring length $A_1$ between the node N and the parallel arm resonator P becomes shorter than the wiring length $B_1$ between the terminal 11 and the impedance element Z1 in the radio frequency module 200 according to the present example. Further, the wiring length $A_1$ becomes shorter than the wiring length $B_2$ between the terminal 12 and the impedance element Z2. Accordingly, the deterioration of the filter characteristic is suppressed as described with reference to FIGS. 2A, 2B and 2C, and FIGS. 3A, 3B and 3C.

Example 2

Next, a radio frequency module according to Example 2 will be described with reference to FIG. 9A and FIG. 9B. The radio frequency module according to the present example is different compared to the radio frequency module according to Example 1 in that the wiring lines 14, 15, and 25 are provided in the wiring substrate. In the following description, the points different from Example 1 will mainly be described, and the description of points in common will be omitted or simplified.

Figure 9A:
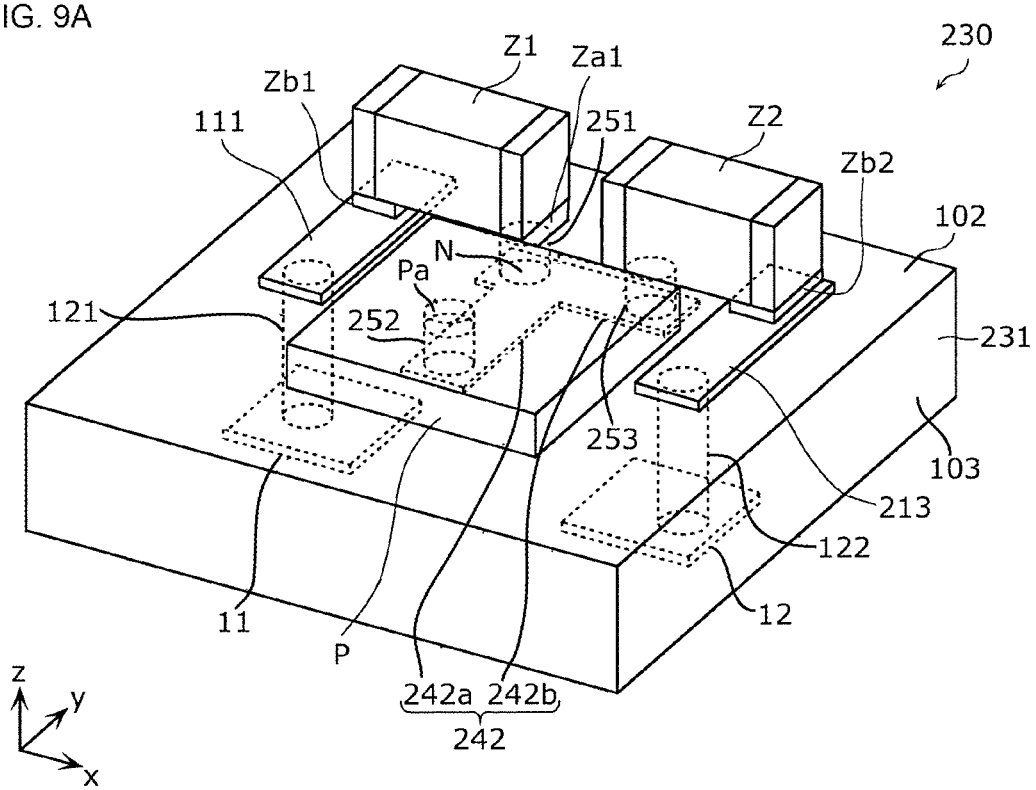
FIG. 9A is a perspective view of a radio frequency module according to Example 2 of Embodiment 2.

FIG. 9A is a perspective view of a radio frequency module 230 according to the present example. FIG. 9B is a three-view drawing of the radio frequency module 230 according to the present example. The portions (a), (b), and (c) of FIG. 9B are a top plan, an elevation, and a right side elevation of the radio frequency module 230, respectively.

The radio frequency module 230 includes a wiring substrate 231 as illustrated in FIG. 9A and FIG. 9B.

The wiring substrate 231 is the same as the wiring substrate 201 except that the number and the shapes of the wiring layers and the vias included in the wiring substrate 231 are different from those of the wiring substrate 201. The wiring substrate 231 includes the wiring layer 111, a wiring layer 242, the wiring layer 213, the via 121, the via 122, a via 251, a via 252, and a via 253 in the present example as illustrated in FIG. 9A and FIG. 9B. The wiring layers 111 and 213 and the vias 121 and 122 are the same as those in Example 1.

The wiring layer 242 is a conductive pattern wiring line provided in the wiring substrate 231. The wiring layer 242 is formed such that a metal thin film of silver (Ag) or copper (Cu) or the like is formed while constructing the lamination structure of the wiring substrate 231, and then, the metal thin film is patterned in a predetermined shape, for example. The wiring layer 242 extends in a direction parallel to the front surface 102, that is, in a direction orthogonal to the thickness direction (z-axis direction) of the wiring substrate 231.

The wiring layer 242 has substantially the same shape and size as the wiring layer 212 according to Example 1, and is different from the wiring layer 212 in that the wiring layer 242 is provided in the wiring substrate 231. The wiring layer 242 includes a first wiring portion 242a and a second wiring portion 242b. The first wiring portion 242a and the second wiring portion 242b are substantially the same in shape and size as the first wiring portion 212a and the second wiring portion 212b of the wiring layer 212 according to Example 1, respectively. The connection portion of the first wiring portion 242a and the second wiring portion 242b is a branch point of the wiring layer 242, and corresponds to the node N.

The via 251 and the via 252 are connected to the first wiring portion 242a. The first wiring portion 242a linearly extends along the y-axis direction from the lower end portion of the via 251 to the lower end portion of the via 252 as illustrated in FIG. 9B.

The via 251 and the via 253 are connected to the second wiring portion 242b. The second wiring portion 242b linearly extends along the x-axis direction from the lower end portion of the via 251 to the lower end portion of the via 253 as illustrated in FIG. 9B.

The wiring layer 242 is provided at a position closer to the front surface 102 than the back surface 103 in the thickness direction of the wiring substrate 231 as illustrated in (b) and (c) of FIG. 9B. Alternatively, the wiring layer 242 may be provided at a position closer to the back surface 103 than the front surface 102.

The vias 251, 252, and 253 are conductive members extending along the thickness direction of the wiring substrate 231. The vias 251, 252, and 253 are embedded in recesses that are recessed from the front surface 102 toward the back surface 103 of the wiring substrate 231 in the present example. That is, the vias 251, 252, and 253 do not penetrate through the wiring substrate 231. The vias 251, 252, and 253 are the same as the via 151 and the like according to Example 2 of Embodiment 1 in the method of forming, the shape, the size, and the like, for example.

The impedance element Z1 and the wiring layer 242 are connected to the via 251. The via 251 is provided overlapping with the terminal Za1 of the impedance element Z1 and the wiring layer 242 in top view.

The wiring layer 242 and the parallel arm resonator P are connected to the via 252. The via 252 is provided overlapping with the wiring layer 242 and the terminal Pa of the parallel arm resonator P in top view.

The wiring layer 242 and the impedance element Z2 are connected to the via 253. The via 253 is provided overlapping with the wiring layer 242 and the terminal Za2 of the impedance element Z2 in top view.

Here, the correspondence between the wiring structure included in the radio frequency module 230 according to the present example and the wiring line included in the radio frequency filter 20 illustrated in FIG. 7 will be described.

In the present example, the path 13 connecting the terminal 11 and the terminal 12 is constituted of the via 121, the wiring layer 111, the via 251, the second wiring portion 242b of the wiring layer 242, the via 253, the wiring layer 213, and the via 122. The node N is a branch point of the wiring layer 242, that is, a connection point of the first wiring portion 242a and the second wiring portion 242b. The node N is also the connection point of the via 251 and the wiring layer 242 in the present example. The wiring line 14 branched from the path 13 is constituted of the first wiring portion 242a of the wiring layer 242 and the via 252. The wiring length $A_1$ of the wiring line 14 therefore corresponds to the total length of the length of the first wiring portion 242a and the length of the via 252.

Further, the wiring line 15 included in the path 13 is constituted of the via 251. The wiring length $A_2$ of the wiring line 15 therefore corresponds to the length of the via 251. Further, the wiring line 25 is constituted of the second wiring portion 242b of the wiring layer 242 and the via 253. The wiring length $A_3$ of the wiring line 25 therefore corresponds to the total length of the length of the second wiring portion 242b and the length of the via 253.

The wiring line 16 and the wiring line 26 are the same as those of Example 1. The wiring length $B_1$ of the wiring line 16 therefore is the total length of the length of the wiring layer 111 and the length of the via 121 as with Example 1, and is equal to the wiring length $B_2$ of the wiring line 26.

Since the wiring length $A_1$ is shorter than the wiring length $B_1$, the total length of the length of the first wiring portion 242a and the length of the via 252 is shorter than the total length of the length of the wiring layer 111 and the length of the via 121 in the present embodiment. Since the wiring layer 242 is close to the front surface 102, the length of the via 252 is shorter than half of the plate thickness of the wiring substrate 231, for example. Further, the length of the first wiring portion 242a is equal to the length of the wiring layer 111. The wiring length $A_1$ therefore is shorter than each of the wiring length $B_1$ and the wiring length $B_2$ by the difference between the length of the via 121 and the length of the via 252.

Further, the wiring length $A_2$ corresponds to the length of the via 251, and is equal to the length of the via 252. Since the total length of the length of the via 251 and the length of the via 252 is shorter than the length of the via 121, the sum of the wiring length $A_1$ and the wiring length $A_2$ becomes shorter than the wiring length $B_1$.

The wiring length $A_3$ corresponds to the total length of the length of the second wiring portion 242b and the length of the via 253. The length of the via 253 is equal to the length of the via 252. In this case, when the length of the second wiring portion 242b is shorter than the difference between the plate thickness of the wiring substrate 231 and the double of the length of the via 252, the total length of the wiring length $A_1$ and the wiring length $A_3$ is shorter than the wiring length $B_2$, for example. Note that the total length of the wiring length $A_1$ and the wiring length $A_3$ may not necessarily be shorter than the wiring length $B_2$.

With the above configuration, the wiring length $A_1$ between the node N and the parallel arm resonator P becomes shorter than the wiring length $B_1$ between the terminal 11 and the impedance element Z1 in the radio frequency module 230 according to the present example. Further, the wiring length $A_1$ becomes shorter than the wiring length $B_2$ between the terminal 12 and the impedance element Z2. Accordingly, the deterioration of the filter characteristic is suppressed as described with reference to FIGS. 2A, 2B and 2C, and FIGS. 3A, 3B and 3C.

Example 3

Next, a radio frequency module according to Example 3 will be described with reference to FIG. 10A and FIG. 10B. The radio frequency module according to the present example is different compared to the radio frequency module according to Example 1 in that the impedance elements Z1 and Z2 and the wiring structure are provided in the wiring substrate. In the following description, the points different from Example 1 or 2 will mainly be described, and the description of points in common will be omitted or simplified.

Figure 10A:
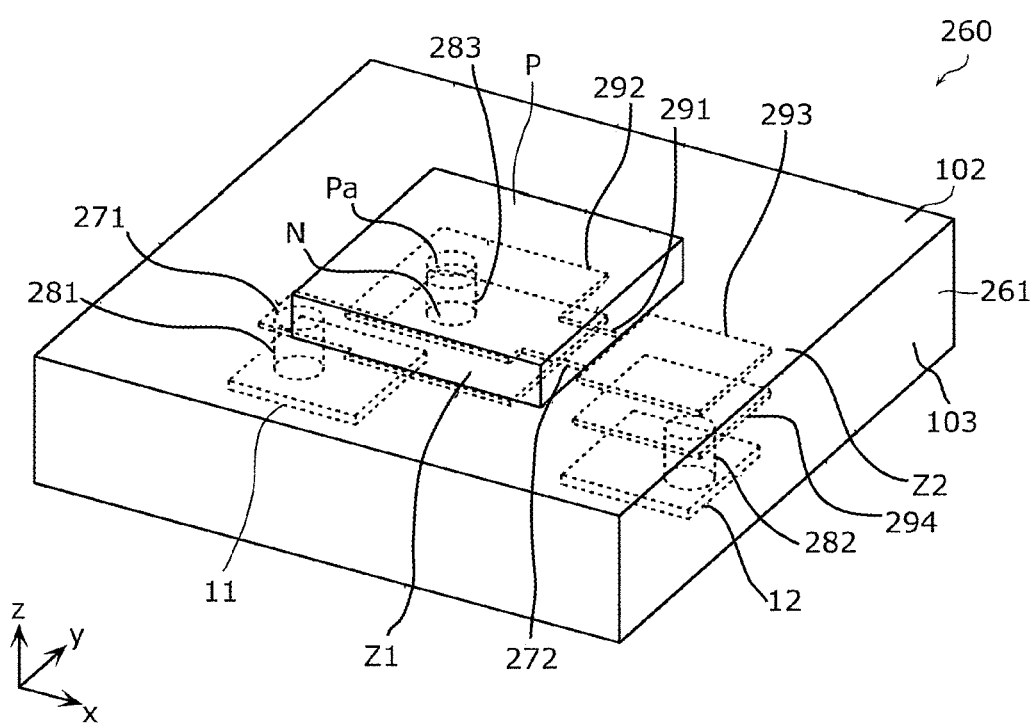
FIG. 10A is a perspective view of a radio frequency module according to Example 3 of Embodiment 2.

FIG. 10A is a perspective view of a radio frequency module 260 according to the present example. FIG. 10B is a three-view drawing of the radio frequency module 260 according to the present example. The portions (a), (b), and (c) of FIG. 10B are a top plan, an elevation, and a right side elevation of the radio frequency module 260, respectively.

Figure 10B:
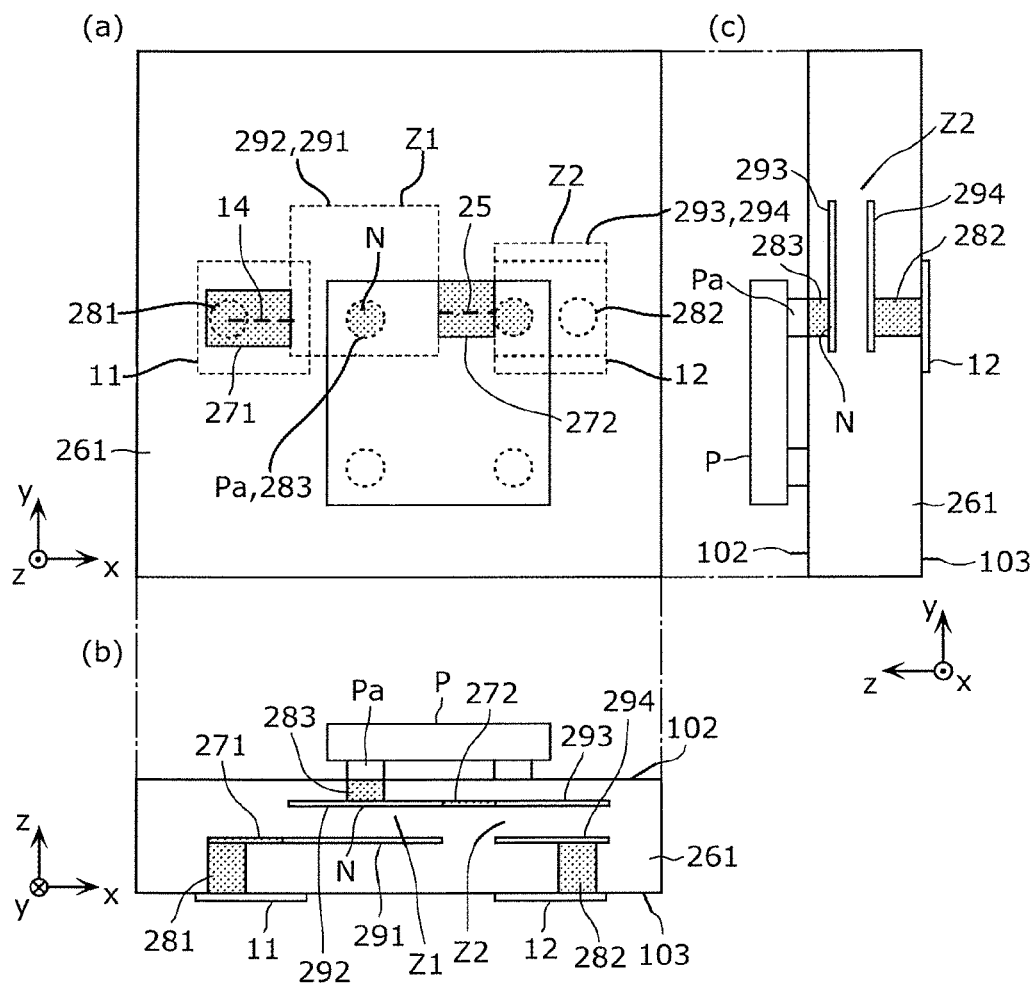
FIG. 10B is a three-view drawing of the radio frequency module according to Example 3 of Embodiment 2.

The radio frequency module 260 includes a wiring substrate 261 as illustrated in FIG. 10A and FIG. 10B.

The wiring substrate 261 is the same as the wiring substrate 201 excluding the following: the number and the shapes of the wiring layers and the vias included in the wiring substrate 261 are different from those of the wiring substrate 201; the impedance elements Z1 and Z2 are provided in the wiring substrate 261. The wiring substrate 261 includes a wiring layer 271, a wiring layer 272, a via 281, a via 282, and a via 283 in the present example as illustrated in FIG. 10A and FIG. 10B.

The impedance element Z1 is a capacitor, and includes an electrode plate 291 and an electrode plate 292 in the present example. The electrode plates 291 and 292 are positioned in the wiring substrate 261. The electrode plates 291 and 292 are disposed to face each other with a predetermined distance, and constitute a so-called parallel plate electrode. When the front surface 102 of the wiring substrate 261 is viewed in plan view, the electrode plate 291 and the electrode plate 292 overlap with each other. The electrode plate 291 and the electrode plate 292 correspond to the terminals Zb1 and Za1 of the impedance element Z1, respectively, and also serve as part of a wiring line.

The impedance element Z2 is a capacitor, and includes an electrode plate 293 and an electrode plate 294. The electrode plate 293 and the electrode plate 294 are positioned in the wiring substrate 261. The electrode plate 293 and the electrode plate 294 are disposed to face each other with a predetermined distance, and constitute a so-called parallel plate electrode. When the front surface 102 of the wiring substrate 261 is viewed in plan view, the electrode plate 293 and the electrode plate 294 overlap with each other. The electrode plate 293 and the electrode plate 294 correspond to the terminals Za2 and Zb2 of the impedance element Z2, respectively, and also serve as part of a wiring line.

The electrode plates 291, 292, 293, and 294 each are conductive pattern electrodes provided in the wiring substrate 261. The electrode plates 291, 292, 293, and 294 are formed such that a metal thin film of silver (Ag) or copper (Cu) or the like is formed while constructing the lamination structure of the wiring substrate 261, and then, the metal thin film is patterned in a predetermined shape, for example.

The electrode plates 291 and 294 are positioned in the same layer in the wiring substrate 261. The electrode plate 291 and the electrode plate 294 are isolated from each other, and are not connected to each other. Note that the electrode plate 291 and the electrode plate 294 may be positioned in different layers.

The electrode plates 292 and 293 are positioned in the same layer in the wiring substrate 261. The electrode plate 292 and the electrode plate 293 are connected to each other by the wiring layer 272. Note that the electrode plates 292 and 293 may be positioned in different layers, and may be connected to each other using a via and a wiring layer.

The wiring layers 271 and 272 are conductive pattern wiring lines provided in the wiring substrate 261. In the present example, the wiring layer 271 is positioned in the same layer as the electrode plate 291 of the impedance element Z1 and the electrode plate 294 of the impedance element Z2. The wiring layer 272 is positioned in the same layer as the electrode plate 292 of the impedance element Z1 and the electrode plate 293 of the impedance element Z2. The wiring layer 271 is formed in the same process as that of the electrode plates 291 and 294, and the wiring layer 272 is formed in the same process as that of the electrode plates 292 and 293, for example. Both of the wiring layers 271 and 272 extend in a direction parallel to the front surface 102, that is, in a direction orthogonal to the thickness direction (z-axis direction) of the wiring substrate 261.

The via 281 and the impedance element Z1 are connected to the wiring layer 271. The wiring layer 271 linearly extends along the x-axis direction from the upper end portion of the via 281 to the electrode plate 291 as illustrated in FIG. 10B. The shape of the wiring layer 271 in top view is rectangular, for example, but is not limited thereto. The wiring layer 271 and the electrode plate 291 are integrally formed.

The impedance element Z1 and the impedance element Z2 are connected to the wiring layer 272. The wiring layer 272 linearly extends along the x-axis direction from the electrode plate 292 to the electrode plate 293 as illustrated in FIG. 10B. The shape of the wiring layer 272 in top view is rectangular, for example, but is not limited thereto. The wiring layer 272, the electrode plate 292, and the electrode plate 293 are integrally formed.

The wiring layer 272 and the electrode plates 292 and 293 are provided at positions closer to the front surface 102 than the back surface 103 in the thickness direction of the wiring substrate 261 as illustrated in (b) and (c) of FIG. 10B. The distance between the front surface 102 and each of the wiring layer 272 and the electrode plates 292 and 293, that is, the length of the via 283, is equal to or less than the distance between the back surface 103 and each of the wiring layer 271 and the electrode plates 291 and 294, that is, the length of the via 281, for example. Alternatively, the wiring layer 272 and the electrode plates 292 and 293 may be provided at positions closer to the back surface 103 than the front surface 102.

The vias 281, 282, and 283 are conductive members extending along the thickness direction of the wiring substrate 261. The vias 281 and 282 are embedded in recesses that are recessed from the back surface 103 toward the front surface 102 of the wiring substrate 261 in the present example. The via 283 is embedded in a recess that is recessed from the front surface 102 toward the back surface 103 of the wiring substrate 261. That is, the vias 281, 282, and 283 do not penetrate through the wiring substrate 261. The vias 281, 282, and 283 are the same as the vias 181, 182, and 183 according to Example 3 of Embodiment 1, for example.

The terminal 11 and the wiring layer 271 are connected to the via 281. The via 281 is provided overlapping with the wiring layer 271 and the terminal 11 in top view.

The terminal 12 and the impedance element Z2 are connected to the via 282. The via 282 is provided overlapping with the electrode plate 294 of the impedance element Z2 and the terminal 12 in top view.

The impedance element Z1 and the parallel arm resonator P are connected to the via 283. The via 283 is provided overlapping with the electrode plate 292 of the impedance element Z1 and the terminal Pa of the parallel arm resonator P in top view. Note that the via 283 may be connected to the wiring layer 272 or the electrode plate 293 of the impedance element Z2 instead of the impedance element Z1.

Here, the correspondence between the wiring structure included in the radio frequency module 260 according to the present example and the wiring line included in the radio frequency filter 20 illustrated in FIG. 7 will be described.

In the present example, the path 13 connecting the terminal 11 and the terminal 12 is constituted of the via 281, the wiring layer 271, the electrode plate 291, the electrode plate 292, the wiring layer 272, the electrode plate 293, the electrode plate 294, and the via 282. The node N is a connection point of the electrode plate 292 and the via 283. The wiring line 14 branched from the path 13 is constituted of the via 283. The wiring length $A_1$ of the wiring line 14 therefore corresponds to the length of the via 283.

The wiring line 16 included in the path 13 is constituted of the via 281 and the wiring layer 271. The wiring length $B_1$ of the wiring line 16 therefore corresponds to the total length of the length of the via 281 and the length of the wiring layer 271.

Further, the wiring line 15 is virtually not provided. Specifically, the node N and the node N side terminal Za1 of the impedance element Z1 are directly connected to each other. The wiring length $A_2$ of the wiring line 15 therefore becomes zero.

Further, the wiring line 25 is constituted of the wiring layer 272. The wiring length $A_3$ of the wiring line 25 therefore corresponds to the length of the wiring layer 272. The wiring line 26 is constituted of the via 282. The wiring length $B_2$ of the wiring line 26 therefore corresponds to the length of the via 282.

Since the wiring length $A_1$ is shorter than the wiring length $B_1$, the length of the via 283 is shorter than the total length of the length of the via 281 and the length of the wiring layer 271 in the present embodiment. The length of the via 283 is shorter than the length of the via 281, for example. The wiring length $A_1$ therefore is shorter than the wiring length $B_1$ by at least the length of the wiring layer 271. Further, since the wiring length $A_1$ is shorter than the wiring length $B_2$, the length of the via 283 is shorter than the length of the via 282.

With the above configuration, the wiring length $A_1$ between the node N and the parallel arm resonator P becomes shorter than the wiring length $B_1$ between the terminal 11 and the impedance element Z1 in the radio frequency module 260 according to the present example. Further, the wiring length $A_1$ becomes shorter than the wiring length $B_2$ between the terminal 12 and the impedance element Z2. Accordingly, the deterioration of the filter characteristic is suppressed as described with reference to FIGS. 2A, 2B and 2C, and FIGS. 3A, 3B and 3C.

Note that the length of the via 283 may be longer than the length of the via 281 as long as the wiring length $A_1$ is shorter than the wiring length $B_1$. That is, the impedance element Z1 may be provided at a position closer to the back surface 103 than the front surface 102 of the wiring substrate 261.

Conclusion

As described above, the radio frequency module according to the present embodiment further includes the second impedance element disposed in series on the path. The node is positioned between the first impedance element and the second impedance element.

Accordingly, including a plurality of impedance elements may realize radio frequency filters having various pass band characteristics. For example, a high pass filter, a low pass filter, a band pass filter, a notch filter, or the like may easily be realized as a radio frequency filter.

Further, the wiring length between the node and the acoustic wave resonator is shorter than the wiring length between the second impedance element and the terminal out of the input terminal and the output terminal having a shorter wiring length to the second impedance element, for example.

This makes it possible to further suppress the unnecessary inductive component and the unnecessary capacitive component, and therefore, the deterioration of the filter characteristic may further be suppressed.

Embodiment 3

Subsequently, a radio frequency module according to Embodiment 3 will be described.

The radio frequency module according to the present embodiment is different compared to the radio frequency module according to Embodiment 2 in that a multiplexer including a plurality of radio frequency filters is provided. At least one of the plurality of radio frequency filters is the radio frequency filter 10 according to Embodiment 1 or the radio frequency filter 20 according to Embodiment 2. Hereinafter, the points different from Embodiment 2 will mainly be described, and the description of points in common will be omitted or simplified.

Figure 11:
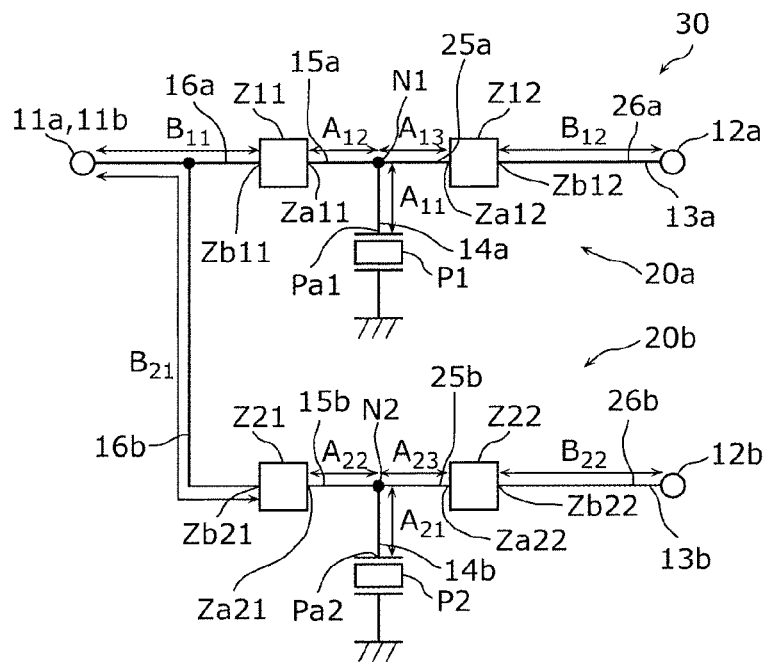
FIG. 11 is a circuit configuration diagram of a multiplexer provided in a radio frequency module according to Embodiment 3.

FIG. 11 is a circuit configuration diagram of a multiplexer 30 provided in the radio frequency module according to the present embodiment. The multiplexer 30 is a diplexer including a radio frequency filter 20a and a radio frequency filter 20b as illustrated in FIG. 11.

The radio frequency filter 20a is an example of a first filter included in a plurality of filters provided in the multiplexer 30. In the present embodiment, the radio frequency filter 20a has the same configuration as that of the radio frequency filter 20 according to Embodiment 2.

Specifically, the radio frequency filter 20a includes a terminal 11a, a terminal 12a, an impedance element Z11, an impedance element Z12, and a parallel arm resonator P1. The terminal 11a, the terminal 12a, the impedance element Z11, the impedance element Z12, and the parallel arm resonator P1 correspond to the terminal 11, the terminal 12, the impedance element Z1, the impedance element Z2, and the parallel arm resonator P of the radio frequency filter 20 according to Embodiment 2, respectively. A path 13a, wiring lines 14a, 15a, 16a, 25a, and 26a, and a node N1 correspond to the path 13, the wiring lines 14, 15, 16, 25, and 26, and the node N, respectively. Wiring lengths $A_{11}$, $A_{12}$, $A_{13}$, $B_{11}$, and $B_{12}$ correspond to the wiring lengths $A_1$, $A_2$, $A_3$, $B_1$, and $B_2$ of the radio frequency filter 20 according to Embodiment 2.

The wiring length $A_{11}$ therefore is shorter than each of the wiring lengths $B_{11}$ and $B_{12}$. Further, the sum of the wiring length $A_{11}$ and the wiring length $A_{12}$ is shorter than the wiring length $B_{11}$. The sum of the wiring length $A_{11}$ and the wiring length $A_{13}$ is shorter than the wiring length $B_{12}$. Accordingly, the generation of an unnecessary inductive component connected in series to the parallel arm resonator P1 and an unnecessary capacitive component connected in parallel to the parallel arm resonator P1 is suppressed, and therefore, the deterioration of filter characteristic of the radio frequency filter 20a may be suppressed.

The radio frequency filter 20b is an example of a second filter included in the plurality of filters included in the multiplexer 30. In the present embodiment, the radio frequency filter 20b has the same configuration as that of the radio frequency filter 20 according to Embodiment 2.

Specifically, the radio frequency filter 20b includes a terminal 11b, a terminal 12b, an impedance element Z21, an impedance element Z22, and a parallel arm resonator P2. The terminal 11b, the terminal 12b, the impedance element Z21, the impedance element Z22, and the parallel arm resonator P2 correspond to the terminal 11, the terminal 12, the impedance element Z1, the impedance element Z2, and the parallel arm resonator P of the radio frequency filter 20 according to Embodiment 2, respectively. A path 13b, wiring lines 14b, 15b, 16b, 25b and 26b, and a node N2 correspond to the path 13, the wiring lines 14, 15, 16, 25, and 26, and the node N, respectively. The wiring lengths $A_{21}$, $A_{22}$, $A_{23}$, $B_{21}$, and $B_{22}$ correspond to the wiring lengths $A_1$, $A_2$, $A_3$, $B_1$, and $B_2$ of the radio frequency filter 20 according to Embodiment 2.

The wiring length $A_{21}$ therefore is shorter than each of the wiring lengths $B_{21}$ and $B_{22}$. Further, the sum of the wiring length $A_{21}$ and the wiring length $A_{22}$ is shorter than the wiring length $B_{21}$. The sum of the wiring length $A_{21}$ and the wiring length $A_{23}$ is shorter than the wiring length $B_{22}$. Accordingly, the generation of an unnecessary inductive component connected in series to the parallel arm resonator P2 and an unnecessary capacitive component connected in parallel to the parallel arm resonator P2 is suppressed, and therefore, the deterioration of filter characteristic of the radio frequency filter 20b may be suppressed.

In the present embodiment, the terminal 11a included in the radio frequency filter 20a and the terminal 11b included in the radio frequency filter 20b are commonly connected to each other. That is, the radio frequency filter 20a and the radio frequency filter 20b share the input terminal. Note that the term "commonly connected" means that terminals of the two filters are not only directly connected to each other, but also indirectly connected to each other through another impedance element such as an inductor or a capacitor. Here, the terminals 11a and 11b constitute the common terminal.

With the above configuration, it is possible to realize a radio frequency module provided with the multiplexer 30 including the filter in which the deterioration of the filter characteristic is suppressed.

Hereinafter, a specific example of a radio frequency module provided with the multiplexer 30 according to the present embodiment will be described. Note that the arrangements and shapes of elements, wiring substrates, wiring layers, and vias in the respective examples are merely examples, and are not limited to the described examples.

Example 1

First, a radio frequency module according to Example 1 will be described with reference to FIG. 12A and FIG. 12B. In the following description, the points different from the Example 1 to Example 3 of Embodiment 2 will mainly be described, and the description of points in common will be omitted or simplified.

Figure 12A:
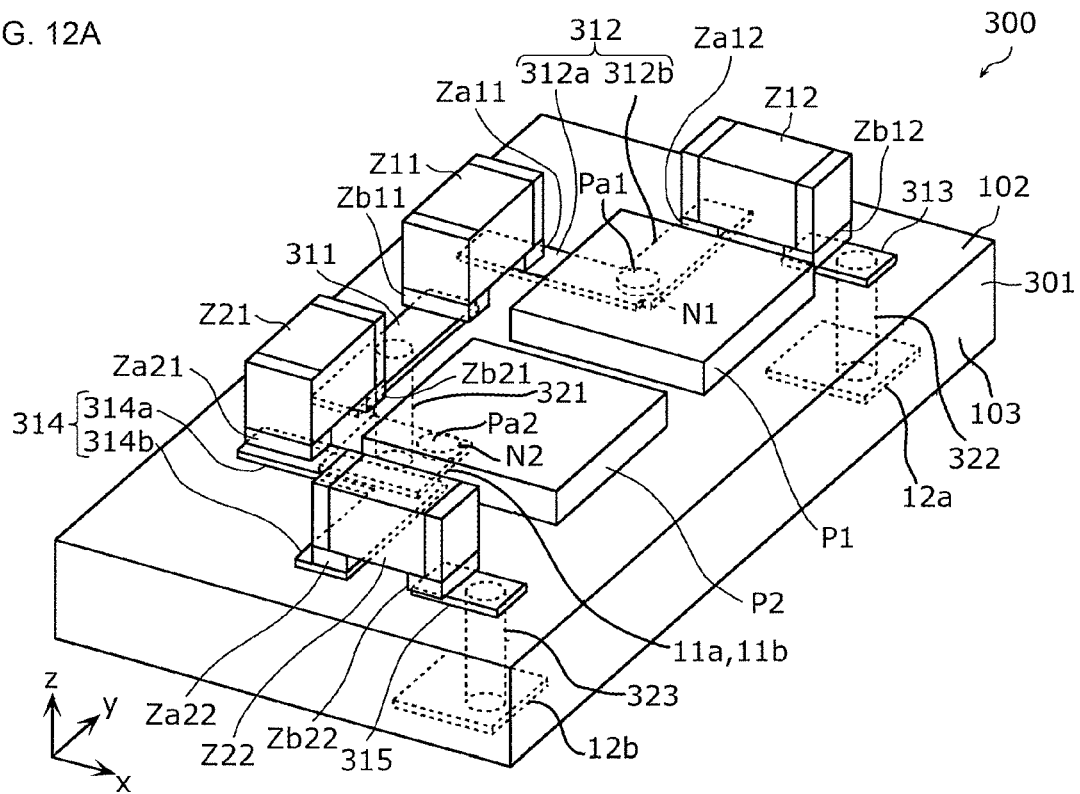
FIG. 12A is a perspective view of a radio frequency module according to Example 1 of Embodiment 3.

FIG. 12A is a perspective view of a radio frequency module 300 according to the present example. FIG. 12B is a three-view drawing of the radio frequency module 300 according to the present example. The portions (a), (b), and (c) of FIG. 12B are a top plan, an elevation, and a right side elevation of the radio frequency module 300, respectively.

Figure 12B:
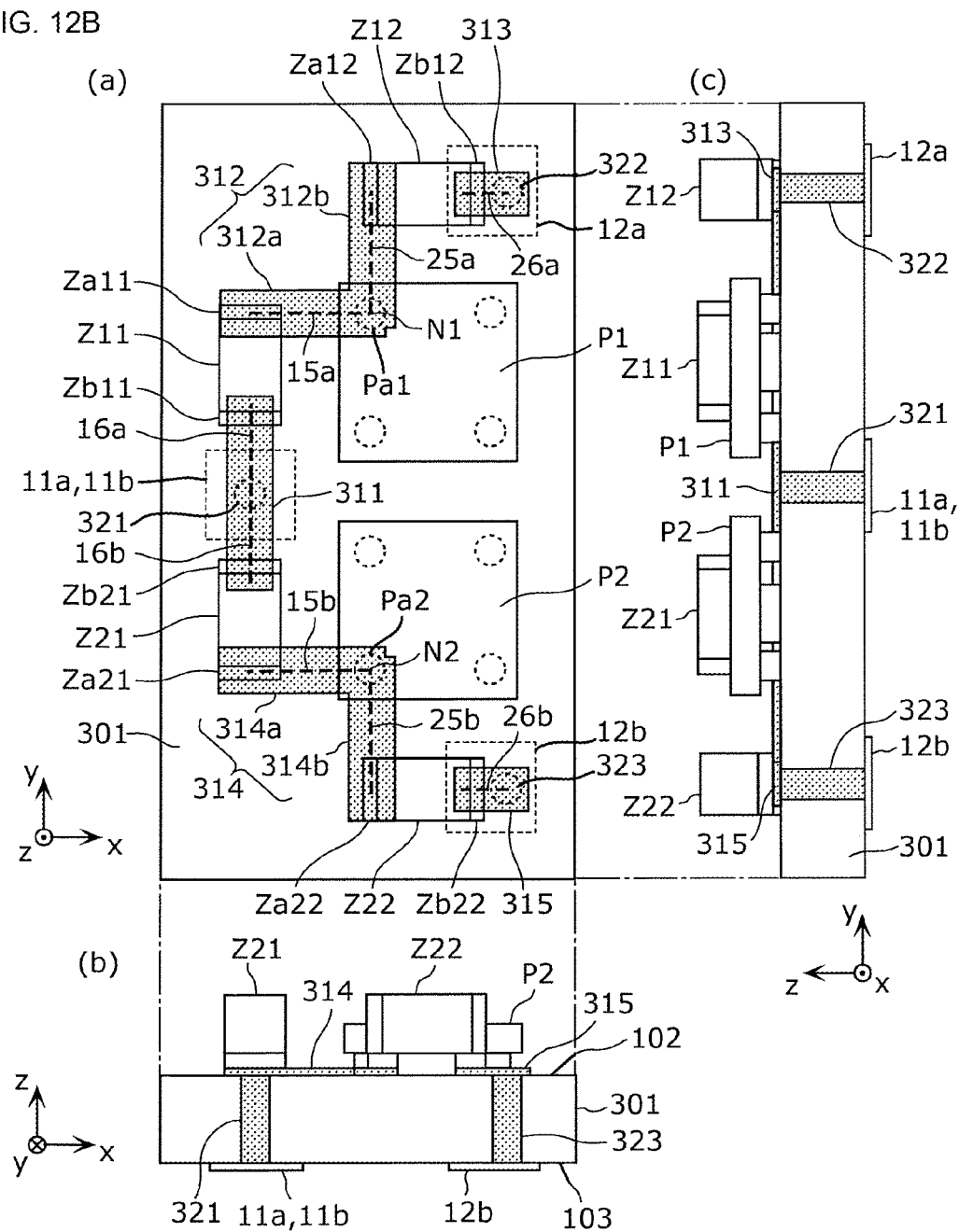
FIG. 12B is a three-view drawing of the radio frequency module according to Example 1 of Embodiment 3.

The radio frequency module 300 includes a wiring substrate 301 as illustrated in FIG. 12A and FIG. 12B.

The wiring substrate 301 is the same as the wiring substrate 201 according to Example 1 of Embodiment 2 except that the number and shapes of the wiring layers and the vias included in the wiring substrate 301 are different from those of the wiring substrate 201. The impedance element Z11, the impedance element Z12, the impedance element Z21, the impedance element Z22, the parallel arm resonators P1 and P2 are provided on the front surface 102 of the wiring substrate 301.

The wiring substrate 301 includes a wiring layer 311, a wiring layer 312, a wiring layer 313, a wiring layer 314, a wiring layer 315, a via 321, a via 322, and a via 323 in the present example as illustrated in FIG. 12A and FIG. 12B.

The wiring layers 311, 312, 313, 314, and 315 each are conductive pattern wiring lines provided on the front surface 102 of the wiring substrate 301. The wiring layers 311, 312, 313, 314, and 315 are formed such that a metal thin film of silver (Ag) or copper (Cu) or the like is formed on the front surface 102, and then, the metal thin film is patterned in a predetermined shape, for example. All of the wiring layers 311, 312, 313, 314, and 315 extend in a direction parallel to the front surface 102, that is, in a direction orthogonal to the thickness direction (z-axis direction) of the wiring substrate 301. The widths and the film thicknesses of the wiring layers 311, 312, 313, 314, and 315 are the same as each other, for example, but may be different from each other.

The via 321, the impedance element Z11, and the impedance element Z21 are connected to the wiring layer 311. The wiring layer 311 linearly extends along the y-axis direction from the upper end portion of the via 321 to both a terminal Zb11 of the impedance element Z11 and a terminal Zb21 of the impedance element Z21 as illustrated in FIG. 12A and (a) of FIG. 12B. The shape of the wiring layer 311 in top view is rectangular, for example, but is not limited thereto.

The impedance element Z11, the parallel arm resonator P1, and the impedance element Z12 are connected to the wiring layer 312. The wiring layer 312 includes a first wiring portion 312a and a second wiring portion 312b as illustrated in FIG. 12A and (a) of FIG. 12B. The connection portion of the first wiring portion 312a and the second wiring portion 312b is a bending point of the wiring layer 312, and corresponds to the node N1.

The impedance element Z11 and the parallel arm resonator P1 are connected to the first wiring portion 312a. The first wiring portion 312a linearly extends along the x-axis direction from a terminal Za11 of the impedance element Z11 to a terminal Pa1 of the parallel arm resonator P1.

The impedance element Z12 and the parallel arm resonator P1 are connected to the second wiring portion 312b. The second wiring portion 312b linearly extends along the y-axis direction from a terminal Za12 of the impedance element Z12 to the terminal Pa1 of the parallel arm resonator P1.

The first wiring portion 312a and the second wiring portion 312b are vertically connected to each other in top view in the present example. That is, the shape of the wiring layer 312 in top view is an L-shape, for example. The shape of the wiring layer 312 in top view may be a V-shape or a linear shape, for example.

The impedance element Z12 and the via 322 are connected to the wiring layer 313. The wiring layer 313 linearly extends along the x-axis direction from a terminal Zb12 of the impedance element Z12 to the upper end portion of the via 322.

The impedance element Z21, the parallel arm resonator P2, and the impedance element Z22 are connected to the wiring layer 314. The wiring layer 314 includes a first wiring portion 314a and a second wiring portion 314b as illustrated in FIG. 12A and (a) of FIG. 12B. The connection portion of the first wiring portion 314a and the second wiring portion 314b is a branch point of the wiring layer 314, and corresponds to the node N2.

The impedance element Z21 and the parallel arm resonator P2 are connected to the first wiring portion 314a. The first wiring portion 314a linearly extends along the x-axis direction from a terminal Za21 of the impedance element Z21 to a terminal Pa2 of the parallel arm resonator P2.

The impedance element Z22 and the parallel arm resonator P2 are connected to the second wiring portion 314b. The second wiring portion 314b extends linearly along the y-axis direction from a terminal Za22 of the impedance element Z22 to the terminal Pa2 of the parallel arm resonator P2.

The impedance element Z22 and the via 323 are connected to the wiring layer 315. The wiring layer 315 linearly extends along the x-axis direction from a terminal Zb22 of the impedance element Z22 to the upper end portion of the via 323.

The wiring layers 313 and 315 may not be provided. The via 322 may be positioned in a direction directly below the terminal Zb12 of the impedance element Z12, and may be directly connected to the terminal Zb12, for example. Similarly, the via 323 may be positioned in a direction directly below the terminal Zb22 of the impedance element Z22, and may be directly connected to the terminal Zb22.

The vias 321, 322, and 323 are conductive members extending along the thickness direction of the wiring substrate 301. In the present example, the vias 321, 322, and 323 penetrate through the wiring substrate 301 from the front surface 102 to the back surface 103. The vias 321, 322, and 323 are the same as the via 121 of Embodiment 1 in the method of forming, the shape, the size, and the like.

The terminal 11a (that is, terminal 11b) and the wiring layer 311 are connected to the via 321. The via 321 is provided overlapping with both the wiring layer 311 and the terminal 11a in top view.

The terminal 12a and the wiring layer 313 are connected to the via 322. The via 322 is provided overlapping with both the wiring layer 313 and the terminal 12a in top view.

The terminal 12b and the wiring layer 315 are connected to the via 323. The via 323 is provided overlapping with both the wiring layer 315 and the terminal 12b in top view.

The elements, terminals, wiring layers, and vias included in the radio frequency module 300 are arranged in line symmetry as illustrated in (a) of FIG. 12B in the present example. The axis of the line symmetry passes through the center of the via 321 and is an axis parallel to the x-axis direction. Accordingly, the wiring lines and the elements included in the radio frequency filter 20a and the wiring lines and the elements included in the radio frequency filter 20b can be arranged apart from each other, and therefore, the coupling between the wiring lines or the elements or the like of the radio frequency filter 20a and the radio frequency filter 20b may be suppressed.

Here, the correspondence between the wiring structure included in the radio frequency module 300 according to the present example and the wiring line included in the multiplexer 30 illustrated in FIG. 11 will be described.

The path 13a connecting the terminal 11a (terminal 11b) being the common terminal and the terminal 12a is constituted of the via 321, part of the wiring layer 311, the wiring layer 312, the wiring layer 313, and the via 322 in the present example. The path 13a includes the wiring line 16a, the wiring line 15a, the node N1, the wiring line 25a, and the wiring line 26a as illustrated in FIG. 11. The node N1 is a bending point of the wiring layer 312, and corresponds to the connection portion of the first wiring portion 312a and the second wiring portion 312b. Further, the wiring line 14a branched from the path 13a at the node N1 is virtually not provided. Specifically, the parallel arm resonator P1 is directly connected to the node N1. More specifically, the terminal Pa1 of the parallel arm resonator P1 is directly connected to the node N1. The wiring length $A_{11}$ of the wiring line 14a therefore becomes zero.

The wiring line 16a included in the path 13a is constituted of the via 321 and part of the wiring layer 311. Specifically, the part of the wiring layer 311 constituting the wiring line 16a is the portion extending from the connection portion of the wiring layer 311 and the via 321 to the connection portion of the wiring layer 311 and the terminal Zb11 of the impedance element Z11. The wiring length $B_{11}$ of the wiring line 16a therefore corresponds to the total length of the length of the via 321 and the length of the part of the wiring layer 311.

Further, the wiring line 15a is constituted of the first wiring portion 312a of the wiring layer 312. The wiring length $A_{12}$ of the wiring line 15a therefore corresponds to the length of the first wiring portion 312a. The wiring line 25a is constituted of the second wiring portion 312b of the wiring layer 312. The wiring length $A_{13}$ of the wiring line 25a therefore corresponds to the length of the second wiring portion 312b. Further, the wiring line 26a is constituted of the wiring layer 313 and the via 322. The wiring length $B_{12}$ of the wiring line 26a therefore corresponds to the total length of the length of the wiring layer 313 and the length of the via 322.

Since the wiring length $A_{11}$ is zero, the wiring length $A_{11}$ is shorter than each of the wiring length $B_{11}$ and the wiring length $B_{12}$ in the present example. Further, the sum of the wiring length $A_{11}$ and the wiring length $A_{12}$ is equal to the wiring length $A_{12}$, and is shorter than the wiring length $B_{11}$. The length of the first wiring portion 312a is shorter than the total length of the length of the via 321 and the length of the wiring layer 311, for example.

Further, the length of the first wiring portion 312a and the length of the second wiring portion 312b are equal to each other in the present example. With this, the wiring length $A_{12}$ and the wiring length $A_{13}$ become equal to each other. Further, the sum of the wiring length $A_{11}$ and the wiring length $A_{13}$ is equal to the wiring length $A_{13}$, and is shorter than the wiring length $B_{12}$. For example, the length of the second wiring portion 312b is shorter than the total length of the length of the wiring layer 313 and the length of the via 322.

Similarly, the path 13b connecting the terminal 11b (terminal 11a) being the common terminal and the terminal 12b is constituted of the via 321, part of the wiring layer 311, the wiring layer 314, the wiring layer 315, and the via 323. The path 13b includes the wiring line 16b, the wiring line 15b, the node N2, the wiring line 25b, and the wiring line 26b as illustrated in FIG. 11. The node N2 is a bending point of the wiring layer 314, and corresponds to the connection portion of the first wiring portion 314a and the second wiring portion 314b. Also, the wiring line 14b branched from the path 13b at the node N2 is virtually not provided. Specifically, the parallel arm resonator P2 is directly connected to the node N2. More specifically, the terminal Pa2 of the parallel arm resonator P2 is directly connected to the node N2. The wiring length $A_{21}$ of the wiring line 14b therefore becomes zero.

The wiring line 16b included in the path 13b is constituted of the via 321 and part of the wiring layer 311. Specifically, the part of the wiring layer 311 constituting the wiring line 16b is the portion extending from the connection portion of the wiring layer 311 and the via 321 to the connection portion of the wiring layer 311 and the terminal Zb21 of the impedance element Z21. The wiring length $B_{21}$ of the wiring line 16b therefore corresponds to the total length of the length of the via 321 and the length of the part of the wiring layer 311.

Further, the wiring line 15b is constituted of the first wiring portion 314a of the wiring layer 314. The wiring length $A_{22}$ of the wiring line 15b therefore corresponds to the length of the first wiring portion 314a. The wiring line 25b is constituted of the second wiring portion 314b of the wiring layer 314. The wiring length $A_{23}$ of the wiring line 25b therefore corresponds to the length of the second wiring portion 314b. Further, the wiring line 26b is constituted of the wiring layer 315 and the via 323. The wiring length $B_{22}$ of the wiring line 26b therefore corresponds to the total length of the length of the wiring layer 315 and the length of the via 323.

In the present example, the respective wiring layers and the respective vias have symmetrical shapes and are symmetrically arranged with a line being the symmetrical axis, where the line passes through the terminal 11a (that is, terminal 11b) being the common input terminal and the via 321. The wiring lengths $A_{21}$, $A_{22}$, $A_{23}$, $B_{21}$, and $B_{22}$ therefore are equal to the wiring lengths $A_{11}$, $A_{12}$, $A_{13}$, $B_{11}$, and $B_{12}$, respectively.

With the above configuration, the wiring length $A_{11}$ between the node N1 and the parallel arm resonator P1 of the radio frequency filter 20a is shorter than the wiring length $B_{11}$ between the terminal 11a and the impedance element Z11 in the radio frequency module 300 according to the present example. Further, the wiring length $A_{11}$ becomes shorter than the wiring length $B_{12}$ between the terminal 12a and the impedance element Z12. Accordingly, the deterioration of the filter characteristic of the radio frequency filter 20a is suppressed as described with reference to FIGS. 2A, 2B and 2C, and FIGS. 3A, 3B and 3C. Similarly, the deterioration of the filter characteristic of the radio frequency filter 20b is also suppressed. Thus, it is possible to realize the radio frequency module 300 provided with the multiplexer including the radio frequency filters 20a and 20b in which the deterioration of the filter characteristic is suppressed.

Example 2

Next, a radio frequency module according to Example 2 will be described with reference to FIG. 13A and FIG. 13B. The radio frequency module according to the present example is different compared to the radio frequency module according to Example 1 in that the impedance elements Z11, Z12, Z21, and Z22, and the wiring structure are provided in the wiring substrate. In the following description, the points different from Example 1 will mainly be described, and the description of points in common will be omitted or simplified.

Figure 13A:
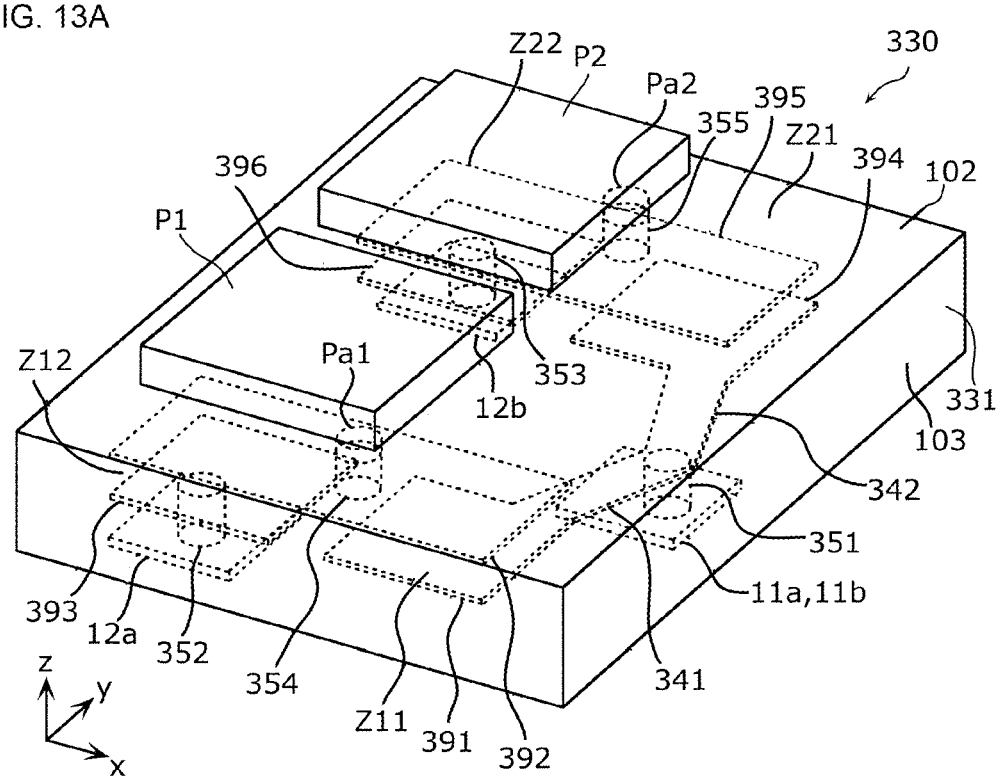
FIG. 13A is a perspective view of a radio frequency module according to Example 2 of Embodiment 3.

FIG. 13A is a perspective view of a radio frequency module 330 according to the present example. FIG. 13B is a three-view drawing of the radio frequency module 330 according to the present example. The portions (a), (b), and (c) of FIG. 13B are a top plan, an elevation, and a right side elevation of the radio frequency module 330, respectively.

Figure 13B:
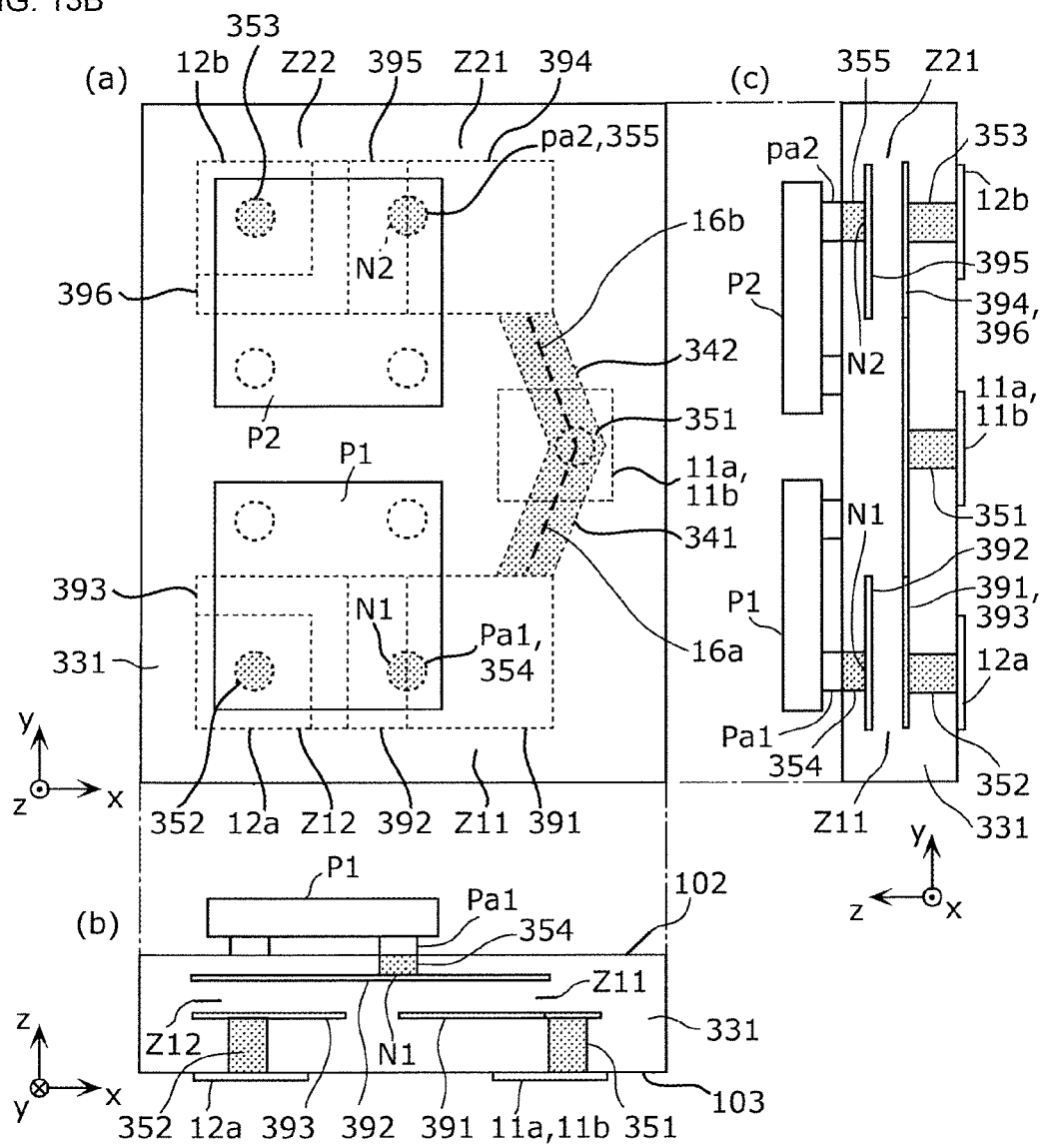
FIG. 13B is a three-view drawing of the radio frequency module according to Example 2 of Embodiment 3.

The radio frequency module 330 includes a wiring substrate 331 as illustrated in FIG. 13A and FIG. 13B.

The wiring substrate 331 is the same as the wiring substrate 301 excluding the following: the number and the shapes of the wiring layers and the vias included in the wiring substrate 331 are different from those of the wiring substrate 301; the impedance elements Z11, Z12, Z21, and Z22 are provided in the wiring substrate 331. The wiring substrate 331 includes a wiring layer 341, a wiring layer 342, a via 351, a via 352, a via 353, a via 354, and a via 355 in the present example as illustrated in FIG. 13A and FIG. 13B.

The impedance elements Z11, Z12, Z21, and Z22 are all capacitors in the present example. The impedance element Z11 includes an electrode plate 391 and an electrode plate

392. The impedance element Z12 includes the electrode plate 392 and an electrode plate 393.

The impedance element Z11 and the impedance element Z12 share the electrode plate 392. The impedance element Z11 is formed of the electrode plate 391 and the portion of the electrode plate 392 overlapping with the electrode plate 391 in top view. Further, the impedance element Z12 is constituted of the electrode plate 393 and the portion of the electrode plate 392 overlapping with the electrode plate 393. The electrode plate 392 and each of the electrode plates 391 and 393 are disposed so as to face each other with a predetermined distance therebetween, for example. The electrode plates 391 and 393 are positioned in the same layer in the wiring substrate 331, for example. The electrode plate 391 and the electrode plate 393 are isolated from each other, and are not connected to each other. Note that the electrode plate 391 and the electrode plate 393 may be positioned in different layers.

The electrode plate 391 and the electrode plate 392 correspond to the terminals Zb11 and Za11 of the impedance element Z11, respectively, and also serve as part of a wiring line. The electrode plate 392 and the electrode plate 393 correspond to the terminals Za12 and Zb12 of the impedance element Z12, respectively, and also serve as a part of a wiring line.

The impedance element Z21 includes an electrode plate 394 and an electrode plate 395. The impedance element Z22 includes the electrode plate 395 and an electrode plate 396.

The impedance element Z21 and the impedance element Z22 share the electrode plate 395. The impedance element Z21 is formed of the electrode plate 394 and the portion of the electrode plate 395 overlapping with the electrode plate 394 in top view. Further, the impedance element Z22 is formed of the electrode plate 396 and the portion of the electrode plate 395 overlapping with the electrode plate 396. The electrode plate 395 and each of the electrode plates 394 and 396 are disposed so as to face each other with a predetermined distance therebetween, for example. The electrode plates 394 and 396 are positioned in the same layer in the wiring substrate 331, for example. The electrode plate 394 and the electrode plate 396 are isolated from each other, and are not connected to each other. Note that the electrode plate 394 and the electrode plate 396 may be positioned in different layers.

The electrode plates 394 and 395 correspond to the terminals Zb21 and Za21 of the impedance element Z21, respectively, and also serve as part of a wiring line. The electrode plates 395 and 396 correspond to the terminals Za22 and Zb22 of the impedance element Z22, respectively, and also serve as part of a wiring line.

Note that the portion of the electrode plate 392 not overlapping with any of the electrode plates 391 and 393 may be shorter than the width of each of the electrode plates 391 and 393, and may have the same width as that of the wiring layer 341, for example. The portion of the electrode plate 395 not overlapping with any of the electrode plates 394 and 396 may be shorter than the width of each of the electrode plates 394 and 396, and may have the same width as that of the wiring layer 342, for example.

The electrode plates 392 and 395 are provided at positions closer to the front surface 102 than the back surface 103 in the thickness direction of the wiring substrate 331 in the present example. The distance between the front surface 102 and each of the electrode plates 392 and 395, that is, the length of each of the vias 354 and 355 is shorter than the distance between the back surface 103 and each of the electrode plates 391, 393, 394, and 396, that is, the length of each of the vias 351, 352, and 353, for example. Alternatively, the electrode plates 392 and 395 may be provided at positions closer to the back surface 103 than the front surface 102 in the thickness direction of the wiring substrate 331.

The wiring layers 341 and 342 each are conductive pattern wiring lines provided in the wiring substrate 331. The wiring layers 341 and 342 are formed such that a metal thin film of silver (Ag) or copper (Cu) or the like is formed while constructing the lamination structure of the wiring substrate 331, and then, the metal thin film is patterned in a predetermined shape, for example.

The via 351 and the impedance element Z11 are connected to the wiring layer 341. The wiring layer 341 linearly extends from the upper end portion of the via 351 to the electrode plate 391 of the impedance element Z11 as illustrated in FIG. 13A and (a) of FIG. 13B. The shape of the wiring layer 341 in top view is a parallelogram, for example, but is not limited thereto.

The via 351 and the impedance element Z21 are connected to the wiring layer 342. The wiring layer 342 linearly extends from the upper end portion of the via 351 to the electrode plate 394 of the impedance element Z21 as illustrated in FIG. 13A and (a) of FIG. 13B. The shape of the wiring layer 342 in top view is a parallelogram, for example, but is not limited thereto.

The vias 351, 352, 353, and 354, and the via 355 are conductive members extending along the thickness direction of the wiring substrate 331. The vias 351, 352, and 353 are embedded in recesses that are recessed from the back surface 103 toward the front surface 102 of the wiring substrate 331 in the present example. The vias 354 and 355 are embedded in recesses that are recessed from the front surface 102 toward the back surface 103 of the wiring substrate 331. That is, the vias 351, 352, 353, 354, and 355 do not penetrate through the wiring substrate 331. The vias 351, 352, and 353 are the same as the via 181 according to Example 3 of Embodiment 1 in the method of forming, the shape, the size, and the like, for example. The vias 354 and 355 are the same as the via 183 according to Example 3 of Embodiment 1 in the method of forming, the shape, the size, and the like, for example.

The terminal 11$a$ (terminal 11$b$) and the wiring layers 341 and 342 are connected to the via 351. The via 351 is provided overlapping with both the wiring layers 341 and 342 and the terminal 11$a$ in top view.

The terminal 12$a$ and the electrode plate 393 are connected to the via 352. The via 352 is provided overlapping with both the electrode plate 393 and the terminal 12$a$ in top view.

The terminal 12$b$ and the electrode plate 396 are connected to the via 353. The via 353 is provided overlapping with both the electrode plate 396 and the terminal 12$b$ in top view.

The elements, terminals, wiring layers, and vias included in the radio frequency module 330 are arranged in line symmetry as illustrated in (a) of FIG. 13B in the present example. The axis of the line symmetry passes through the center of the via 351 and is an axis parallel to the x-axis direction. Accordingly, the coupling such as between the wiring lines or the elements in the radio frequency filter 20$a$ and the radio frequency filter 20$b$ may be suppressed.

Here, the correspondence between the wiring structure included in the radio frequency module 330 according to the present example and the wiring line included in the multiplexer 30 illustrated in FIG. 11 will be described.

The path 13a connecting the terminal 11a (terminal 11b) being the common terminal and the terminal 12a is constituted of the via 351, the wiring layer 341, the electrode plate 391, the electrode plate 392, the electrode plate 393, and the via 352 in the present example. The node N1 corresponds to the connection portion of the electrode plate 392 and the via 354. Further, the wiring line 14a branched from the path 13a at the node N1 is constituted of the via 354. The wiring length $A_{11}$ of the wiring line 14a therefore corresponds to the length of the via 354.

The wiring line 16a included in the path 13a is constituted of the via 351 and the wiring layer 341. The wiring length $B_{11}$ of the wiring line 16a therefore corresponds to the total length of the length of the via 351 and the length of the wiring layer 341.

Further, the wiring lines 15a and 25a are virtually not provided. Specifically, the terminal Za11 of the impedance element Z11 and the terminal Za12 of the impedance element Z12 are integrally configured as the electrode plate 392. The wiring length $A_{12}$ of the wiring line 15a and the wiring length $A_{13}$ of the wiring line 25a therefore are zero. Further, the wiring line 26a is constituted of the via 352. The wiring length $B_{12}$ of the wiring line 26a therefore corresponds to the length of the via 352.

Since the wiring length $A_{11}$ is shorter than the wiring length $B_{11}$, the length of the via 354 is shorter than the total length of the length of the via 351 and the length of the wiring layer 341 in the present example. For example, since the length of the via 354 is shorter than the length of the via 351, the wiring length $A_{11}$ becomes shorter than the wiring length $B_{11}$ by at least the length of the wiring layer 341.

The sum of the wiring length $A_{11}$ and the wiring length $A_{12}$ is equal to the wiring length $A_{11}$, and is shorter than the wiring length $B_{11}$. Further, since the wiring length $A_{11}$ is shorter than the wiring length $B_{12}$, the length of the via 354 becomes shorter than the length of the via 352. The sum of the wiring length $A_{11}$ and the wiring length $A_{13}$ is equal to the wiring length $A_{11}$, and is shorter than the wiring length $B_{12}$.

Similarly, the path 13b connecting the terminal 11b (terminal 11a) being the common terminal and the terminal 12b is constituted of the via 351, the wiring layer 342, the electrode plate 394, the electrode plate 395, the electrode plate 396, and the via 353. The node N2 corresponds to the connection portion of the electrode plate 395 and the via 355. Further, the wiring line 14b branched from the path 13b at the node N2 is constituted of the via 355. The wiring length $A_{21}$ of the wiring line 14b therefore corresponds to the length of the via 355.

The wiring line 16b included in the path 13b is constituted of the via 351 and the wiring layer 342. The wiring length $B_{21}$ of the wiring line 16b therefore corresponds to the total length of the length of the via 351 and the length of the wiring layer 342.

Further, the wiring lines 15b and 25b are not virtually provided. Specifically, the terminal Za21 of the impedance element Z21 and the terminal Za22 of the impedance element Z22 are integrally configured as the electrode plate 395. The wiring length $A_{22}$ of the wiring line 15b and the wiring length $A_{23}$ of the wiring line 25b therefore are zero. Further, the wiring line 26b is constituted of the via 353. The wiring length $B_{22}$ of the wiring line 26b therefore corresponds to the length of the via 353.

Since the wiring length $A_{21}$ is shorter than the wiring length $B_{21}$, the length of the via 355 is shorter than the total length of the length of the via 351 and the length of the wiring layer 342 in the present example. For example, since the length of the via 355 is shorter than the length of the via 351, the wiring length $A_{21}$ becomes shorter than the wiring length $B_{21}$ by at least the length of the wiring layer 342.

In the present example, the respective wiring layers and the respective vias have symmetrical shapes and are symmetrically arranged with a line being the symmetrical axis, where the line passes through the terminal 11a (terminal 11b) being the common input terminal and the via 351. The wiring lengths $A_{21}$, $A_{22}$, $A_{23}$, $B_{21}$, and $B_{22}$ therefore are equal to the wiring lengths $A_{11}$, $A_{12}$, $A_{13}$, $B_{11}$, and $B_{12}$, respectively.

With the above configuration, the wiring length $A_{11}$ between the node N1 and the parallel arm resonator P1 of the radio frequency filter 20a is shorter than the wiring length $B_{11}$ between the terminal 11a and the impedance element Z11 in the radio frequency module 330 according to the present example. Further, the wiring length $A_{11}$ becomes shorter than the wiring length $B_{12}$ between the terminal 12a and the impedance element Z12. Accordingly, the deterioration of the filter characteristic of the radio frequency filter 20a is suppressed as described with reference to FIGS. 2A, 2B and 2C, and FIGS. 3A, 3B and 3C. Similarly, the deterioration of the filter characteristic of the radio frequency filter 20b is also suppressed. Thus, it is possible to realize the radio frequency module 330 provided with the multiplexer including the radio frequency filters 20a and 20b in which the deterioration of the filter characteristic is suppressed.

Conclusion

As described above, the radio frequency module according to the present embodiment includes a multiplexer having a plurality of filters including the first filter which is the above-mentioned radio frequency filter.

Accordingly, it is possible to realize a radio frequency module provided with a multiplexer including a radio frequency filter in which the deterioration of the filter characteristic is suppressed.

The plurality of filters further includes a second filter being the above-mentioned radio frequency filter, and the multiplexer includes a common terminal in which the input terminal or the output terminal of the first filter and the input terminal or the output terminal of the second filter are commonly connected to each other, for example.

Accordingly, it is possible to realize a radio frequency module provided with a multiplexer including a plurality of radio frequency filters in which the deterioration of the filter characteristic is suppressed.

Note that, an example in which both the radio frequency filter 20a and the radio frequency filter 20b are the radio frequency filter 20 according to Embodiment 2 has been described in the present embodiment. However, at least one of the radio frequency filter 20a and the radio frequency filter 20b may be the radio frequency filter 10 according to Embodiment 1. Further, only one of the radio frequency filter 20a and the radio frequency filter 20b may be the radio frequency filter 10 or the radio frequency filter 20, for example.

Further, a plurality of frequency bands each corresponding to the plurality of filters may be a band of long term evolution (LTE) of 4G, or may be a band of new radio (NR) of 5G, for example. Bands of NR may include sub 6 GHz band (n77 (3.3-4.2 GHz), n78 (3.3-3.8 GHz), n79 (4.4-5.0 GHz), and 5.0-7.125 GHz), for example. Further, the plurality of frequency bands may be L5 of global positioning system (GPS), for example. Further, the plurality of frequency bands may include a 5 GHz band of Wi-Fi (registered trademark), for example. The 5 GHz band may be 5150-5725 MHz, for example. The first filter and the second filter may be a filter including any of the above frequency bands in the pass band thereof, for example.

The plurality of filters may include at least two filters out of the following filters as the first filter and the second filter, for example; a filter having a pass band including 699 MHz to 960 MHz, a filter having a pass band including 1.2 GHz, a filter having a pass band including 1.4 GHz to 5 GHz, and a filter having a pass band including 5 GHz to 7.125 GHz.

The plurality of filters may include at least two filters out of the following filters as the first filter and the second filter, for example; a filter having a pass band including 699 MHz to 2.7 GHz, a filter having a pass band including 3.3 GHz to 5 GHz, and a filter having a pass band including 5 GHz to 7.125 GHz.

The plurality of filters may include at least two filters out of the following filters as the first filter and the second filter, for example; a filter having a pass band including 699 MHz to 2.7 GHz, a filter having a pass band including 3.3 GHz to 4.2 GHz, a filter having a pass band including 4.4 GHz to 5 GHz, and a filter having a pass band including 5 GHz to 7.125 GHz.

Embodiment 4

Subsequently, a radio frequency module according to Embodiment 4 will be described.

The radio frequency module according to the present embodiment is different compared to the radio frequency module according to Embodiment 3 in that acoustic wave resonators included in two radio frequency filters each are packaged in one package. Hereinafter, the points different from Embodiment 3 will mainly be described, and the description of points in common will be omitted or simplified.

Figure 14:
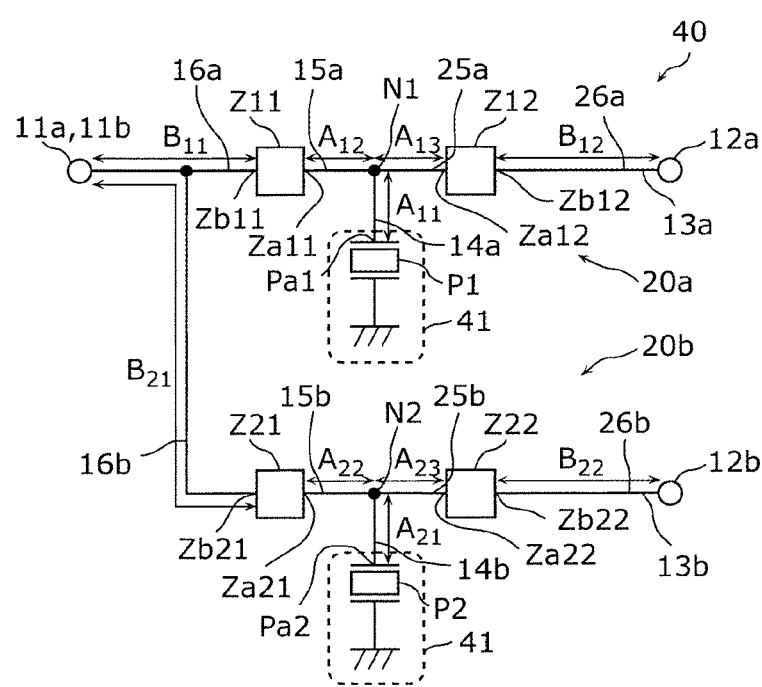
FIG. 14 is a circuit configuration diagram of a multiplexer provided in a radio frequency module according to Embodiment 4.

FIG. 14 is a circuit configuration diagram of a multiplexer 40 provided in the radio frequency module according to the present embodiment. The parallel arm resonator P1 of the radio frequency filter 20a and the parallel arm resonator P2 of the radio frequency filter 20b are housed in one package 41 as illustrated in FIG. 14. Note that, the dashed line frames respectively surrounding the parallel arm resonator P1 and the parallel arm resonator P2 represent the one package 41 in FIG. 14. Housing the parallel arm resonators P1 and P2 in the one package 41 makes it possible to reduce the multiplexer 40 in size, for example.

The impedance elements Z11 and Z12 included in the radio frequency filter 20a are disposed in a first region in plan view in the present embodiment. The terminal Pa1 of the parallel arm resonator P1 is disposed in the first region.

The impedance elements Z21 and Z22 included in the radio frequency filter 20b are disposed in a second region in plan view. The terminal Pa2 of the parallel arm resonator P2 is disposed in the second region.

The first region and the second region are divided regions with a predetermined reference line as the boundary in plan view. The predetermined reference line is a perpendicular bisector of a line segment connecting the terminal Pa1 of the parallel arm resonator P1 included in the radio frequency filter 20a and the terminal Pa2 of the parallel arm resonator P2 included in the radio frequency filter 20b.

With the configuration above, the isolation between the radio frequency filter 20a and the radio frequency filter 20b may be ensured in the multiplexer 40 of the radio frequency module according to the present embodiment. Further, the deterioration of the filter characteristic of each of the radio frequency filters 20a and 20b may be suppressed since the radio frequency module according to the present embodiment has the same relationship in wiring lengths as that in Embodiment 3.

Hereinafter, a specific example of a radio frequency module provided with the multiplexer 40 according to the present embodiment will be described. Note that the arrangements and shapes of elements, wiring substrates, wiring layers, and vias in the respective examples are merely examples, and are not limited to the described examples.

Example 1

First, a radio frequency module according to Example 1 will be described with reference to FIG. 15.

Figure 15:
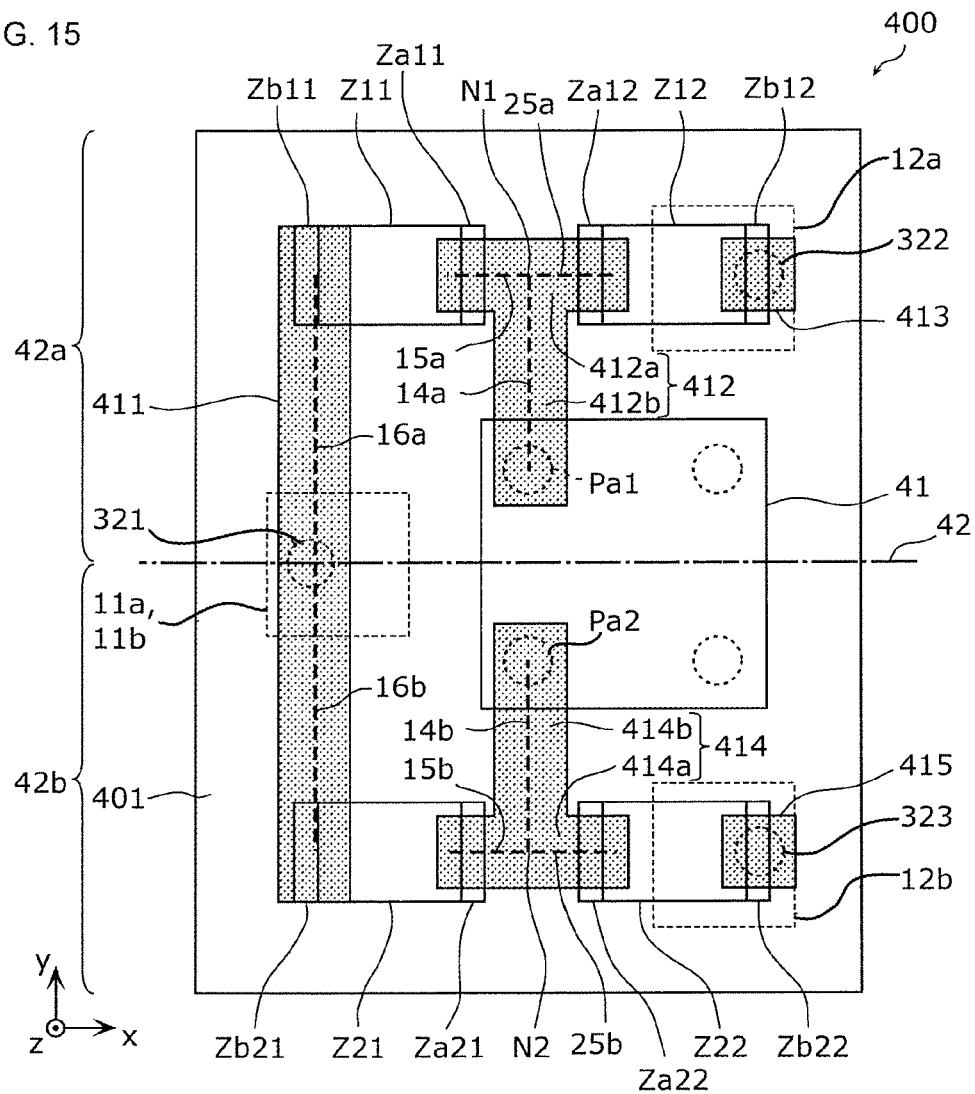
FIG. 15 is a top plan of a radio frequency module according to Example 1 of Embodiment 4.

FIG. 15 is a top plan of a radio frequency module 400 according to the present example. In FIG. 15, portions not visible from a top view are represented by the dashed lines. The portions include such as the terminals 11a (terminal 11b), 12a, and 12b, and the vias 321, 322, and 323 of the multiplexer 40. The same illustration manner applies to FIG. 16 which will be described later.

The radio frequency module 400 includes a wiring substrate 401 as illustrated in FIG. 15. The wiring substrate 401 is the same as the wiring substrate 301 according to Example 1 of Embodiment 3 except that the number and the shapes of the wiring layers and the vias included in the wiring substrate 401 are different from those of the wiring substrate 301. The wiring substrate 401 includes a wiring layer 411, a wiring layer 412, a wiring layer 413, a wiring layer 414, a wiring layer 415, the via 321, the via 322, and the via 323. The vias 321, 322, and 323 are the same as those in Example 1 of Embodiment 3.

The wiring layers 411, 412, 413, 414, and 415 are similar to the wiring layers 311, 312, 313, 314, and 315 included in the wiring substrate 301 according to Example 1 of Embodiment 3, respectively, and at least one of the shape and the arrangement is different. The front surface 102 of the wiring substrate 401 is provided with the impedance elements Z11, Z12, Z21, and Z22 and the package 41 housing the parallel arm resonators P1 and P2.

The shape of the wiring layer 412 in top view is a T-shape in the present example, for example. Specifically, the wiring layer 412 includes a first wiring portion 412a and a second wiring portion 412b. The connection portion of the first wiring portion 412a and the second wiring portion 412b is a branch point of the wiring layer 412, and corresponds to the node N1.

The impedance element Z11 and the impedance element Z12 are connected to the first wiring portion 412a. Specifically, the first wiring portion 412a extends along the x-axis direction from the terminal Za11 of the impedance element Z11 to the terminal Za12 of the impedance element Z12.

The parallel arm resonator P1 is connected to the second wiring portion 412b. Specifically, the second wiring portion 412b linearly extends along the y-axis direction from the first wiring portion 412a to the terminal Pa1 of the parallel arm resonator P1.

The shape of the wiring layer 414 in top view is a T-shape as with the wiring layer 412. Specifically, the wiring layer 414 includes a first wiring portion 414a and a second wiring portion 414b. The connection portion of the first wiring portion 414a and the second wiring portion 414b is a branch point of the wiring layer 414, and corresponds to the node N2.

The impedance element Z21 and the impedance element Z22 are connected to the first wiring portion 414a. Specifically, the first wiring portion 414a extends along the x-axis direction from the terminal Za2l of the impedance element Z21 to the terminal Za22 of the impedance element Z22.

The parallel arm resonator P2 is connected to the second wiring portion 414b. Specifically, the second wiring portion 414b linearly extends along the y-axis direction from the first wiring portion 414a to the terminal Pa2 of the parallel arm resonator P2.

A virtual reference line 42, a first region 42a, and a second region 42b are illustrated in FIG. 15. The reference line 42 is a perpendicular bisector of a line segment connecting the terminal Pa1 of the parallel arm resonator P1 and the terminal Pa2 of the parallel arm resonator P2.

The first region 42a and the second region 42b are divided regions by the reference line 42. The constituent elements included in the radio frequency filter 20a is disposed in the first region 42a. Specifically, the impedance elements Z11 and Z12, the wiring layer 412, the wiring layer 413, the terminal Pa1 of the parallel arm resonator P1, the via 322, and the terminal 12a are disposed in the first region 42a. The impedance elements Z21 and Z22, the wiring layer 414, the wiring layer 415, the terminal Pa2 of the parallel arm resonator P2, the via 323, and the terminal 12b are disposed in the second region 42b. The via 321 and the terminal 11a (terminal 11b) are positioned on the reference line 42.

Further, the reference line 42 corresponds to the axis of line symmetry in the present example. Specifically, the elements, terminals, wiring layers, and vias included in the radio frequency module 400 are arranged in line symmetry with the reference line 42 being the axis as illustrated in FIG. 15.

The terminals Zb11 and Za11 of the impedance element Z11, the terminals Za12 and Zb12 of the impedance element Z12, and the via 322 are provided side by side on a straight line along the x-axis direction in the present example as illustrated in FIG. 15. Similarly, the terminals Zb21 and Za21 of the impedance element Z21, the terminals Za22 and Zb22 of the impedance element Z22, and the via 323 are provided side by side on a straight line along the x-axis direction.

As described above, the impedance elements Z11 and Z12 included in the radio frequency filter 20a and the impedance elements Z21 and Z22 included in the radio frequency filter 20b are arranged apart from each other with the reference line 42 being the boundary in the present example. Accordingly, it is possible to suppress the coupling between the filters, and the isolation may be ensured.

Note that, also in the present example, the wiring length $A_{11}$ is shorter than each of the wiring lengths $B_{11}$ and $B_{12}$ as with Embodiment 3. Accordingly, the deterioration of the filter characteristic of the radio frequency filter 20a may be suppressed. The same applies to the radio frequency filter 20b.

Example 2

Next, a radio frequency module according to Example 2 will be described with reference to FIG. 16.

The radio frequency module according to the present example is different from the radio frequency module according to Example 1 in the position of the reference line. Specifically, the positions of the terminals Pa1 and Pa2 taken out from the package 41 are different from each other.

Hereinafter, the points different from Example 1 will mainly be described, and the description of points in common will be omitted or simplified.

Figure 16:
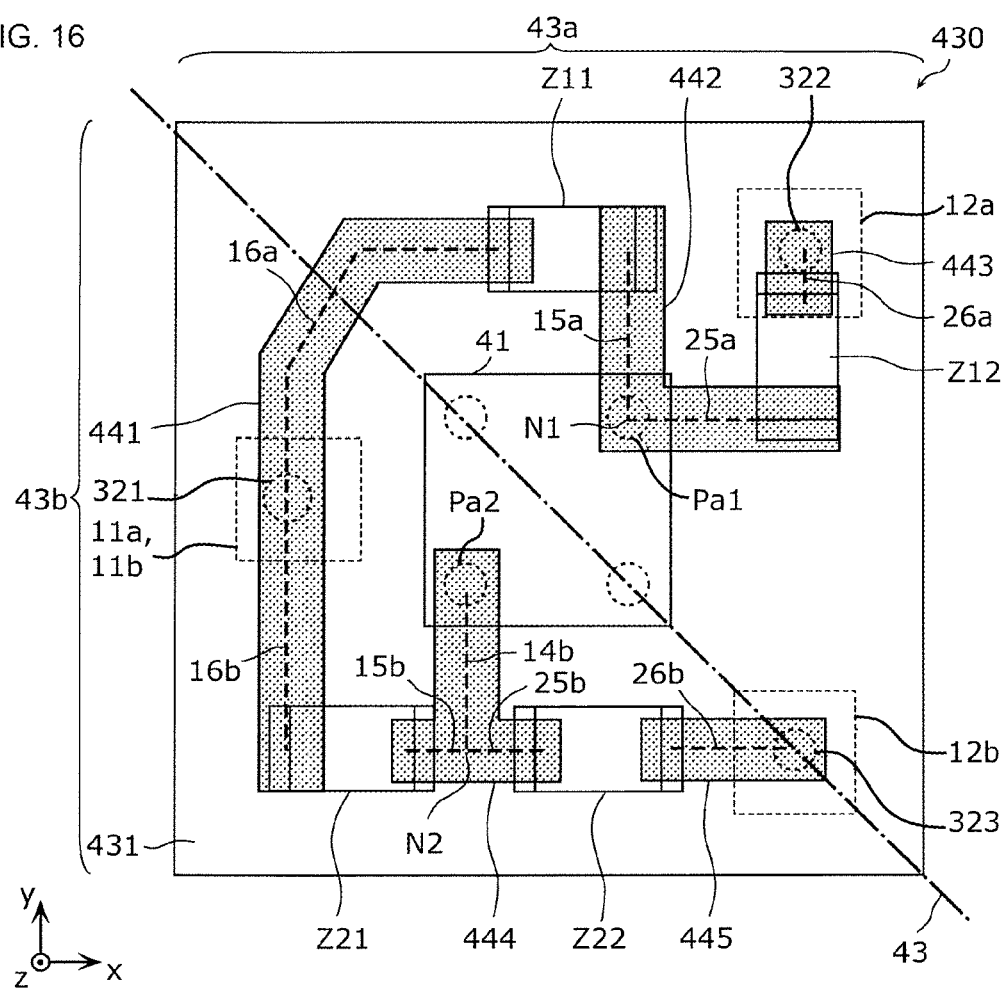
FIG. 16 is a top plan of a radio frequency module according to Example 2 of Embodiment 4.

FIG. 16 is a top plan of a radio frequency module 430 according to the present example. The radio frequency module 430 includes a wiring substrate 431 as illustrated in FIG. 16. The wiring substrate 431 is the same as the wiring substrate 401 according to Example 1 except that the number and the shapes of the wiring layers and the vias included in the wiring substrate 431 are different from those of the wiring substrate 401. The wiring substrate 431 includes a wiring layer 441, a wiring layer 442, a wiring layer 443, a wiring layer 444, a wiring layer 445, the via 321, the via 322, and the via 323. The vias 321, 322, and 323 are the same as those in Example 1 of Embodiment 3.

The radio frequency module 430 is different compared to the radio frequency module 400 according to Example 1 in the arrangement of the impedance elements Z11 and Z12 as illustrated in FIG. 16. Further, the positions of the terminals taken out from the package 41 are different. Specifically, the terminal Pa1 of the parallel arm resonator P1 and the terminal Pa2 of the parallel arm resonator P2 are positioned in diagonal corners of the package 41 in top view.

With this, the reference line 43, which is a perpendicular bisector of the line segment connecting the terminal Pa1 and the terminal Pa2, is a line parallel to the direction along the diagonal line of the package 41 as illustrated in FIG. 16. Accordingly, each of a first region 43a and a second region 43b has a right triangular shape in plan view.

The impedance elements Z11 and Z12, the wiring layers 442 and 443, the terminal Pa1 of the parallel arm resonator P1, the via 322, and the terminal 12a included in the radio frequency filter 20a are provided in the first region 43a in the present example. Further, the impedance elements Z21 and Z22, the wiring layers 444 and 445, and the terminal Pa2 of the parallel arm resonators P2 included in the radio frequency filter 20b are provided in the second region 43b. Note that the terminal 11a (terminal 11b), which is a common input terminal, is provided in the second region 43b. Further, the terminal 12b, which is one of the output terminals, is positioned on the reference line 43. As described above, the positions of the terminal 11a (terminal 11b), the terminal 12a, and the terminal 12b are not particularly limited.

Note that the wiring layers 441, 442, 443, 444, and 445 correspond to the wiring layers 411, 412, 413, 414, and 415 included in the wiring substrate 401 according to Example 1, respectively. Each of the wiring layers 441, 442, 443, 444, and 445 is different from each of the wiring layers 411, 412, 413, 414, and 415 in at least either of the shape or the arrangement. However, the connection relationship with each element or terminal is the same as that in Example 1, and therefore, the description thereof will be omitted.

As described above, the impedance elements Z11 and Z12 included in the radio frequency filter 20a and the impedance elements Z21 and Z22 included in the radio frequency filter 20b are arranged apart from each other with the reference line 43 being the boundary in the present example. Accordingly, it is possible to suppress the coupling between the filters, and the isolation may be ensured.

Note that, also in the present example, the wiring length $A_{11}$ is shorter than each of the wiring lengths $B_{11}$ and $B_{12}$ as with Embodiment 3. Accordingly, the deterioration of the filter characteristic of the radio frequency filter 20a may be suppressed. The same applies to the radio frequency filter 20b.

Conclusion

As described above, the acoustic wave resonator included in the first filter and the acoustic wave resonator included in the second filter are packaged in one package in the radio frequency module according to the present embodiment.

Accordingly, since the multiplexer may be reduced in size, the radio frequency module may also be reduced in size.

Further, the first impedance element included in the first filter and the node side terminal of the acoustic wave resonator included in the first filter are disposed in the first region, for example. The first impedance element included in the second filter and the node side terminal of the acoustic wave resonator included in the second filter are disposed in the second region. The first region and the second region are divided regions with the perpendicular bisector of a line segment as a boundary, where the line segment connects the node side terminal of the acoustic wave resonator included in the first filter and the node side terminal of the acoustic wave resonator included in the second filter in plan view.

Accordingly, it is possible to suppress the coupling between the radio frequency filters, and the isolation may be ensured.

Note that, an example in which all of the impedance elements included in the multiplexer 40 are provided on the front surface 102 of the wiring substrate 401 or 431 has been described in the present embodiment. However, at least one impedance element may be provided in the wiring substrate 401 or 431.

Further, an example in which two acoustic wave resonators are packaged in one package has been described in the present embodiment. However, three or more acoustic wave resonators may be packaged in one package. The radio frequency module may include three or more radio frequency filters, and three or more acoustic wave resonators included in the three or more radio frequency filters may be packaged in one package, for example.

Embodiment 5

Subsequently, a radio frequency module according to Embodiment 5 will be described.

The radio frequency module according to the present embodiment is different from the multiplexer 30 according to Embodiment 3 in that the impedance elements Z11, Z12, Z21, and Z22 of the multiplexer 30 are replaced by capacitors, and further, four inductors are provided thereto. Hereinafter, the points different from Embodiment 3 will mainly be described, and the description of points in common will be omitted or simplified.

Figure 17:
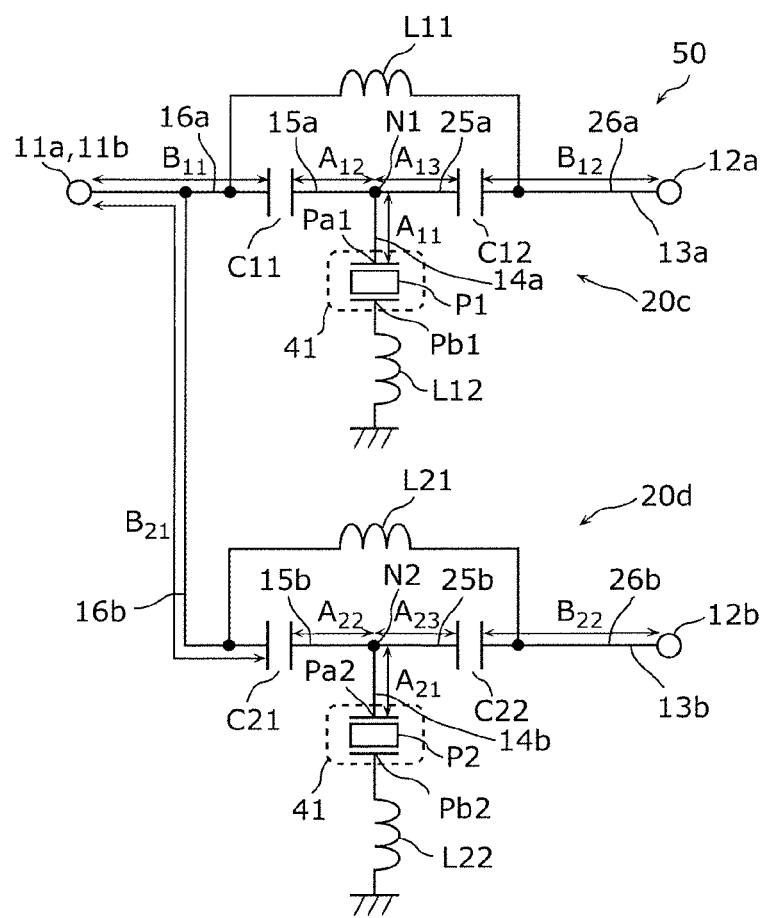
FIG. 17 is a circuit configuration diagram of a multiplexer provided in a radio frequency module according to Embodiment 5.

FIG. 17 is a circuit configuration diagram of a multiplexer 50 provided in the radio frequency module according to the present embodiment. The multiplexer 50 is a diplexer including a radio frequency filter 20c and a radio frequency filter 20d as illustrated in FIG. 17.

The radio frequency filter 20c is an example of a first filter included in a plurality of filters included in the multiplexer 50. Specifically, the radio frequency filter 20c includes the terminal 11a, the terminal 12a, a capacitor C11, a capacitor C12, an inductor L11, an inductor L12, and the parallel arm resonator P1.

The capacitor C11 is an example of the first impedance element disposed in series on the path 13a connecting the terminal 11a and the terminal 12a. The capacitor C12 is an example of the second impedance element disposed in series on the path 13a connecting the terminal 11a and the terminal 12b. The node N1 is positioned between the capacitor C11 and the capacitor C12.

The inductor L11 is an example of a third impedance element connected in parallel to the series circuit of the first impedance element and the second impedance element. Specifically, the inductor L11 is connected in parallel to the series circuit of the capacitors C11 and C12. More specifically, one end of the inductor L11 is connected to the wiring line connecting the capacitor C11 and the terminal 11a, and the other end of the inductor L11 is connected to the wiring line connecting the capacitor C12 and the terminal 12a.

The inductor L12 is disposed in series between the parallel arm resonator P1 and the ground. Specifically, the inductor L12 is connected to a terminal Pb1 of the parallel arm resonator P1 at the side opposite to the node N1 and the ground. Note that the inductor L12 may be connected to the terminal Pa1 of the parallel arm resonator P1 and the node N1.

Also, in the present embodiment, the radio frequency filter 20c satisfies the same relationship in the wiring length as that of the radio frequency filter 20a according to Embodiment 3. Specifically, the wiring length $A_{11}$ is shorter than each of the wiring length $B_{11}$ and the wiring length $B_{12}$. Further, the sum of the wiring length $A_{11}$ and the wiring length $A_{12}$ is shorter than the wiring length $B_{11}$. The sum of the wiring length $A_{11}$ and the wiring length $A_{13}$ is shorter than the wiring length $B_{12}$. Accordingly, the generation of an unnecessary inductive component connected in series to the parallel arm resonator P1 and an unnecessary capacitive component connected in parallel to the parallel arm resonator P1 is suppressed, and therefore, the deterioration of the filter characteristic of the radio frequency filter 20c may be suppressed.

Further, providing the two capacitors C11 and C12 connected in series on the path 13a constituting the series arm, the inductor L11 connected in parallel to the two capacitors C11 and C12, and the parallel arm resonator P1 as indicated in the radio frequency filter 20c may effectively suppress the degradation of the attenuation characteristic. Accordingly, the filter characteristic of the radio frequency filter 20c may further be improved. Note that the inductor and the capacitor may be replaced with each other. Specifically, the radio frequency filter 20c may include two inductors instead of the capacitors C11 and C12, and may include a capacitor instead of the inductor L11.

The radio frequency filter 20d is an example of a second filter included in the plurality of filters included in the multiplexer 50. The radio frequency filter 20d has a configuration similar to that of the radio frequency filter 20c. Specifically, the radio frequency filter 20d includes the terminal 11b, the terminal 12b, a capacitor C21, a capacitor C22, an inductor L21, an inductor L22, and the parallel arm resonator P2. The terminal 11b, the terminal 12b, the capacitor C21, the capacitor C22, the inductor L21, the inductor L22, and the parallel arm resonator P2 correspond to the terminal 11a, the terminal 12a, the capacitor C11, the capacitor C12, the inductor L11, the inductor L12, and the parallel arm resonator P1 of the radio frequency filter 20c, respectively.

It is possible to suppress the deterioration of the filter characteristic as with the radio frequency filter 20c since the radio frequency filter 20d has the same configuration as that of the radio frequency filter 20c.

Note that the capacitance values of the capacitors C11, C12, C21, and C22, and the inductance values of the inductors L11, L12, L21, and L22 are set to appropriate values in accordance with the filter characteristic of the radio frequency filters 20c and 20d.

With the above configuration, it is possible to realize a radio frequency module provided with a multiplexer including a filter in which the deterioration of the filter characteristic is suppressed.

Hereinafter, a specific example of a radio frequency module provided with the multiplexer 50 according to the present embodiment will be described. Note that the arrangements and shapes of elements, wiring substrates, wiring layers, and vias in the example described are merely examples, and are not limited to the described examples.

EXAMPLE

A radio frequency module according to an example will be described with reference to FIG. 18A and FIG. 18B.

Figure 18A:
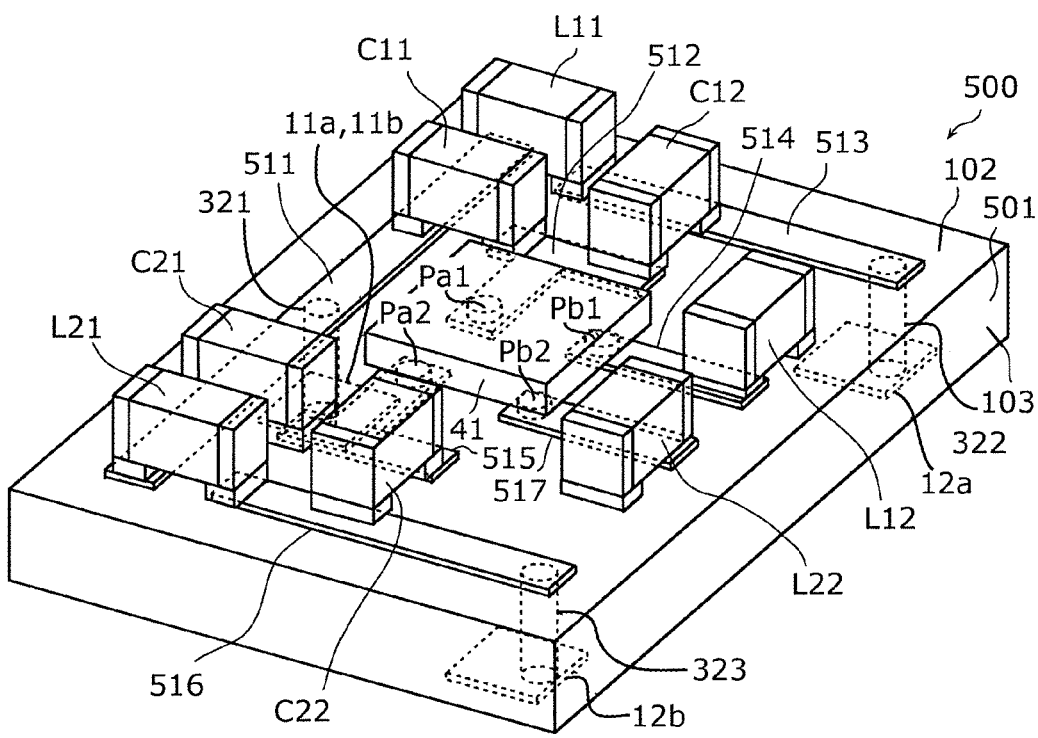
FIG. 18A is a perspective view of a radio frequency module according to Embodiment 5.

FIG. 18A is a perspective view of a radio frequency module 500 according to the present example. FIG. 18B is a three-view drawing of the radio frequency module 500 according to the present example. The portions (a), (b), and (c) of FIG. 18B are a top plan, an elevation, and a right side elevation of the radio frequency module 500, respectively.

Figure 18B:
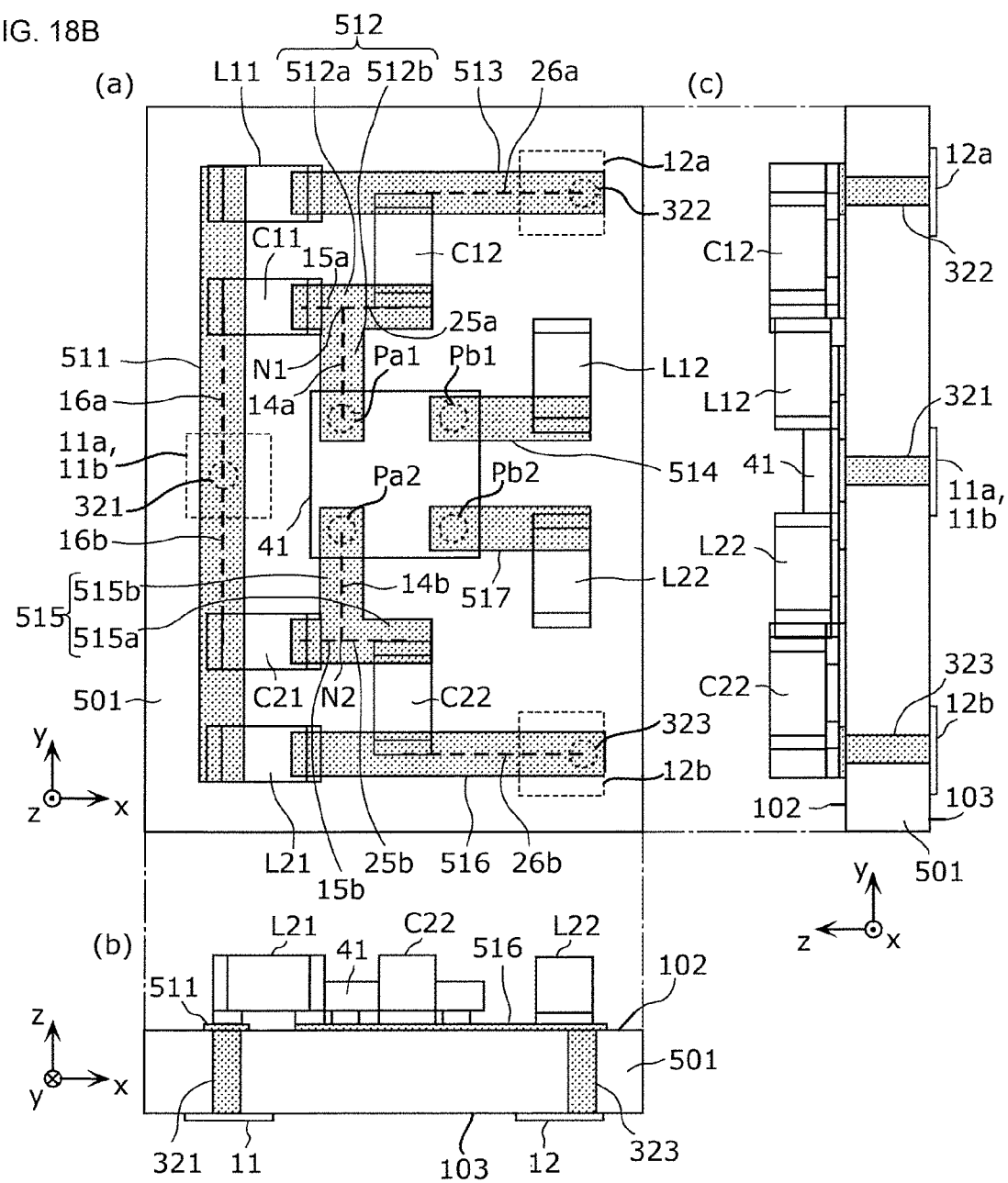
FIG. 18B is a three-view drawing of the radio frequency module according to Embodiment 5.

The radio frequency module 500 includes a wiring substrate 501 as illustrated in FIG. 18A and FIG. 18B.

The wiring substrate 501 is the same as the wiring substrate 301 except that the number and the shapes of the wiring layers and the vias included in the wiring substrate 501 are different from those of the wiring substrate 301. The front surface 102 of the wiring substrate 501 is provided with the package 41 in which the capacitors C11, C12, C21, and C22, and the inductors L11, L12, L21, and L22, and the parallel arm resonators P1 and P2 are housed.

The wiring substrate 501 includes a wiring layer 511, a wiring layer 512, a wiring layer 513, a wiring layer 514, a wiring layer 515, a wiring layer 516, a wiring layer 517, the via 321, the via 322, and the via 323 in the present example as illustrated in FIG. 18A and FIG. 18B. The vias 321, 322, and 323 are the same as those in Example 1 of Embodiment 3.

The wiring layers 511, 512, 513, 514, 515, 516, and 517 each are conductive pattern wiring lines provided on the front surface 102 of the wiring substrate 501. The wiring layers 511, 512, 513, 514, 515, 516, and 517 are formed such that a metal thin film of silver (Ag) or copper (Cu) or the like is formed on the front surface 102, and then, the metal thin film is patterned in a predetermined shape, for example. All the wiring layers 511, 512, 513, 514, 515, 516, and 517 extend in a direction parallel to the front surface 102, that is, in a direction orthogonal to the thickness direction (z-axis direction) of the wiring substrate 501. The widths and the film thicknesses of the wiring layers 511, 512, 513, 514, 515, 516, and 517 are the same as each other, for example, but may be different from each other.

The via 321, the capacitors C11 and C21, and the inductors L11 and L21 are connected to the wiring layer 511. The wiring layer 511 linearly extends along the y-axis direction from the upper end portion of the via 321 to both one end of the inductor L11 and one end of the inductor L21 as illustrated in FIG. 18A and (a) of FIG. 18B. The shape of the wiring layer 511 in top view is rectangular, for example, but is not limited thereto.

The capacitor C11, the parallel arm resonator P1, and the capacitor C12 are connected to the wiring layer 512. The wiring layer 512 includes a first wiring portion 512a and a second wiring portion 512b as illustrated in FIG. 18A and (a) of FIG. 18B. The connection portion of the first wiring portion 512a and the second wiring portion 512b is a branch point of the wiring layer 512, and corresponds to the node N1.

The capacitor C11 and the capacitor C12 are connected to the first wiring portion 512a. The first wiring portion 512a linearly extends along the x-axis direction from the other end of the capacitor C11 to one end of the capacitor C12.

The parallel arm resonator P1 is connected to the second wiring portion 512b. The second wiring portion 512b linearly extends along the y-axis direction from the first wiring portion 512a to the terminal Pa1 of the parallel arm resonator P1.

The first wiring portion 512a and the second wiring portion 512b are vertically connected to each other in top view in the present example. That is, the shape of the wiring layer 512 in top view is a T-shape, for example. The shape of the wiring layer 512 in top view may be an L-shape, a V-shape or a linear shape, for example.

The capacitor C12, the inductor L11, and the via 322 are connected to the wiring layer 513. The wiring layer 513 linearly extends along the x-axis direction from the other end of the inductor L11 to the upper end portion of the via 322.

The parallel arm resonator P1 and the inductor L12 are connected to the wiring layer 514. The wiring layer 514 linearly extends along the x-axis direction from the terminal Pb1 of the parallel arm resonator P1 to one end of the inductor L12. The shape of the wiring layer 514 in top view is rectangular, for example, but is not limited thereto. Note that the other end of the inductor L12 is connected to the ground (not illustrated).

The capacitor C21, the parallel arm resonator P2, and the capacitor C22 are connected to the wiring layer 515. The wiring layer 515 includes a first wiring portion 515a and a second wiring portion 515b as illustrated in FIG. 18A and (a) of FIG. 18B. The connection portion of the first wiring portion 515a and the second wiring portion 515b is a branch point of the wiring layer 515, and corresponds to the node N2.

The capacitor C21 and the capacitor C22 are connected to the first wiring portion 515a. The first wiring portion 515a linearly extends along the x-axis direction from the other end of the capacitor C21 to one end of the capacitor C22.

The parallel arm resonator P2 is connected to the second wiring portion 515b. The second wiring portion 515b linearly extends along the y-axis direction from the first wiring portion 515a to the terminal Pa2 of the parallel arm resonator P2.

The first wiring portion 515a and the second wiring portion 515b are vertically connected to each other in top view in the present example. That is, the shape of the wiring layer 515 in top view is a T-shape, for example. The shape of the wiring layer 515 in top view may be an L-shape, a V-shape or a linear shape, for example.

The capacitor C22, the inductor L21, and the via 323 are connected to the wiring layer 516. The wiring layer 516 linearly extends along the x-axis direction from the other end of the inductor L21 to the upper end portion of the via 323.

The parallel arm resonator P2 and the inductor L22 are connected to the wiring layer 517. The wiring layer 517 linearly extends along the x-axis direction from a terminal Pb2 of the parallel arm resonator P2 to one end of the inductor L22. The shape of the wiring layer 517 in top view is rectangular, for example, but is not limited thereto. Note that the other end of the inductor L22 is connected to the ground (not illustrated).

The elements, terminals, wiring layers, and vias included in the radio frequency module 500 are arranged in line symmetry as illustrated in (a) of FIG. 18B in the present example. The axis of the line symmetry passes through the center of the via 321 and is an axis parallel to the x-axis direction. Accordingly, the wiring lines and the elements included in the radio frequency filter 20c, and the wiring lines and the elements included in the radio frequency filter 20d can be arranged apart from each other, and therefore, the coupling between the wiring lines or the elements or the like between the radio frequency filter 20c and the radio frequency filter 20d may be suppressed.

Here, the correspondence between the wiring structure included in the radio frequency module 500 according to the present example and the wiring line included in the multiplexer 50 illustrated in FIG. 17 will be described.

The path 13a connecting the terminal 11a (terminal 11b) being the common terminal and the terminal 12a is constituted of the via 321, part of the wiring layer 511, the first wiring portion 512a of the wiring layer 512, part of the wiring layer 513, and the via 322 in the present example. The node N1 is a branch point of the wiring layer 512, and corresponds to the connection portion of the first wiring portion 512a and the second wiring portion 512b. The wiring line 14a branched from the path 13a at the node N1 is constituted of the second wiring portion 512b. The wiring length $A_{11}$ of the wiring line 14a therefore corresponds to the length of the second wiring portion 512b.

The wiring line 16a included in the path 13a is constituted of the via 321 and part of the wiring layer 511. Specifically, the part of the wiring layer 511 constituting the wiring line 16a is the portion extending from the connection portion of the wiring layer 511 and the via 321 to the connection portion of the wiring layer 511 and one end of the capacitor C11. The wiring length $B_{11}$ of the wiring line 16a therefore corresponds to the total length of the length of the via 321 and the length of the part of the wiring layer 511.

Further, the wiring line 15a is constituted of part of the first wiring portion 512a of the wiring layer 512. Specifically, the part of the first wiring portion 512a constituting the wiring line 15a is the portion of the first wiring portion 512a from the other end of the capacitor C11 to the node N1 (branch point). The wiring length $A_{12}$ of the wiring line 15a therefore corresponds to the length of said part of the first wiring portion 512a.

The wiring line 25a is constituted of another part of the first wiring portion 512a of the wiring layer 512. Specifically, the other part of the first wiring portion 512a constituting the wiring line 25a is the portion of the first wiring portion 512a from the node N1 (branch point) to the one end of the capacitor C12. The wiring length $A_{13}$ of the wiring line 25a therefore corresponds to the length of said part of the first wiring portion 512a.

Further, the wiring line 26a is constituted of part of the wiring layer 513 and the via 322. Specifically, the part of the wiring layer 513 constituting the wiring line 26a is the portion extending from the connection portion of the wiring layer 513 and the other end of the capacitor C12 to the connection portion of the wiring layer 513 and the via 322. The wiring length $B_{12}$ of the wiring line 26a therefore corresponds to the total length of the length of the part of the wiring layer 513 and the length of the via 322.

The length of the second wiring portion 512b is shorter than the length from the upper portion of the via 321 to the one end of the capacitor C11 of the wiring layer 511 as illustrated in (a) of FIG. 18B, for example. With this, the wiring length $A_{11}$ is shorter than the wiring length $B_{11}$ by at least the length of the via 321, that is, by the plate thickness of the wiring substrate 501. The same applies to the relationship between the wiring length $A_{11}$ and the wiring length $B_{12}$.

The sum of the wiring length $A_{11}$ and the wiring length $A_{12}$ is shorter than the wiring length $B_{11}$ also in the present embodiment. Further, the sum of the wiring length $A_{11}$ and the wiring length $A_{13}$ is shorter than the wiring length $B_{12}$. Further, the sum of the wiring length $A_{11}$, the wiring length $A_{12}$, and the wiring length $A_{13}$ may be shorter than the wiring length $B_{11}$ or $B_{12}$. That is, the wiring length of the T-shaped wiring layer 512 (total length of length of first wiring portion 512a and length of second wiring portion 512b) may be shorter than the total length of the length of the via 321 and the length from the upper portion of the via 321 to the one end of the capacitor C11 of the wiring layer 511. Further, the total length of the length of the first wiring portion 512a and the length of the second wiring portion 512b may be shorter than the total length of the length from the other end of the capacitor C12 to the upper portion of the via 322 of the wiring layer 513 and the length of the via 322.

As described above, the radio frequency filter 20c and the radio frequency filter 20d are arranged in line symmetry with the axes passing through the terminal 11a (terminal 11b), which is the common input terminal, being the axes of symmetry in the present example. Thus, the wiring lines included in the radio frequency filter 20d also have the same wiring lengths. With this, the wiring lengths $A_{21}$, $A_{22}$, $A_{23}$, $B_{21}$, and $B_{22}$ in the radio frequency filter 20d are equal to the wiring lengths $A_{11}$, $A_{12}$, $A_{13}$, $B_{11}$, and $B_{12}$, respectively.

With the above configuration, the wiring length $A_{11}$ between the node N1 and the parallel arm resonator P1 of the radio frequency filter 20c is shorter than the wiring length $B_{11}$ between the terminal 11a and the capacitor C11 in the radio frequency module 500 according to the present example. Further, the wiring length $A_{11}$ is shorter than the wiring length $B_{12}$ between the terminal 12a and the capacitor C12. Accordingly, the deterioration of the filter characteristic of the radio frequency filter 20c is suppressed as described with reference to FIGS. 2A, 2B and 2C, and FIGS. 3A, 3B and 3C. Similarly, the deterioration of the filter characteristic of the radio frequency filter 20d is also suppressed. Thus, it is possible to realize the radio frequency module 500 provided with the multiplexer including the radio frequency filters 20c and 20d in which the deterioration of the filter characteristic is suppressed.

Conclusion

As described above, in the radio frequency module according to the present embodiment, the radio frequency filter further includes the third impedance element connected in parallel to the series circuit of the first impedance element and the second impedance element. Both the first impedance element and the second impedance element are either of capacitors or inductors. The third impedance element is the other one out of a capacitor and an inductor.

Accordingly, it is possible to realize a radio frequency filter having a preferable filter characteristic and capable of suppressing the deterioration of the filter characteristic. Further, a radio frequency module provided with the multiplexer 50 including such preferable radio frequency filter may be realized.

Embodiment 6

Subsequently, a radio frequency module according to Embodiment 6 will be described.

The radio frequency module according to the present embodiment is provided with a radio frequency front end circuit including the radio frequency filter 10 or 20 described in Embodiment 1 or Embodiment 2, or at least one of the multiplexers 30, 40, and 50 described in Embodiment 3 to Embodiment 5. Hereinafter, the points different from the respective embodiments will mainly be described, and the description of points in common will be omitted or simplified.

Figure 19:
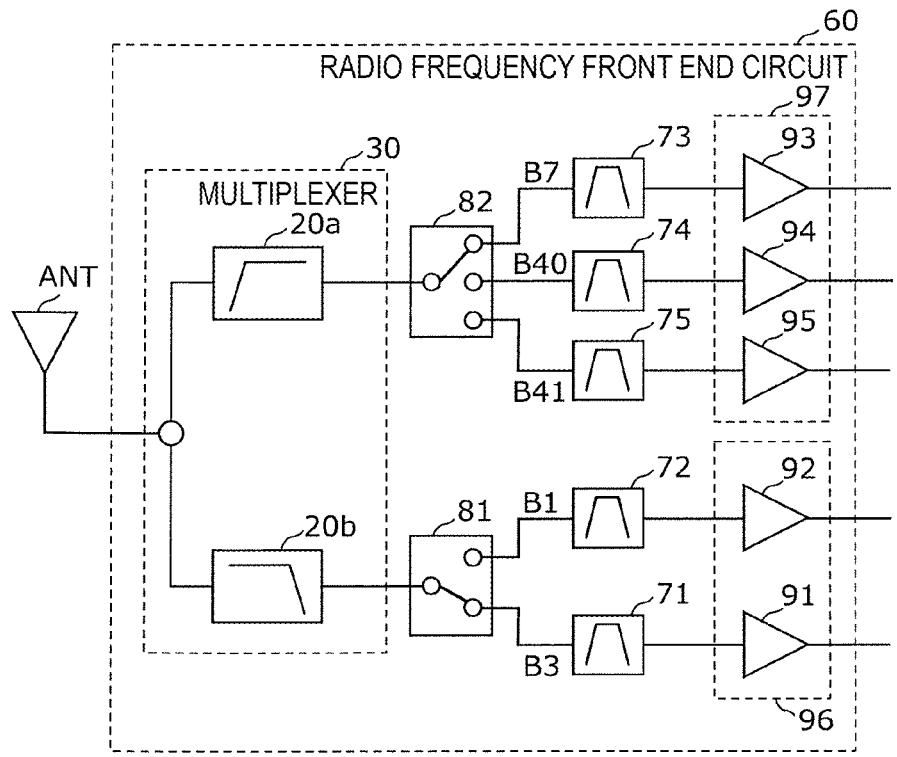
FIG. 19 is a circuit configuration diagram of a radio frequency front end circuit included in a radio frequency module according to Embodiment 6.

FIG. 19 is a circuit configuration diagram of a radio frequency front end circuit 60 provided in a radio frequency module according to the present embodiment. The radio frequency front end circuit 60 is a front end circuit for reception, and includes the multiplexer 30, switches 81 and 82, filters 71, 72, 73, 74, and 75, and reception amplifiers 91, 92, 93, 94, and 95 as illustrated in FIG. 19. Note that, an antenna element ANT is illustrated in FIG. 19. The antenna element ANT is a multi-band antenna conforming to a communication standard such as Long Term Evolution (LTE) for transmitting and receiving a radio frequency signal. The antenna element ANT and the radio frequency front end circuit 60 are disposed in a front end unit of a multi-mode/multi-band mobile phone, for example.

The multiplexer 30 includes the radio frequency filter 20a serving as a high pass filter and the radio frequency filter 20b serving as a low pass filter, for example.

The radio frequency filter 20b is a low pass filter having a pass band of the low band group frequency range (1427 MHz to 2200 MHz, for example) and an attenuation band of the high band group frequency range. The radio frequency filter 20a is a high pass filter having a pass band of the high band group frequency range (2300 MHz to 2690 MHz, for example) and an attenuation band of the low band group frequency range. At least one of the radio frequency filters 20a and 20b may be a tunable filter capable of changing the frequency range of the pass band or the attenuation band or the like.

The switch 81 is a switch element having a common terminal and two selection terminals, and the common terminal is connected to the radio frequency filter 20b. The switch 81 is an SPDT type switch circuit capable of connecting the common terminal and any one of the two selection terminals.

The switch 82 is a switch element having a common terminal and three selection terminals, and the common terminal is connected to the radio frequency filter 20a. The switch 82 is an SP3T type switch circuit capable of connecting the common terminal and any one of the three selection terminals.

The filter 71 is connected to a selection terminal of the switch 81, and is a band pass filter having a pass band of LTE Band 3 (reception band: 1805-1880 MHz), for example. The filter 72 is connected to a selection terminal of the switch 81, and is a band pass filter having a pass band of LTE Band 1 (reception band: 2110-2170 MHz), for example. The filter 73 is connected to a selection terminal of the switch 82, and is a band pass filter having a pass band of LTE Band 7 (reception band: 2620-2690 MHz), for example. The filter 74 is connected to a selection terminal of the switch 82, and is a band pass filter having a pass band of LTE Band 40 (reception band: 2300-2400 MHz), for example. The filter 75 is connected to a selection terminal of the switch 82, and is a band pass filter having a pass band of LTE Band 41 (reception band: 2496-2690 MHz), for example.

The reception amplifier 91 is connected to the filter 71, the reception amplifier 92 is connected to the filter 72, the reception amplifier 93 is connected to the filter 73, the reception amplifier 94 is connected to the filter 74, and the reception amplifier 95 is connected to the filter 75. Each of the reception amplifiers 91, 92, 93, 94, and 95 is a low-noise amplifier configured of a transistor or the like, for example. The reception amplifiers 91 and 92 constitute an amplification circuit 96. The reception amplifiers 93, 94, and 95 constitute an amplification circuit 97. Note that the amplification circuits 96 and 97 each may be configured of one reception amplifier, and in this case, an SPDT type switch is disposed between the filters 71 and 72 and the amplification circuit 96, and an SP3T type switch is disposed between the filters 73, 74, and 75 and the amplification circuit 97.

Conclusion

As described above, the radio frequency module according to the present embodiment is provided with a front end circuit including a multiplexer. The front end circuit includes a switch directly or indirectly connected to the multiplexer, and an amplification circuit directly or indirectly connected to the multiplexer.

Accordingly, the radio frequency front end circuit 60 including the multiplexer 30 in which the deterioration of the filter characteristic is suppressed may be realized.

(Others)

Thus far, the radio frequency module according to the present disclosure has been described based on the above-mentioned embodiments, but the present disclosure is not limited to the above-mentioned embodiments.

For example, in each embodiment and each example, one or more capacitors or one or more inductors may be connected in series or in parallel to at least one of the first impedance element and the second impedance element. Further, for example, in Embodiment 5, one or more capacitors or one or more inductors may be connected in series or in parallel to at least one of the inductors L11, L12, L21, and L22.

Further, for example, the radio frequency filter may include an acoustic wave resonator disposed in series on the path connecting the input terminal and the output terminal.

Figure 20A:
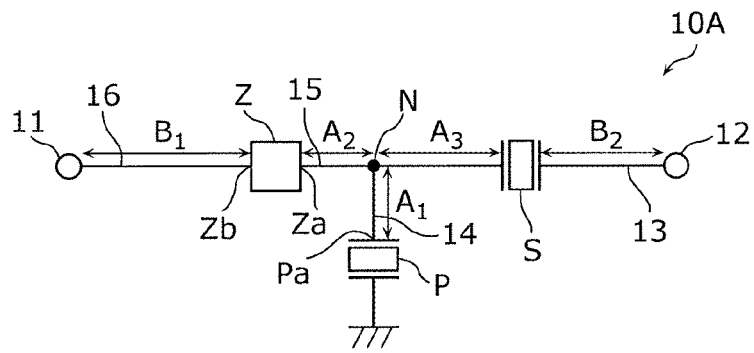
FIG. 20A is a circuit configuration diagram of a radio frequency filter included in a radio frequency module according to Modification 1.

FIG. 20A is a circuit configuration diagram of a radio frequency filter 10A included in a radio frequency module according to Modification 1. The radio frequency filter 10A is different compared to the radio frequency filter 10 illustrated in FIG. 1 in that the radio frequency filter 10A is newly provided with a series arm resonator S as illustrated in FIG. 20A.

The series arm resonator S is an example of an acoustic wave resonator disposed in series on the path connecting the terminal 11 and the terminal 12. The series arm resonator S is a resonator using SAW, a resonator using BAW, or FBAR, as with the parallel arm resonator P, for example. The series arm resonator S is connected between the node N and the terminal 12 as illustrated in FIG. 20A. That is, the series arm resonator S may be regarded as an example of the second impedance element. In other words, the second impedance element may be an acoustic wave resonator.

In this case, the wiring length $A_1$ between the node N and the parallel arm resonator P is shorter than the wiring length $B_1$ between the impedance element Z and the terminal 11, and is shorter than the wiring length $B_2$ between the series arm resonator S and the terminal 12. Further, the sum of the wiring length $A_1$ and the wiring length $A_2$ may be shorter than the wiring length $B_1$ or the wiring length $B_2$ in the example illustrated in FIG. 20A. Further, the sum of the wiring length $A_1$ and the wiring length $A_3$ may be shorter than the wiring length $B_1$ or the wiring length $B_2$. Note that the wiring length $A_3$ is a wiring length between the node N and the series arm resonator S. Further, the sum of the wiring length $A_1$, the wiring length $A_2$, and the wiring length $A_3$ may be shorter than the wiring length $B_1$ or the wiring length $B_2$.

Note that the series arm resonator S may be connected between the impedance element Z and the node N. In this case, the wiring length $A_1$ is shorter than the wiring length $B_1$ of the wiring line 16. Further, the series arm resonator S may be connected in parallel to the impedance element Z.

Alternatively, the series arm resonator S may be connected between the terminal 11 and the impedance element Z. In this case, the terminal having a shorter wiring length to the impedance element Z is the terminal 12 since the series arm resonator S is connected between the terminal 11 and the impedance element Z. With this, the wiring length $A_1$ becomes shorter than the wiring length $B_2$ between the impedance element Z and the terminal 12.

Figure 20B:
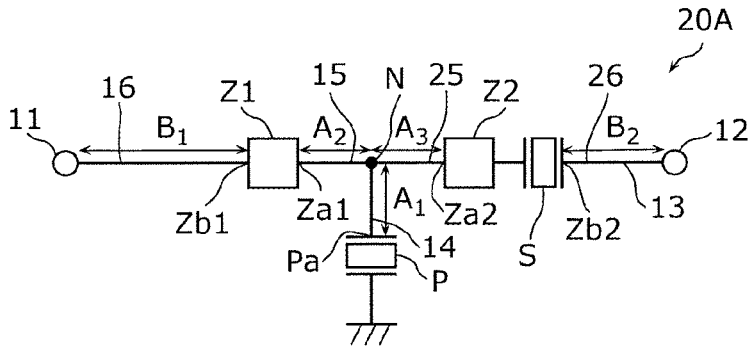
FIG. 20B is a circuit configuration diagram of a radio frequency filter included in a radio frequency module according to Modification 2.

FIG. 20B is a circuit configuration diagram of a radio frequency filter 20A included in a radio frequency module according to Modification 2. The radio frequency filter 20A is different compared to the radio frequency filter 20 illustrated in FIG. 7 in that the radio frequency filter 20A is newly provided with the series arm resonator S as illustrated in FIG. 20B.

In the example illustrated in FIG. 20B, the series arm resonator S is connected between the impedance element Z2 and the terminal 12. In this case, the wiring length $A_1$ between the node N and the parallel arm resonator P is shorter than the wiring length $B_1$ between the impedance element Z1 and the terminal 11, and is longer than the wiring length $B_2$ between the series arm resonator S and the terminal 12. Further, the sum of the wiring length $A_1$ and the wiring length $A_2$ may be shorter than the wiring length $B_1$ or the wiring length $B_2$ in the example illustrated in FIG. 20B.

In the present modification, each of the impedance element Z2 and the series arm resonator S may be regarded as an example of the second impedance element. With this, the wiring length $A_3$ is the wiring length between the node N and the impedance element Z2, for example. At this time, the sum of the wiring length $A_1$ and the wiring length $A_3$ may be shorter than the wiring length $B_1$ or the wiring length $B_2$. Further, the sum of the wiring length $A_1$, the wiring length $A_2$, and the wiring length $A_3$ may be shorter than the wiring length $B_1$ or the wiring length $B_2$.

The series arm resonator S may be connected between the node N and the impedance element Z2. Further, the series arm resonator S may be connected in parallel to the impedance element Z2.

One or more capacitors or one or more inductors may be connected in series or in parallel to the parallel arm resonator. Further, an impedance variable circuit may be connected to the parallel arm resonator. Specifically, one or more capacitors or inductors may be connected in series or in parallel to the parallel arm resonator via a switch.

The acoustic wave resonator used as the parallel arm resonator P may not be limited to one resonator, but may be constituted of a plurality of separate resonators obtained by dividing one resonator, for example.

Further, the impedance element Z provided in the wiring substrate may be an inductor, for example. The impedance element Z may be an inductor formed of a spiral or annular pattern wiring line, for example.

Further, although a configuration of the multiplexer in which a plurality of input terminals is commonly connected to a common terminal has been described, a plurality of output terminals may be commonly connected to the common terminal, for example. At least one of the plurality of filters included in the multiplexer may be used for demultiplexing the input radio frequency signal, or may be used for multiplexing, for example. At least one of the first filter and the second filter included in the multiplexer may be used as a reception filter, or may be used as a transmission filter, for example.

Further, in Embodiment 6, the radio frequency front end circuit includes both the switch and the amplification circuit, but the radio frequency front end circuit may not include at least one of the switch and the amplification circuit, for example.

Further, embodiments obtained by applying various modifications that those skilled in the art think about to the above embodiments, or embodiments achieved by freely combining constituent elements and functions in the above embodiments within the scope of the present disclosure are included in the present disclosure.

The present disclosure may be applied to such as a radio frequency filter, a multiplexer, a front end circuit, and a communication unit, and may be applied to a communication device such as a mobile phone, for example.

10, 10A, 10x, 10y, 20, 20a, 20A, 20b, 20c, 20d RADIO FREQUENCY FILTER
11, 11a, 11b TERMINAL (INPUT TERMINAL)
12, 12a, 12b TERMINAL (OUTPUT TERMINAL)
13, 13a, 13b PATH
14, 14a, 14b, 15, 15a, 15b, 16, 16a, 16b, 25, 25a, 25b, 26, 26a, 26b WIRING LINE
14C, 16C CAPACITIVE COMPONENT
14L, 16L INDUCTIVE COMPONENT
30, 40, 50 MULTIPLEXER
41 PACKAGE
42, 43 REFERENCE LINE
42a, 43a FIRST REGION
42b, 43b SECOND REGION
60 RADIO FREQUENCY FRONT END CIRCUIT
71, 72, 73, 74, 75 FILTER
81, 82 SWITCH
91, 92, 93, 94, 95 RECEPTION AMPLIFIER
96, 97 AMPLIFICATION CIRCUIT
100, 130, 160, 200, 230, 260, 300, 330, 400, 430, 500 RADIO FREQUENCY MODULE
101, 131, 161, 201, 231, 261, 301, 331, 401, 431, 501 WIRING SUBSTRATE
102 FRONT SURFACE (FIRST SURFACE)
103 BACK SURFACE (SECOND SURFACE)
111, 112, 142, 143, 171, 172, 212, 213, 242, 271, 272, 311, 312, 313, 314, 315, 341, 342, 411, 412, 413, 414, 415, 441, 442, 443, 444, 445, 511, 512, 513, 514, 515, 516, 517 WIRING LAYER
112a, 212a, 242a, 312a, 314a, 412a, 414a, 512a, 515a FIRST WIRING PORTION
112b, 212b, 242b, 312b, 314b, 412b, 414b, 512b, 515b SECOND WIRING PORTION
121, 122, 151, 152, 181, 182, 183, 251, 252, 253, 281, 282, 283, 321, 322, 323, 351, 352, 353, 354, 355 VIA
191, 192, 291, 292, 293, 294, 391, 392, 393, 394, 395, 396 ELECTRODE PLATE
ANT ANTENNA ELEMENT
C11, C12, C21, C22 CAPACITOR
L11, L12, L21, L22 INDUCTOR
N, N1, N2 NODE
P PARALLEL ARM RESONATOR
Pa, Pa1, Pa2 TERMINAL (NODE SIDE TERMINAL)
Pb1, Pb2 TERMINAL
S SERIES ARM RESONATOR

Z, Z1, Z2, Z11, Z12, Z21, Z22 IMPEDANCE ELEMENT
Za, Za1, Za2, Za11, Za12, Za21, Za22 TERMINAL (NODE SIDE TERMINAL)
Zb, Zb1, Zb2, Zb11, Zb12, Zb21, Zb22 TERMINAL

The invention claimed is:

1. A radio frequency module comprising:
a radio frequency filter,
wherein the radio frequency filter includes:
an input terminal,
an output terminal,
a first impedance element disposed in series on a path connecting the input terminal and the output terminal, and
an acoustic wave resonator connected between a node on the path and a ground, wherein:
the first impedance element is a capacitor or an inductor, and
a first wiring length between the node and the acoustic wave resonator is shorter than a second wiring length between the first impedance element and a terminal out of the input terminal and the output terminal having a shorter wiring length to the first impedance element.

2. The radio frequency module according to claim 1, further comprising:
a wiring substrate having a first surface and a second surface facing away from each other,
wherein the acoustic wave resonator is provided on the first surface, and
the input terminal and the output terminal are provided on the second surface.

3. The radio frequency module according to claim 2, wherein the first impedance element is provided in the wiring substrate and in a position overlapping with the acoustic wave resonator when the first surface is viewed in plan view.

4. The radio frequency module according to claim 2, wherein the first impedance element is provided on the first surface.

5. The radio frequency module according to claim 2, wherein the wiring substrate includes:
at least one wiring layer extending in a direction parallel to the first surface and
at least one via extending in a direction orthogonal to the first surface, wherein:
each of the input terminal, the output terminal, the first impedance element, and the acoustic wave resonator is connected to at least one of the at least one wiring layer and the at least one via, and
the node is a branch point in one wiring layer out of the at least one wiring layer, or a connection point of one wiring layer out of the at least one wiring layer and one via out of the at least one via.

6. The radio frequency module according to claim 1, wherein a sum of the first wiring length and a third wiring length between the node and the first impedance element is shorter than the second wiring length.

7. The radio frequency module according to claim 1, further comprising:
a second impedance element disposed in series on the path,
wherein the node is positioned between the first impedance element and the second impedance element.

8. The radio frequency module according to claim 7, wherein the second impedance element is a capacitor, an inductor, or an acoustic wave resonator.

9. The radio frequency module according to claim 7, wherein the first wiring length is shorter than a fourth wiring length between the second impedance element and a terminal out of the input terminal and the output terminal having a shorter wiring length to the second impedance element.

10. The radio frequency module according to claim 7, wherein:
the radio frequency filter further includes a third impedance element connected in parallel to a series circuit of the first impedance element and the second impedance element,
both the first impedance element and the second impedance element are one of a capacitor or an inductor, and
the third impedance element is the other one out of the capacitor or the inductor.

11. The radio frequency module according to claim 1, wherein the radio frequency filter further includes an acoustic wave resonator disposed in series on the path connecting the input terminal and the output terminal.

12. The radio frequency module according to claim 1, further comprising:
a multiplexer including a plurality of filters having a first filter being the radio frequency filter.

13. The radio frequency module according to claim 12, wherein the plurality of filters further includes a second filter being the radio frequency filter, and
the multiplexer includes a common terminal in which the input terminal or the output terminal included in the first filter and the input terminal or the output terminal included in the second filter are commonly connected.

14. The radio frequency module according to claim 13, wherein the acoustic wave resonator included in the first filter and the acoustic wave resonator included in the second filter are packaged in one package.

15. The radio frequency module according to claim 14, wherein the first impedance element included in the first filter and a node side terminal of the acoustic wave resonator included in the first filter are disposed in a first region,
the first impedance element included in the second filter and a node side terminal of the acoustic wave resonator included in the second filter are disposed in a second region, and
the first region and the second region are divided regions in plan view with a perpendicular bisector of a line segment as a boundary, the line segment connecting the node side terminal of the acoustic wave resonator included in the first filter and the node side terminal of the acoustic wave resonator included in the second filter.

16. The radio frequency module according to claim 13, wherein the plurality of filters includes, as the first filter and the second filter, at least two filters out of:
a filter having a pass band including 699 MHz to 960 MHz,
a filter having a pass band including 1.2 GHz,
a filter having a pass band including 1.4 GHz to 5 GHz, and
a filter having a pass band including 5 GHz to 7.125 GHz.

17. The radio frequency module according to claim 13, wherein the plurality of filters includes, as the first filter and the second filter, at least two filters out of:
a filter having a pass band including 699 MHz to 2.7 GHz,
a filter having a pass band including 3.3 GHz to 5 GHz, and
a filter having a pass band including 5 GHz to 7.125 GHz.

18. The radio frequency module according to claim 13, wherein the plurality of filters includes, as the first filter and the second filter, at least two filters out of:
a filter having a pass band including 699 MHz to 2.7 GHz,
a filter having a pass band including 3.3 GHz to 4.2 GHz,
a filter having a pass band including 4.4 GHz to 5 GHz, and
a filter having a pass band including 5 GHz to 7.125 GHz.

19. The radio frequency module according to claim 12, further comprising:
a front end circuit including the multiplexer,
wherein the front end circuit includes:
a switch directly or indirectly connected to the multiplexer, and
an amplification circuit directly or indirectly connected to the multiplexer.

20. The radio frequency module according to claim 13, further comprising:
a front end circuit including the multiplexer,
wherein the front end circuit includes:
a switch directly or indirectly connected to the multiplexer, and
an amplification circuit directly or indirectly connected to the multiplexer.

* * * * *